US012795919B2

(12) United States Patent
Wells et al.

(10) Patent No.: US 12,795,919 B2
(45) Date of Patent: Nov. 10, 2026

(54) MICROELECTRONIC DEVICES WITH A TIERED STACK OF CONDUCTIVE, INSULATIVE, AND PARTIALLY-SACRIFICIAL STRUCTURES, AND RELATED SYSTEMS AND METHODS

(71) Applicant: Micron Technology, Inc., Boise, ID (US)

(72) Inventors: David H. Wells, Boise, ID (US); Justin D. Shepherdson, Meridian, ID (US); Swapnil A. Lengade, Boise, ID (US); Collin Howder, Boise, ID (US); Dheeraj Kumar, Boise, ID (US); Andrew L. Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 908 days.

(21) Appl. No.: 17/822,101

(22) Filed: Aug. 24, 2022

(65) Prior Publication Data

US 2024/0074177 A1 Feb. 29, 2024

(51) Int. Cl.
*H10B 43/27* (2023.01)
*H10B 41/10* (2023.01)
(Continued)

(52) U.S. Cl.
CPC ............. *H10B 43/27* (2023.02); *H10B 41/27* (2023.02)

(58) Field of Classification Search
CPC ........ H10B 43/27; H10B 43/10; H10B 41/27; H10B 43/50; H10B 43/35; H10B 43/40;
(Continued)

(56) References Cited

U.S. PATENT DOCUMENTS

| | | | |
|---|---|---|---|
| 9,589,839 | B1 | 3/2017 | Ikawa et al. |
| 10,141,221 | B1 | 11/2018 | Lai et al. |

(Continued)

OTHER PUBLICATIONS

Jain et al., Microelectronic Devices With Staircased Stadiums and Both Through-Step and To-Step Contacts, and Related Systems and Methods, U.S. Appl. No. 17/709,020, Substitute Specification (filed May 31, 2022), 50 pages.
Jain et al., Microelectronic Devices With Staircased Stadiums and Both Through-Step and To-Step Contacts, and Related Systems and Methods, U.S. Appl. No. 17/709,020, Claims, Abstract, and Drawings (filed Mar. 30, 2022), 64 pages.

*Primary Examiner* — Jessica S Manno
*Assistant Examiner* — Victor Joseph Lasasso
(74) *Attorney, Agent, or Firm* — TraskBritt

(57) ABSTRACT

Microelectronic devices include a region with a tiered stack that includes insulative, conductive, and non-conductive structures arranged in tiers. The insulative structures vertically alternate with both the conductive and the non-conductive structures. Each of the conductive structures is vertically spaced from another of the conductive structures by at least one of the non-conductive structures and at least two of the insulative structures. A composition of the non-conductive structures differs from a composition of the insulative structures. In methods of fabrication, a precursor stack is formed to include the insulative structures vertically alternating with first and second non-conductive structures. In a region of the precursor stack, the first non-conductive structures are removed, forming voids between multi-structure tier groups. Conductive structures are formed in the voids. Electronic systems are also disclosed.

24 Claims, 49 Drawing Sheets

(51) Int. Cl.

| | |
|---|---|
| ***H10B 41/27*** | (2023.01) |
| ***H10B 41/35*** | (2023.01) |
| ***H10B 43/35*** | (2023.01) |
| ***H10B 43/50*** | (2023.01) |

(58) Field of Classification Search

CPC ........ H10B 41/35; H10B 41/10; H10B 41/50; H10B 51/20; G11C 11/5628; G11C 11/5642; G11C 16/0483; G11C 16/08; G11C 16/10; G11C 16/16; G11C 16/26; H01L 23/5226; H01L 21/76877; H01L 21/76895; H01L 23/5283

See application file for complete search history.

(56) References Cited

U.S. PATENT DOCUMENTS

| | | | | |
|---|---|---|---|---|
| 10,971,240 | B1 * | 4/2021 | Dunga | G11C 16/344 |
| 11,114,456 | B2 | 9/2021 | Xiao | |
| 2019/0006275 | A1 * | 1/2019 | Kobayashi | H01L 21/76877 |
| 2020/0091081 | A1 | 3/2020 | Hatazaki et al. | |
| 2020/0312869 | A1 | 10/2020 | Xiao | |
| 2021/0040607 | A1 | 2/2021 | Han et al. | |
| 2021/0398987 | A1 | 12/2021 | Hopkins et al. | |
| 2022/0051980 | A1 * | 2/2022 | Hopkins | H01L 21/76877 |

* cited by examiner

MICROELECTRONIC DEVICES WITH A TIERED STACK OF CONDUCTIVE, INSULATIVE, AND PARTIALLY-SACRIFICIAL STRUCTURES, AND RELATED SYSTEMS AND METHODS

TECHNICAL FIELD

Embodiments of the disclosure relate to the field of microelectronic device design and fabrication. More particularly, the disclosure relates to microelectronic devices (e.g., memory devices, such as 3D NAND memory devices) with a tiered stack of multiple vertically alternating structures that include conductive, insulative, and other (e.g., partially-sacrificial) materials. The disclosure also relates to methods for forming such devices and to systems incorporating such devices.

BACKGROUND

Memory devices provide data storage for electronic systems. A Flash memory device is one of various memory device types and has numerous uses in modern computers and other electrical devices. A conventional Flash memory device may include a memory array that has a large number of charge storage devices (e.g., memory cells, such as non-volatile memory cells) arranged in rows and columns. In a NAND architecture type of Flash memory, memory cells arranged in a column are coupled in series, and a first memory cell of the column is coupled to a data line (e.g., a bit line). In a "three-dimensional NAND" memory device (which may also be referred to herein as a "3D NAND" memory device), a type of vertical memory device, not only are the memory cells arranged in row and column fashion in a horizontal array, but tiers of the horizontal arrays are stacked over one another (e.g., as vertical strings of memory cells) to provide a "three-dimensional array" of the memory cells. Conventionally, the stack includes conductive structures vertically interleaved with insulative structures. The conductive structures function as control gates for, e.g., access lines (e.g., word lines) of the memory cells. Vertical structures (e.g., pillars comprising channel structures and tunneling structures) extend along the vertical string of memory cells. Drain/source ends of the string are adjacent the ends (e.g., top and bottom) of the vertical structure (e.g., pillar). The drain end is operably connected to a bit line, while the source end is operably connected to a source structure (e.g., a source plate, a source line). A 3D NAND memory device also includes electrical connections between, e.g., access lines (e.g., word lines) and other conductive structures of the device so that the memory cells of the vertical strings can be selected for writing, reading, and erasing operations.

Some 3D NAND memory devices include so-called "staircase" structures having "steps" (or otherwise known as "stairs") at edges (e.g., ends) of the tiers of the stack. The steps have treads (e.g., upper surfaces) defining contact regions of conductive structures of the device, such as of access lines (e.g., word lines), which may be formed by the conductive materials of the tiered stack. Contact structures may be formed in physical contact with the steps to provide electrical access to the conductive structures (e.g., word lines) associated with the steps. The contact structures may be in electrical communication, via conductive routing lines, to additional contact structures that communicate to a source/drain region. String drivers drive the access line (e.g., word line) voltages to write to or read from the memory cells controlled via the access lines (e.g., word lines).

In conventional 3D NAND architecture, conductive structures are vertically interleaved with insulative structures, such that every other layer is a conductive structure. To form the stack, an initial stack is formed with the insulative structures vertically alternating with sacrificial structures. In a so-called "replacement gate" (or "gate last") process, the sacrificial structures are removed and replaced with conductive material(s) to form the conductive structures of the final stack. Removing the sacrificial structures forms voids between the insulative structures, and the insulative structures may deform (e.g., bend, sag, bow, collapse) into neighboring voids. This deformation risk may be most pronounced in insulative structures with long, unsupported sections (e.g., spanning and/or cantilever portions). Deformed insulative structures may close off voids, inhibiting accurate formation of the conductive structures in the voids. Accordingly, designing and fabricating 3D NAND devices continues to present challenges.

BRIEF DESCRIPTION OF THE DRAWINGS

FIGS. 1 through 12D are schematic, cross-sectional, perspective views of various stages of processing to fabricate a microelectronic device and the structures thereof, according to embodiments of the disclosure, wherein figures sharing a same numeral identifier may illustrate a same processing stage, figures identified with the letter "A" illustrate a pillar array region of the microelectronic device, figures identified with the letter "B" illustrate a staircase region of the microelectronic device, and figures identified with the letter "C" or "D" illustrate other regions of the microelectronic device.

FIGS. 12A through 12D are schematic, cross-sectional, perspective views of a microelectronic device and the structures thereof, which may be formed according to the stages illustrated in FIGS. 1 through 12D, according to embodiments of the disclosure, wherein a pillar array region (illustrated in FIG. 12A) and a staircase region (illustrated in FIG. 12B) each include a vertically alternating stack of conductive and insulative structures, and wherein at least one other region (illustrated in FIG. 12C and/or FIG. 12D) includes a stack of insulative structures vertically alternating with both conductive and other (e.g., partially-sacrificial) structures.

FIGS. 13 through 26C are schematic, cross-sectional, perspective views of various stages of processing to fabricate a microelectronic device and the structures thereof, according to embodiments of the disclosure, wherein figures sharing a same numeral identifier may illustrate a same processing stage, the view of "A" figures corresponds to section planes 1426 of FIG. 14, the view of "B" figures corresponds to section planes 1424 of FIG. 14, and the view of "C" corresponds to a top, plan view.

FIGS. 26A through 26C are schematic, cross-sectional, perspective views of a microelectronic device and the structures thereof, which may be formed according to the stages illustrated in FIGS. 13 through 26C, according to embodiments of the disclosure, wherein staircased stadiums of a block are defined in multi-tiered stacks of insulative structures vertically interleaved with both conductive and other (e.g., partially-sacrificial) structures, and wherein the conductive structures of some of the staircased stadiums are at different elevational levels than the conductive structures of others of the staircased stadiums.

FIGS. 27 through 36B are schematic, cross-sectional, perspective views of various stages of processing to fabricate a microelectronic device and the structures thereof, according to embodiments of the disclosure, wherein figures sharing a same numeral identifier may illustrate a same processing stage, the view of "A" figures corresponds to section planes 2714 of FIG. 27, and the view of "B" figures corresponds to a top, plan view.

FIGS. 36A and 36B are schematic, cross-sectional, perspective views of a microelectronic device and the structures thereof, which may be formed according to the stages illustrated in FIGS. 27 through 36B, according to embodiments of the disclosure, wherein staircased stadiums of a block are defined in multi-tiered stacks of insulative structures vertically interleaved with both conductive and other (e.g., partially-sacrificial) structures, and wherein the conductive structures of a first length-wise half of the block are at different elevational levels than the conductive structures of a second length-wise half of the block.

DETAILED DESCRIPTION

Figure 1:
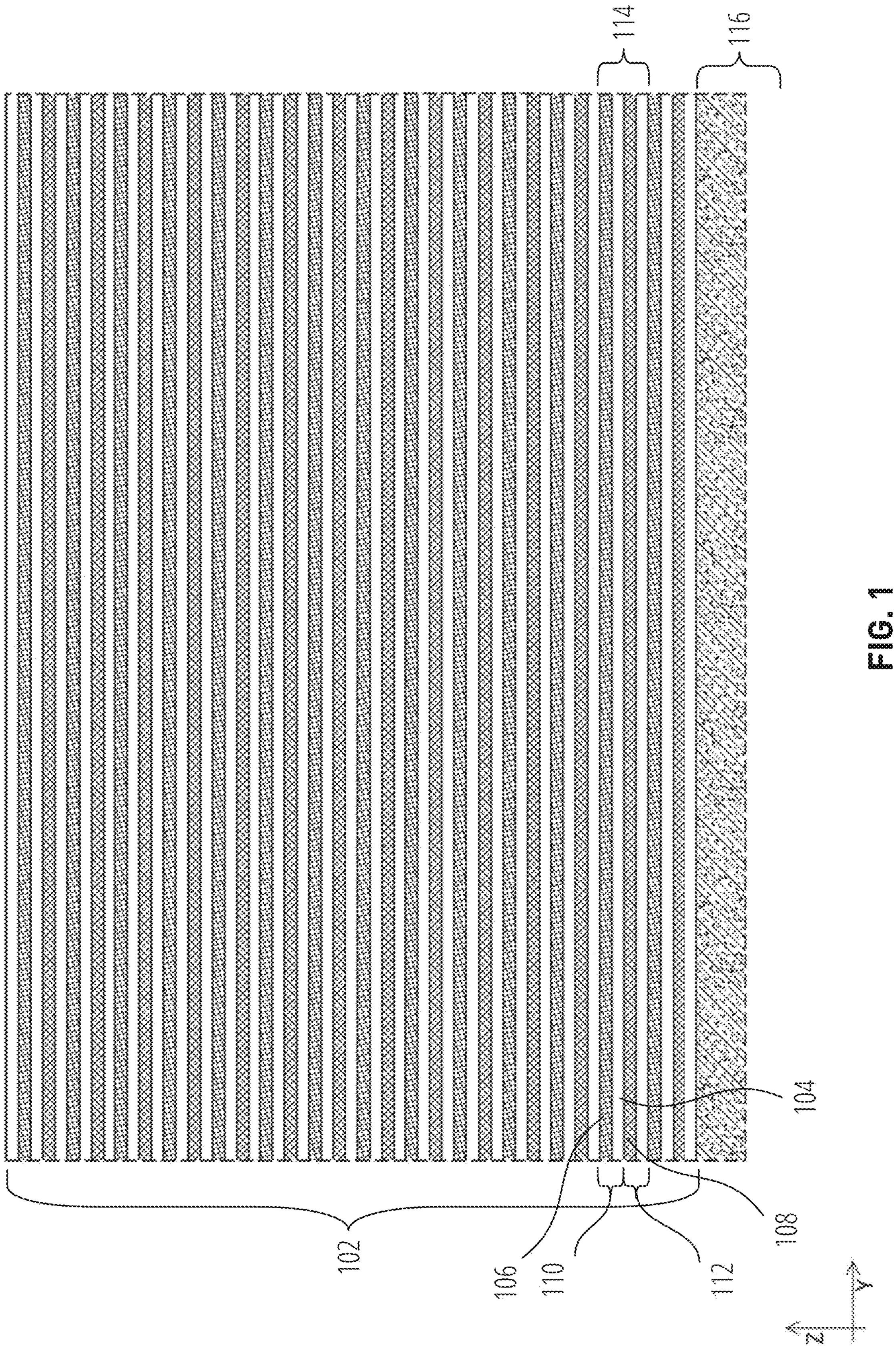

Structures (e.g., microelectronic device structures), apparatuses (e.g., microelectronic devices), and systems (e.g., electronic systems), according to embodiments of the disclosure, include one or more regions with a multi-tiered stack having insulative structures vertically alternating with both conductive and other (e.g., partially-sacrificial) structures. Other region(s) may include a tiered stack with insulative structures vertically interleaved with only conductive structures. The stacks may be formed from a precursor stack that includes the insulative structures vertically interleaved with first and second partially-sacrificial structures. A first exhumation stage removes some or all of the first partially-sacrificial structures—forming voids—without removing the second partially-sacrificial structures. Conductive structures are formed in the voids. Then, a second exhumation stage removes some or all of the second partially-sacrificial structures to form additional voids. Additional conductive structures are formed in the additional voids. During any single exhumation or conductive structure formation stage, multiple material structures remain above each void, lessening the risk that, e.g., an insulative structure will deform into the neighboring void. Therefore, spanning portions and cantilever portions of the above-void structures may be relatively longer with less risk of deformation; the structures of the stack may be relatively thinner with less risk of deformation; and/or conductive structures may be formed in the voids with relatively improved reliability. In regions with both conductive structures and remnant portions of partially-sacrificial structures, stacks include the conductive structures at every, e.g., fourth level, which may relatively expand processing margins and improve the reliability of formation of other device features, such as conductive contact structures of staircased stadium areas of the device.

As used herein, the term "sacrificial," when used in reference to a material or structure, means and includes a material or structure that is formed during a fabrication process but which is substantially removed (e.g., wholly removed) prior to completion of the fabrication process.

As used herein, the terms "partially-sacrificial" and "parsac" (as abbreviated for the sake of brevity), when used in reference to a material or structure, means and includes a material or structure that is formed during a fabrication process but which is partially, but not wholly, removed prior to completion of the fabrication process. A partially-sacrificial structure may remain in a final device (e.g., a final structure of a device) in a manner that it maintains at least one original dimension (e.g., an original vertical thickness) in the regions in which the partially-sacrificial structure remains. A "partially-sacrificial" material or structure may be wholly or substantially removed from some areas of the device and still constitute a "partially-sacrificial" material or structure if at least one area of the device continues to include the "partially-sacrificial" material or structure.

As used herein, the terms "stadium" and "staircased stadium" mean and refer to a structure defined in a material stack so as to provide at least one staircase with steps having treads provided by an upper surface of at least some of the material elevations of the stack.

As used herein, the terms "stadium opening" and "stadium trench" mean and refer to a space above a staircased stadium, such that the profile of the staircases of the staircased stadium is at the base of the stadium opening or stadium trench.

As used herein, the term "series of stadiums" means and refers to a group of stadiums (or staircased stadiums) distributed across a stack structure in a row (e.g., in the illustrated X-axis direction), with neighboring stadiums spaced from one another by a "crest" portion of the stack, which may be a non-patterned or full-height portion of the stack.

As used herein, the term "descending staircase" means and refers to a staircase generally exhibiting negative slope, as defined by a phantom line extending from a vertically highest step of the staircase to a vertically lowest step of the staircase.

As used herein, the term "ascending staircase" means and refers to a staircase generally exhibiting positive slope, as defined by a phantom line extending from a vertically highest step of the staircase to a vertically lowest step of the staircase.

As used herein, the term "high-aspect-ratio" means and refers to a height-to-width (e.g., a ratio of a maximum height to a maximum width) of greater than about 10:1 (e.g., greater than about 20:1, greater than 30:1, greater than about 40:1, greater than about 50:1, greater than about 60:1, greater than about 70:1, greater than about 80:1, greater than about 90:1, greater than about 100:1).

As used herein, a feature referred to with the adjective "source/drain" means and refers to the feature being configured for association with either or both the source region and the drain region of the device that includes the "source/drain" feature. A "source region" may be otherwise configured as a "drain region" and vice versa without departing from the scope of the disclosure.

As used herein, the terms "opening," "trench," and "slit" mean and include a volume extending through or into at least one structure or at least one material, leaving a gap in that at least one structure or at least one material, or a volume extending between structures or materials, leaving a gap between the structures or materials. Unless otherwise described, an "opening," "trench," and/or "slit" is not necessarily empty of material. That is, an "opening," "trench," or "slit" is not necessarily void space. An "opening," "trench," or "slit" formed in or between structures or materials may comprise structure(s) or material(s) other than that in or between which the opening is formed. And, structure(s) or material(s) "exposed" within an opening, trench, or slit is/are not necessarily in contact with an atmosphere or non-solid environment. Structure(s) or material(s) "exposed" within an opening, trench, or slit may be adjacent or in contact with other structure(s) or material(s) that is/are disposed within the opening, trench, or slit.

As used herein, the terms “substrate” and “base structure” mean and include a base material or other construction upon which components, such as tiered stacks and structures therein, are formed. The substrate or base structure may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term “bulk substrate” means and includes not only silicon wafers, but also silicon-on-insulator (“SOT”) substrates, such as silicon-on-sapphire (“SOS”) substrates or silicon-on-glass (“SOG”) substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a “substrate” or “base structure” in the following description, previous process stages may have been utilized to form materials, structures, or junctions in the base semiconductor structure, base structure, or other foundation.

As used herein, the terms “insulative” and “insulating,” when used in reference to a material or structure, mean and include a material or structure that is electrically insulative or electrically insulating. An “insulative” or “insulating” material or structure may be formed of and include one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric carboxynitride material (e.g., a silicon carboxynitride ($SiO_xC_zN_y$)), and/or air. Formulae including one or more of “x,” “y,” and/or “z” herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of “x” atoms of one element, “y” atoms of another element, and/or “z” atoms of an additional element (if any), respectively, for every one atom of another element (e.g., Si, Al, Hf, Nb, Ti). As the formulae are representative of relative atomic ratios and not strict chemical structure, an insulative material or insulative structure may comprise one or more stoichiometric compounds and/or one or more non-stoichiometric compounds, and values of “x,” “y,” and “z” (if any) may be integers or may be non-integers. As used herein, the term “non-stoichiometric compound” means and includes a chemical compound with an elemental composition that cannot be represented by a ratio of well-defined natural numbers and is in violation of the law of definite proportions. In addition, an “insulative” or “insulating” structure means and includes a structure formed of and including “insulative” or “insulating” material.

As used herein, the term “horizontal” means and includes a direction parallel to a primary surface of the substrate on which the referenced material or structure is located. The “width” and “length” of a respective material or structure may be defined as dimensions in a horizontal plane. With reference to the figures, the “horizontal” direction may be perpendicular to an indicated “Z” axis, may be parallel to an indicated “X” axis, and may be parallel to an indicated “Y” axis.

As used herein, the term “lateral” means and includes a direction in a horizontal plane parallel to a primary surface of the substrate on which a referenced material or structure is located and substantially perpendicular to a “longitudinal” direction. The “width” of a respective material or structure may be defined as a dimension in the lateral direction of the horizontal plane. With reference to the figures, the “lateral” direction may be parallel to an indicated “X” axis, may be perpendicular to an indicated “Y” axis, and may be perpendicular to an indicated “Z” axis.

As used herein, the term “longitudinal” means and includes a direction in a horizontal plane parallel to a primary surface of the substrate on which a referenced material or structure is located, and substantially perpendicular to a “lateral” direction. The “length” of a respective material or structure may be defined as a dimension in the longitudinal direction of the horizontal plane. With reference to the figures, the “longitudinal” direction may be parallel to an indicated “Y” axis, may be perpendicular to an indicated “X” axis, and may be perpendicular to an indicated “Z” axis.

As used herein, the term “vertical” means and includes a direction perpendicular to a primary surface of the substrate on which a referenced material or structure is located. The “height” of a respective material or structure may be defined as a dimension in a vertical plane. With reference to the figures, the “vertical” direction may be parallel to an indicated “Z” axis, may be perpendicular to an indicated “X” axis, and may be perpendicular to an indicated “Y” axis.

As used herein, the term “width” means and includes a dimension, along an indicated “X” axis in a horizontal plane (e.g., at a certain elevation, if identified), defining a maximum distance, along such “X” axis in the horizontal plane, of the whole of the material or structure in question or of a concerned portion of the material or structure in question. For example, a width of a conductive structure may be a maximum X-axis dimension from one lateral end of the conductive structure to an opposite lateral end of the structure, whereas a width of a step defined by the conductive structure may be a maximum X-axis dimension of only that portion of the conductive structure that provides the step.

As used herein, the term “length” means and includes a dimension, along an indicated “Y” axis in a horizontal plane (e.g., at a certain elevation, if identified), defining a maximum distance, along such “Y” axis in the horizontal plane, of the material or structure in question or of a concerned portion of the material or structure in question. For example, a length of a conductive structure may be a maximum Y-axis dimension from one block-defining slit to another block-defining slit, whereas a length of a step defined by the conductive structure may be a maximum Y-axis dimension of only that portion of the conductive structure that provides the step.

As used herein, the terms “thickness” or “thinness” are spatially relative terms that mean and include a dimension in a straight-line direction that is normal to the closest surface of an immediately adjacent material or structure that is of a different composition or that is otherwise distinguishable from the material or structure whose thickness, thinness, or height is discussed.

As used herein, the term “between” is a spatially relative term used to describe the relative disposition of one material or structure relative to at least two other materials or structures. The term “between” may encompass both a disposition of one material or structure directly adjacent the other materials or structures and a disposition of one material or structure indirectly adjacent to the other materials or structures.

As used herein, the term "proximate" is a spatially relative term used to describe disposition of one material or structure near to another material or structure. The term "proximate" includes dispositions of indirectly adjacent to, directly adjacent to, and internal to.

As used herein, features (e.g., regions, materials, openings, structures, assemblies, devices) described as "neighboring" one another mean and include features of the disclosed identity (or identities) that are located most proximate (e.g., closest to) one another. One or more additional features (e.g., additional regions, additional materials, additional structures, additional openings, additional assemblies, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with the "neighboring" features is positioned between the "neighboring" features. For example, a structure of material X "neighboring" a structure of material Y is the first material X structure, e.g., of multiple material X structures, that is nearest the particular structure of material Y. Accordingly, features described as "vertically neighboring" one another mean and include features of the disclosed identity (or identities) that are located most vertically proximate (e.g., vertically closest to) one another. Moreover, features described as "horizontally neighboring" one another mean and include features of the disclosed identity (or identities) that are located most horizontally proximate (e.g., horizontally closest to) one another.

As used herein, the term "consistent"—when referring to a parameter, property, or condition of one structure, material, feature, or portion thereof in comparison to the parameter, property, or condition of another such structure, material, feature, or portion of such same aforementioned structure, material, or feature—is a relative term that means and includes the parameter, property, or condition of the two such structures, materials, features, or portions being equal, substantially equal, or about equal, at least in terms of respective dispositions of such structures, materials, features, or portions. For example, two structures having "consistent" heights as one another may each define a same, substantially same, or about the same height, from a lower surface to an upper surface of each respective such structure, despite the two structures being at different elevations of a larger structure.

As used herein, the terms "about" and "approximately," when either is used in reference to a numerical value for a particular parameter, are inclusive of the numerical value and a degree of variance from the numerical value that one of ordinary skill in the art would understand is within acceptable tolerances for the particular parameter. For example, "about" or "approximately," in reference to a numerical value, may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "substantially," when referring to a parameter, property, or condition, means and includes the parameter, property, or condition being equal to or within a degree of variance from a given value such that one of ordinary skill in the art would understand such given value to be acceptably met, such as within acceptable manufacturing tolerances. By way of example, depending on the particular parameter, property, or condition that is substantially met, the parameter, property, or condition may be "substantially" a given value when the value is at least 90.0 percent met, at least 95.0 percent met, at least 99.0 percent met, or even at least 99.9 percent met.

As used herein, the terms "on" or "over," when referring to an element as being "on" or "over" another element, are spatially relative terms that mean and include the element being directly on top of, adjacent to (e.g., laterally adjacent to, horizontally adjacent to, longitudinally adjacent to, vertically adjacent to), underneath, or in direct contact with the other element. The terma also include the element being indirectly on top of, adjacent to (e.g., laterally adjacent to, horizontally adjacent to, longitudinally adjacent to, vertically adjacent to), underneath, or near the other element, with other elements present therebetween. In contrast, when an element is referred to as being "directly on" or "directly adjacent to" another element, there are no intervening elements present.

As used herein, other spatially relative terms, such as "below," "lower," "bottom," "above," "upper," "top," and the like, may be used for ease of description to describe one element's or feature's relationship to another element(s) or feature(s) as illustrated in the figures. Unless otherwise specified, any spatially relative terms used in this disclosure are intended to encompass different orientations of the materials in addition to the orientation as depicted in the figures. For example, if materials in the figures are inverted, elements described as "below" or "under" or "on bottom of" other elements or features would then be oriented "above" or "on top of" the other elements or features. Thus, the term "below" may encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, the terms "level" and "elevation" are spatially relative terms used to describe one material's or feature's relationship to another material(s) or feature(s) as illustrated in the figures, using—as a reference point—the lowest illustrated surface of the structure that includes the materials or features. As used herein, a "level" and an "elevation" are each defined by a horizontal plane parallel to a primary surface of the substrate or base structure on or in which the structure (that includes the materials or features) is formed. When used with reference to the drawings, "lower levels" and "lower elevations" are relatively nearer to the bottom-most illustrated surface of the respective structure, while "higher levels" and "higher elevations" are relatively further from the bottom-most illustrated surface of the respective structure.

As used herein, the term "depth" is a spatially relative term used to describe one material's or feature's relationship to another material(s) or feature(s) as illustrated in the figures, using—as a reference point—the highest illustrated surface of the structure (e.g., stack structure) that includes the materials or features. When used with reference to the drawings, a "depth" is defined by a horizontal plane parallel to the highest illustrated surface of the structure (e.g., stack structure) that includes the materials or features.

Unless otherwise specified, any spatially relative terms used in this disclosure are intended to encompass different orientations in addition to the orientation depicted in the drawings. For example, the materials in the drawings may be inverted, rotated, etc., with "upper" levels and elevations then illustrated proximate the bottom of the page, "lower" levels and elevations then illustrated proximate the top of the page, and with greatest "depths" extending a greatest vertical distance upward.

As used herein, the terms "comprising," "including," "having," and grammatical equivalents thereof are inclusive, open-ended terms that do not exclude additional, unrecited elements or method steps. These terms also include more restrictive terms "consisting of" and "consisting essentially of" and grammatical equivalents thereof. Therefore, a structure described as "comprising," "including," and/or "having" a material may be a structure that, in some embodiments, includes additional material(s) as well and/or a structure that, in some embodiments, does not include any other material(s). Likewise, a material (e.g., composition) described as "comprising," "including," and/or "having" a species may be a material that, in some embodiments, includes additional species as well and/or a material that, in some embodiments, does not include any other species.

As used herein, the term "may" with respect to a material, structure, feature, or method act indicates that such is contemplated for use in implementation of an embodiment of the disclosure and such term is used in preference to the more restrictive term "is" so as to avoid any implication that other, compatible materials, structures, features, and methods usable in combination therewith should or must be excluded.

As used herein, "and/or" means and includes any and all combinations of one or more of the associated listed items.

As used herein, the singular forms "a," "an," and "the" are intended to include the plural forms as well, unless the context clearly indicates otherwise.

As used herein, an "(s)" at the end of a term means and includes the singular form of the term and/or the plural form of the term, unless the context clearly indicates otherwise.

As used herein, the terms "configured" and "configuration" mean and refer to a size, shape, material composition, orientation, and arrangement of a referenced feature (e.g., region, material, structure, opening, assembly, device) so as to facilitate a referenced operation or property of the referenced feature in a predetermined way.

The illustrations presented herein are not meant to be actual views of any particular material, structure, sub-structure, region, sub-region, device, system, or stage of fabrication, but are merely idealized representations that are employed to describe embodiments of the disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or structures as illustrated but may include deviations in shapes that result, for example, from manufacturing techniques. For example, a structure illustrated or described as box-shaped may have rough and/or nonlinear features. Moreover, sharp angles that are illustrated may be rounded; surfaces and features illustrated to be vertical may be non-vertical, bent, and/or bowed; and/or structures illustrated with consistent transverse widths and/or lengths throughout the height of the structure may taper in transverse width and/or length. Thus, the materials, features, and structures illustrated in the figures are schematic in nature and their shapes are not intended to illustrate the precise shape of a material, feature, or structure and do not limit the scope of the present claims.

The following description provides specific details, such as material types and processing conditions, to provide a thorough description of embodiments of the disclosed apparatus (e.g., devices, systems) and methods. However, a person of ordinary skill in the art will understand that the embodiments of the apparatus and methods may be practiced without employing these specific details. Indeed, the embodiments of the apparatus and methods may be practiced in conjunction with conventional semiconductor fabrication techniques employed in the industry.

The fabrication processes described herein do not form a complete process flow for processing apparatus (e.g., devices, systems) or the structures thereof. The remainder of the process flow is known to those of ordinary skill in the art. Accordingly, only the methods and structures necessary to understand embodiments of the present apparatus (e.g., devices, systems) and methods are described herein.

Unless context otherwise indicates, materials described herein may be formed by any suitable technique, including, but not limited to, spin coating, blanket coating, chemical vapor deposition ("CVD"), atomic layer deposition ("ALD"), plasma enhanced ALD, physical vapor deposition ("PVD") (e.g., sputtering), or epitaxial growth. Depending on the specific material to be formed, the deposition/growth technique may be selected by a person of ordinary skill in the art.

Unless the context indicates otherwise, the removal of materials described herein may be accomplished by any suitable technique including, but not limited to, etching (e.g., dry etching, wet etching, vapor etching), ion milling, abrasive planarization, or other known methods.

In referring to the drawings, like numerals refer to like components throughout. The drawings are not necessarily drawn to scale.

Referring to FIG. 1, illustrated is a precursor stack 102 that may be used to form microelectronic devices, and structures thereof, according to embodiments of the disclosure. The precursor stack 102 includes insulative structures 104 vertically interleaved with multiple partially-sacrificial structures (e.g., first par-sac structures 106 and second par-sac structures 108). The insulative structures 104, the first par-sac structures 106, and the second par-sac structures 108 are arranged in tiers. First tiers 110 include a single one of the insulative structures 104 and a single one of the first par-sac structures 106. Second tiers 112 include another single one of the insulative structures 104 and a single one of the second par-sac structures 108. In the precursor stack 102, the first tiers 110 vertically alternate with the second tiers 112. A tier group 114 provides the repeating unit of the precursor stack 102. The tier group 114 includes one of the first par-sac structures 106, one of the second par-sac structures 108, and two of the insulative structures 104 with one of the insulative structures 104 being between the first par-sac structure 106 and the second par-sac structure 108.

The precursor stack 102 may be formed by sequentially forming (e.g., depositing) the structures of the precursor stack 102 from lowest elevation to highest elevation. The compositions (e.g., formulations) of the insulative structures 104, the first par-sac structures 106, and the second par-sac structures 108 may be tailored so that the first par-sac structures 106 and the second par-sac structures 108 are selectively removable (e.g., etchable) relative to the insulative structures 104. In some embodiments, the compositions (e.g., formulations) of the first par-sac structures 106 and the second par-sac structures 108 are also tailored so that they are selectively etchable relative to one another as well as relative to the insulative structures 104.

The insulative structures 104 may be formed of and include (e.g., each be formed of and include) at least one insulative material, such as a dielectric oxide material (e.g., silicon dioxide). In this and other embodiments described herein, the insulative material of the insulative structures 104 may be substantially the same as or different than other insulative material(s) of the microelectronic device structure to be formed. Some or all of the insulative structures 104 may have the same (e.g., consistent) or different thicknesses (e.g., heights) as one another. In some embodiments, some of the insulative structures 104 (e.g., an uppermost, a lowest, and/or intermediate insulative structure 104) are relatively thicker than others of the insulative structures 104.

The first par-sac structures 106 and the second par-sac structures 108 may be formed of material that is selectively removable (e.g., etchable) relative to the insulative structures 104. Accordingly, the material(s) of the par-sac structures (e.g., the first and the second par-sac structures 106, 108) has a different composition than the composition of the insulative material(s) of the insulative structures 104. In some embodiments, the par-sac structures (e.g., the first and the second par-sac structures 106, 108) comprise, consist essentially of, or consist of non-conductive material(s), which may be substantially free of metal (e.g., in greater than trace amounts) and/or substantially free of conductively-doped semiconductor materials (e.g., conductively-doped silicon). In such embodiments, the par-sac structures (e.g., the first and the second par-sac structures 106, 108) may be substantially insulative. In other embodiments, the par-sac structures (e.g., the first and the second par-sac structures 106, 108) comprise, consist substantially of, or consist of conductive and/or semiconductive material(s).

Whether non-conductive (e.g., insulative), conductive, or semi-conductive, the composition of the material(s) of the par-sac structures (e.g., the first and the second par-sac structures 106, 108) may differ not only from that of the insulative structures 104, but also from that of the conductive and/or semiconductive material(s) of functional structures (e.g., access lines, word lines, "replacement" gates, "floating" gates) that are to occupy the stack 102 in the microelectronic device to be formed. Accordingly, the material(s) of the par-sac structures may be referred to herein as "other" material(s).

In some embodiments, the insulative structures 104 are formed of and include an oxide material (e.g., silicon oxide), the first par-sac structures 106 are formed of and include a nitride material (e.g., silicon nitride, e.g., a nitride-rich silicon nitride), and the second par-sac structures 108 are formed of and include an oxide and/or nitride material of a different composition from the oxide material of the insulative structures 104 and the nitride material of the first par-sac structures 106. In some such embodiments, the second par-sac structures 108 are formed of and include silicon-rich nitride, silicon oxide doped with at least one dopant (e.g., boron, phosphorus, carbon), or any combination thereof.

As used herein, the terms "nitride-rich silicon nitride" and "N-rich SiN" mean and include a silicon nitride ($Si_xN_y$) with a ratio of nitrogen to silicon that is greater than the stoichiometric ratio. In stoichiometric silicon nitride, $Si_3N_4$, the ratio of nitrogen to silicon is about 1.33 (y/x=4/3). In N-rich SiN, the ratio of nitrogen to silicon is greater than 1.33. The first par-sac structures 106 may be formed of and include N-rich SiN with an N-to-Si ratio of greater than about 1.33 (e.g., about 1.5).

As used herein, the terms "silicon-rich silicon nitride" and "Si-rich SiN" mean and include a silicon nitride ($Si_xN_y$) with a ratio of nitrogen to silicon that is less than the 1.33 stoichiometric ratio. The second par-sac structures 108 may be formed of and include Si-rich SiN with an N-to-Si ratio of less than about 1.33 (e.g., between about 1.2 and about 1.33). Techniques for forming (e.g., depositing) silicon nitride with such a relatively greater amount of silicon are known in the art and so are not described in detail herein.

In some embodiments, the N-rich SiN of the first par-sac structures 106 and the Si-rich SiN of the second par-sac structures 108 further include hydrogen (H) at different concentration levels. For example, the N-rich SiN of the first par-sac structures 106 may include between about 15 at. % and about 25 at. % hydrogen, and the Si-rich SiN of the second par-sac structures 108 may include between about 25 at. % and about 30 at. % hydrogen (e.g., about 25 at. % H, about 28 at. % H). Techniques for forming (e.g., depositing) silicon nitride with such a relatively greater amount of hydrogen are known in the art and so are not described in detail herein. In interim or final structures, oxygen may also be included on or in the N-rich SiN and/or the Si-rich SiN (e.g., due to "native oxide" formation), as discussed further below.

In embodiments in which the second par-sac structures 108 are formed of and include a dopant (e.g., boron, phosphorus, carbon), the concentration of the dopant(s) in the second par-sac structures 108 may be up to about 10 atomic % (at. %). For example, the second par-sac structures 108 may be formed of and include up to about 10 at. % carbon (C) in carbon-doped SiCN, SiN, $SiO_2$, and/or SiON. In contrast, the first par-sac structures 106 may include less than about 10 atomic % (at. %) the dopant species.

Forming (e.g., depositing) such doped silicon oxide or silicon nitride of the second par-sac structures 108 may include forming (e.g., depositing, e.g., by CVD, PCVD) the base material of the second par-sac structures 108 (e.g., the silicon oxide or the silicon nitride) while including a dopant source in the deposition gas(es) and/or the precursor material(s) used in the material-formation (e.g., deposition) process. In such embodiments, the dopants included in the second par-sac structures 108 may be selected or otherwise formulated to enable the first par-sac structures 106 to be selectively removable (e.g., etchable) relative to the second par-sac structures 108, and/or vice versa.

The precursor stack 102 may be formed on or over a base structure 116. The base structure 116 may include one or more regions formed of and including, e.g., one or more semiconductor materials (e.g., polycrystalline silicon (polysilicon)) doped with one or more P-type conductivity chemical species (e.g., one or more of boron, aluminum, and gallium) and/or one or more N-type conductivity chemical species (e.g., one or more of arsenic, phosphorus, and antimony) to provide one or more source/drain regions of the microelectronic device to be formed.

In addition to the semiconductor materials and/or source/drain region, the base structure 116 may include other base material(s) or structure(s), such as conductive regions for making electrical connections with other conductive structures of the device to be formed. In some such embodiments, CMOS (complementary metal-oxide-semiconductor) circuitry is included, within the base structure 116, in a CMOS region below the source/drain region, which CMOS region may be characterized as a so-called "CMOS under Array" ("CuA") region.

Figure 2A:
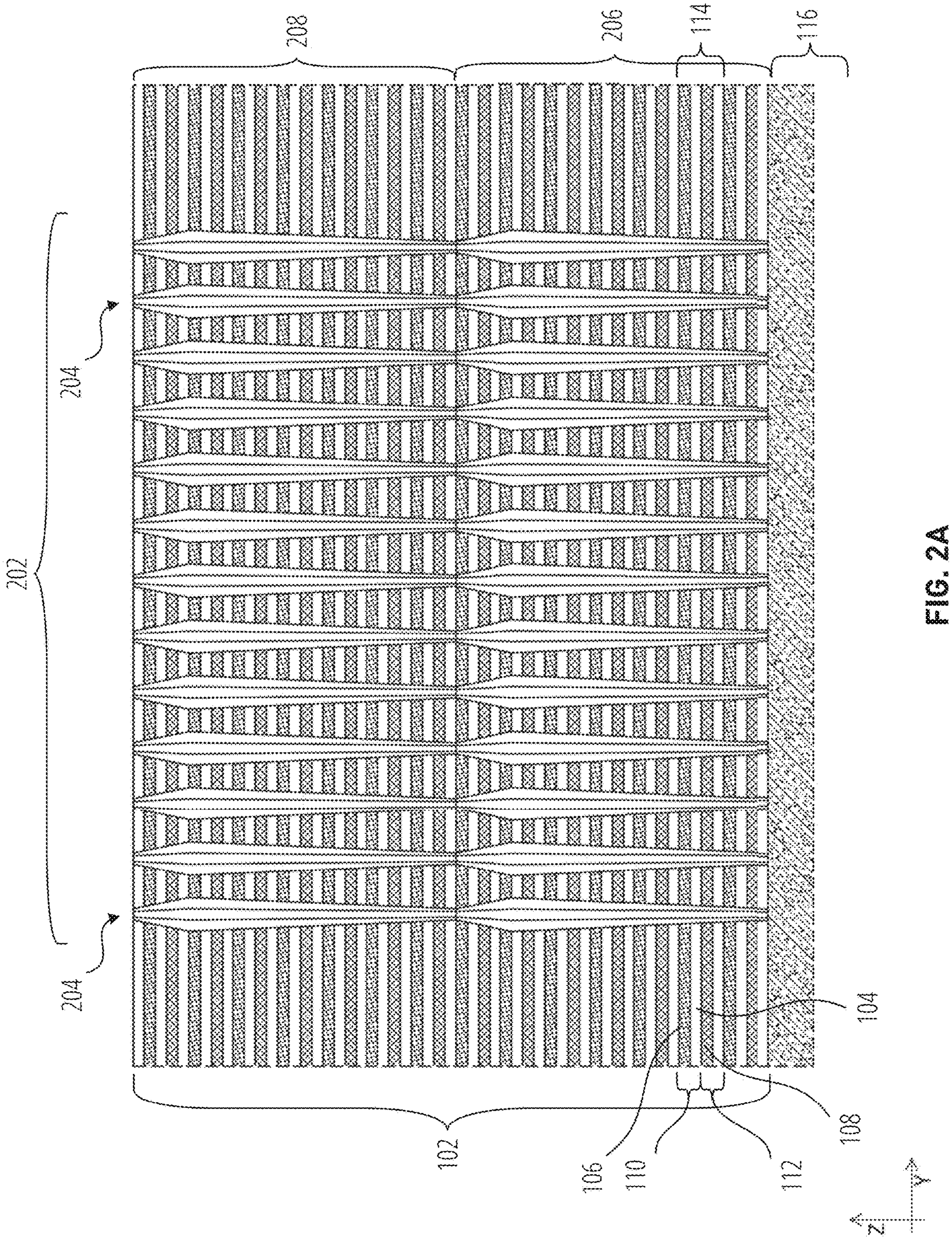

Referring to FIG. 2A, in one or more pillar array regions 202 of the device to be formed, pillars 204 are formed, in one or more arrays, through the precursor stack 102. For example, high-aspect-ratio openings may be etched through the precursor stack 102, and materials of the pillars 204 may be formed (e.g., deposited, conformally formed) in the openings. The pillars 204 may include channel structure(s) (e.g., comprising semiconductor material(s)) and tunneling structure(s) and may include other structures and materials to configure the pillars 204 to provide vertical strings of memory cells in the device.

In some embodiments, the entire precursor stack 102 is formed to its final height on the base structure 116 and then the pillars 204 are formed, in one or more portions, through the precursor stack 102. In other embodiments, the precursor stack 102 and the pillars 204 are formed in stages. For example, the tier groups 114 of a lower deck 206 of the precursor stack 102 may be formed (e.g., deposited), and then the lower portions of the pillars 204 may be formed (e.g., openings etched, materials deposited) through the lower deck 206. Then, the tier groups 114 of an upper deck 208 may be formed above the lower deck 206, and the upper portions of the pillars 204 may be formed through the upper deck 208, and so on for any additional decks of the precursor stack 102.

Figure 2B:
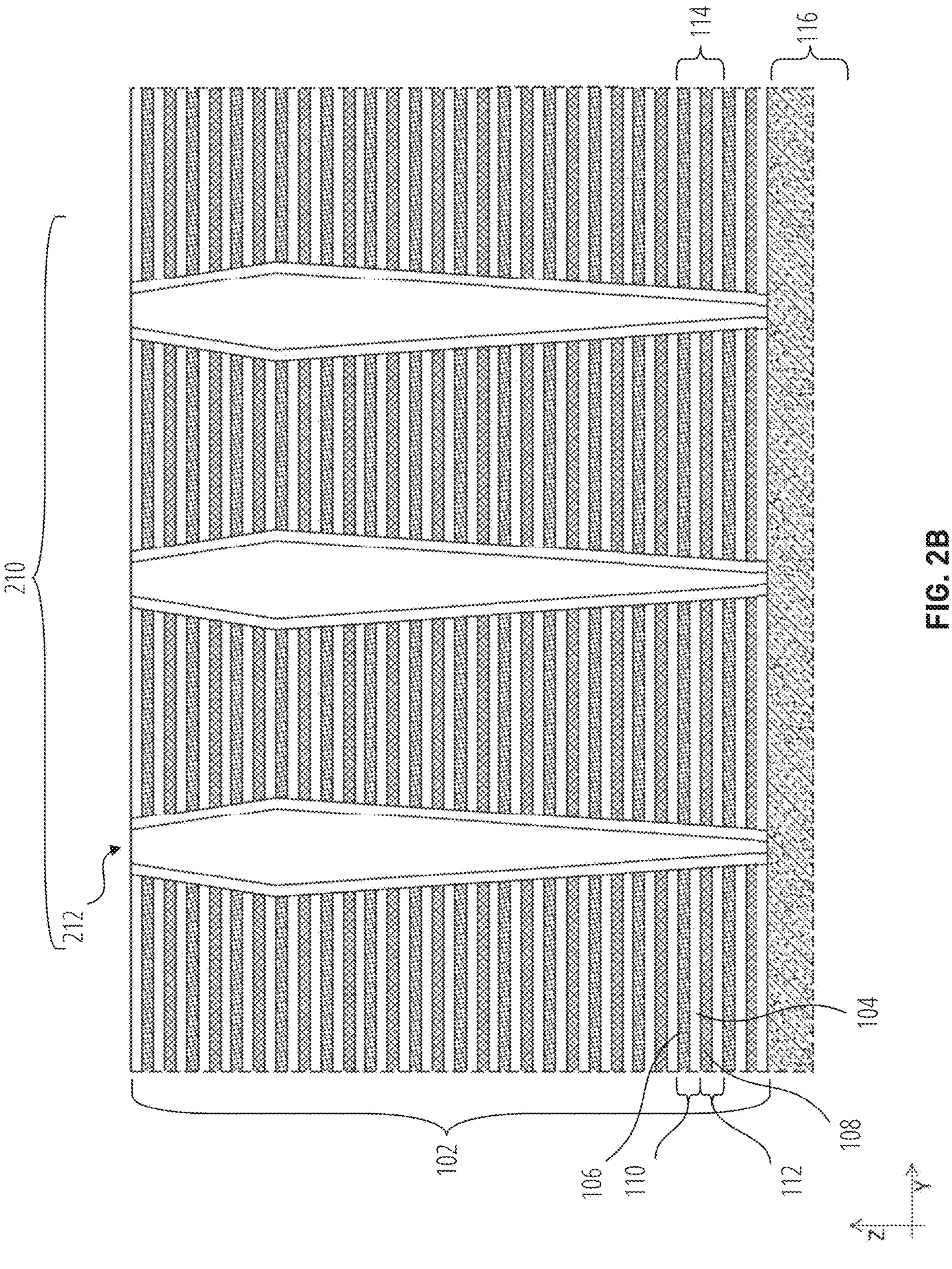

Referring to FIG. 2B, in one or more other regions of the structure (e.g., device), such as in one or more staircase regions 210 that may be horizontally adjacent and/or horizontally spaced from the pillar array regions 202, support structures 212 may be formed through the precursor stack 102, such as by forming openings through the precursor stack 102 and depositing materials therein. The support structures 212 may include liner(s) (e.g., formed of and including insulative material(s)) and one or more conductive material(s) within the liner(s). In some embodiments, the support structures 212 each comprise a dielectric liner (e.g., an oxide) horizontally surrounding a metal (e.g., tungsten) or metal nitride (e.g., tungsten nitride). The support structures 212 may be configured (e.g., dimensioned, positioned) so as to provide structural support to the materials of the stack (e.g., the precursor stack 102) and other device features during and/or after fabrication. As discussed further below, the staircase regions 210 may also be patterned (e.g., etched) to define one or more staircased stadiums. Formation of such staircased stadiums may precede or follow the stage illustrated in FIG. 2B.

Figure 3A:
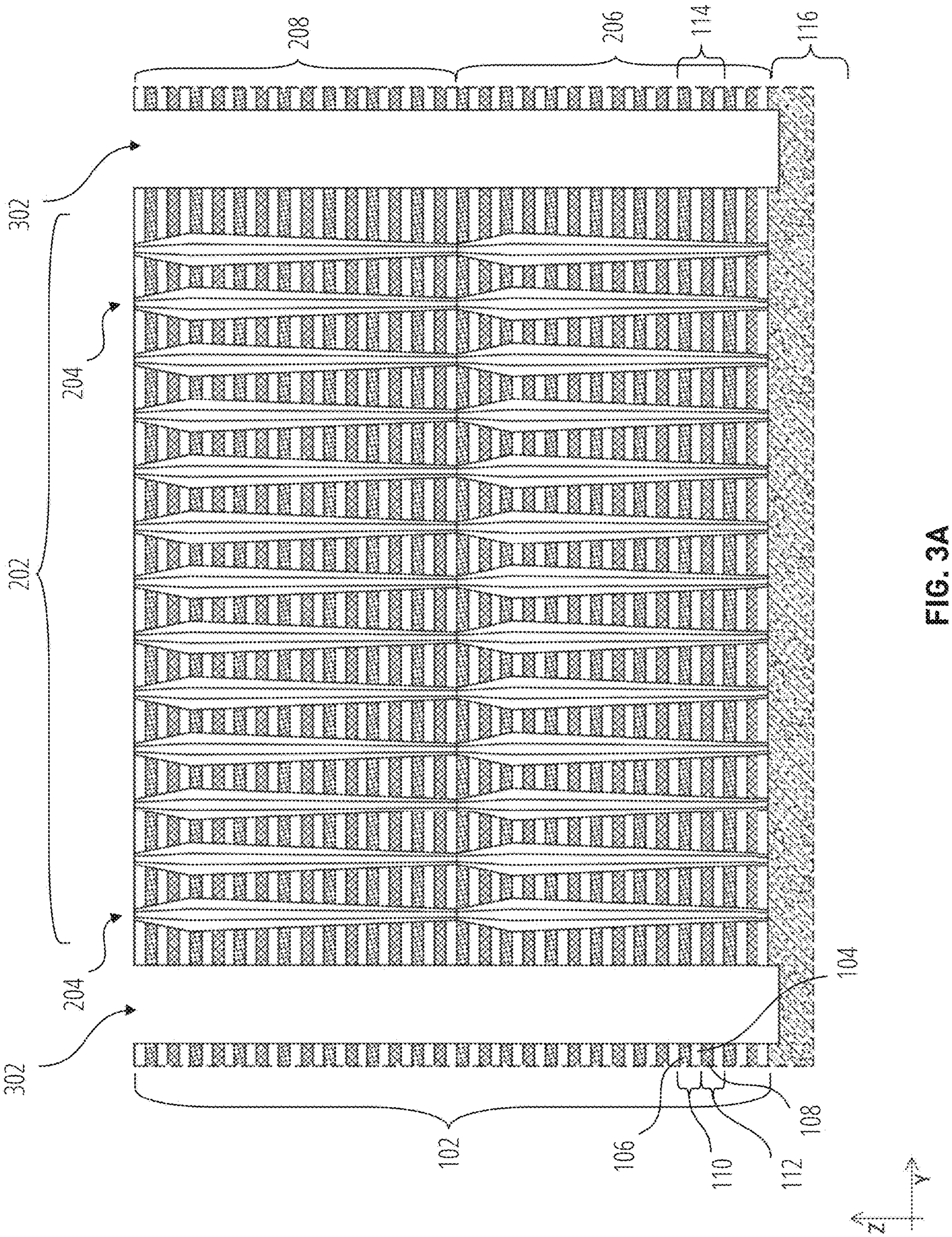
Figure 3B:
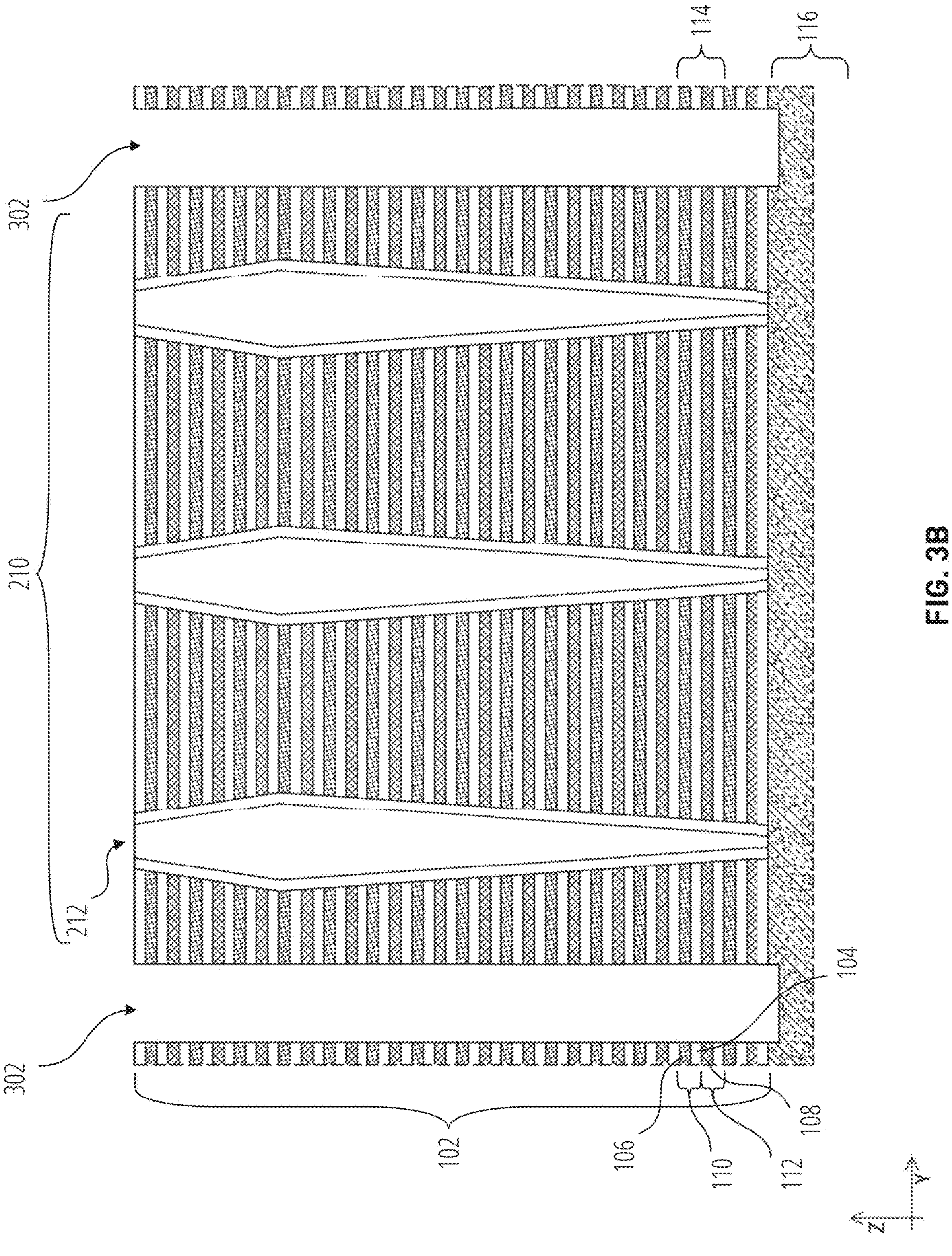

Referring to FIGS. 3A and 3B, slit openings 302 may be formed (e.g., etched) through the precursor stack 102 and, optionally, into a portion of the base structure 116. Each slit opening 302 may be in the form of an elongate trench. A pair of the slit openings 302 may isolate one pillar array region 202 from other pillar array regions 202 with each being in a separate "block" of the device. The individual slit openings 302 illustrated in FIG. 3A may be different portions of the same slit openings 302 that are illustrated in FIG. 3B, such that the structure illustrated in FIG. 3B may be laterally adjacent the structure illustrated in FIG. 3A.

Figure 4A:
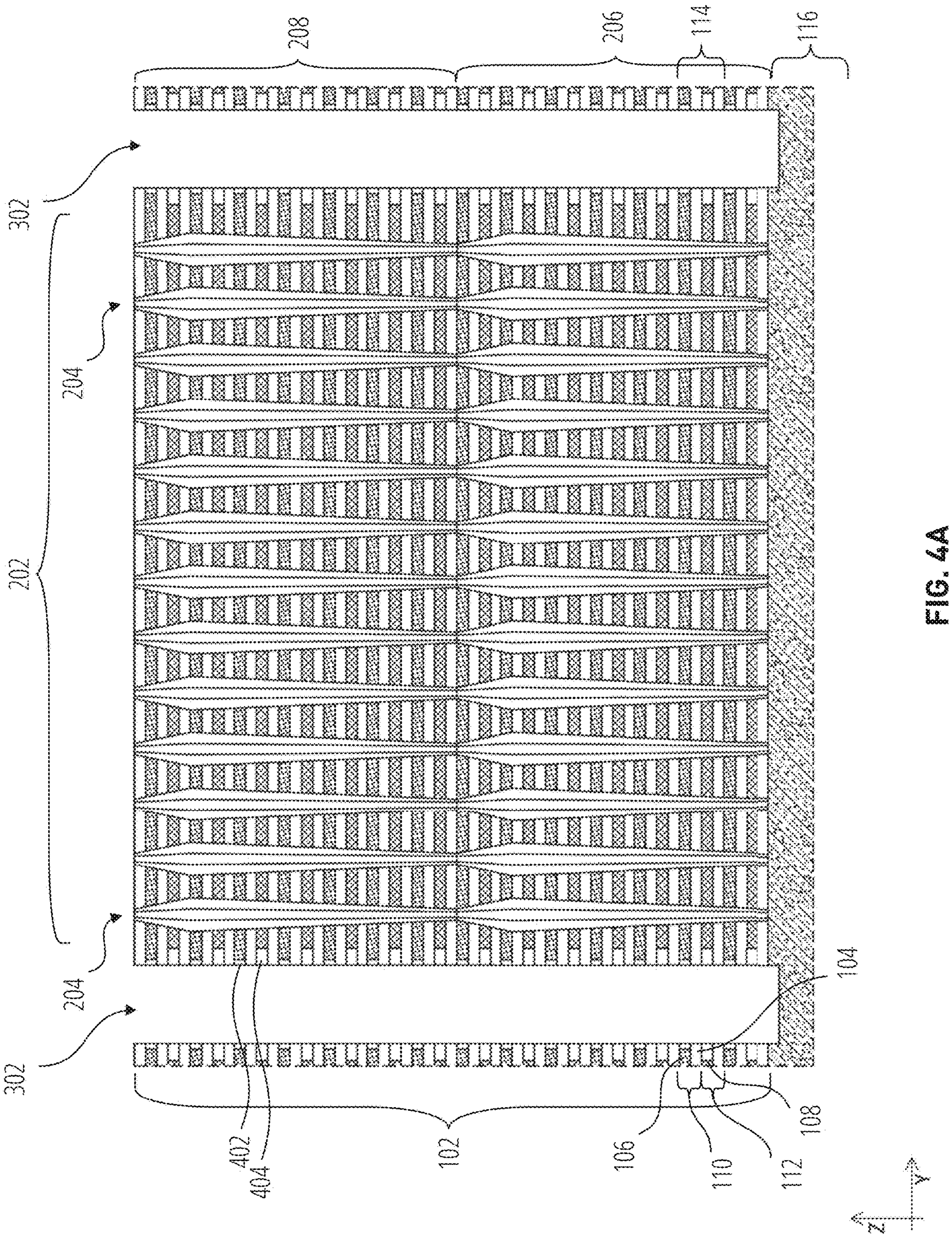
Figure 4B:
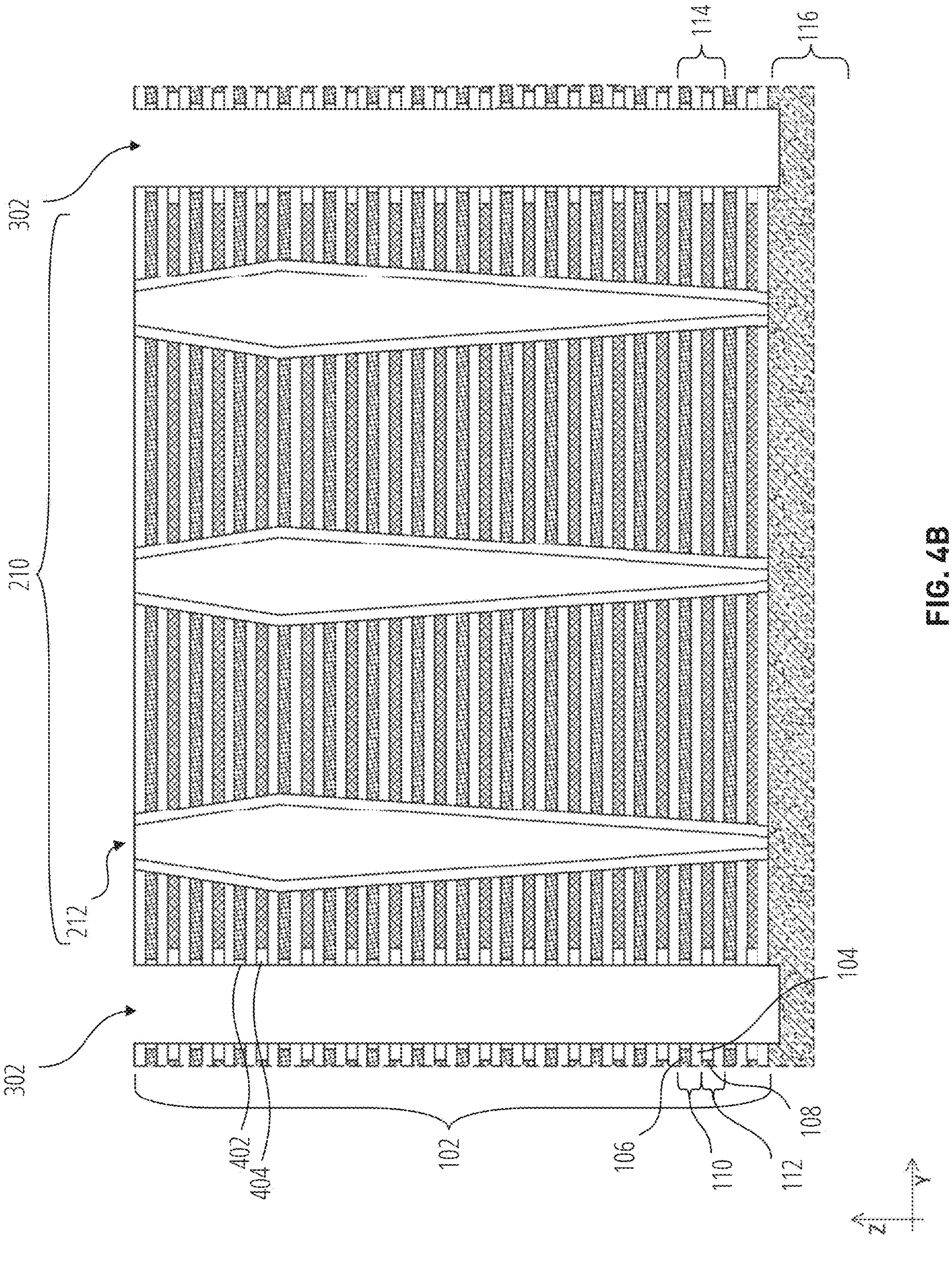

Referring to FIGS. 4A and 4B, forming the slit openings 302 exposes sidewalls of the first par-sac structures 106 and the second par-sac structures 108. At least in embodiments in which the first par-sac structures 106 and the second par-sac structures 108 comprise silicon nitride material(s), the exposed sidewalls may become oxidized where exposed, such as due to formation of "native oxide" in or on the silicon nitride materials. Due to the different formulations of the first par-sac structures 106 and the second par-sac structures 108, different amounts of oxide may form at the exposed sidewall surfaces of the different types of par-sac structures. For example, in embodiments in which the first par-sac structures 106 comprise N-rich SiN and the second par-sac structures 108 comprise Si-rich SiN, a first native oxide region 402 may form on each of the first par-sac structures 106, but a larger second native oxide region 404 may form on each of the second par-sac structures 108 because the Si-rich SiN of the second par-sac structures 108 may be more prone to oxidation than the N-rich SiN of the first par-sac structures 106.

Figure 5A:
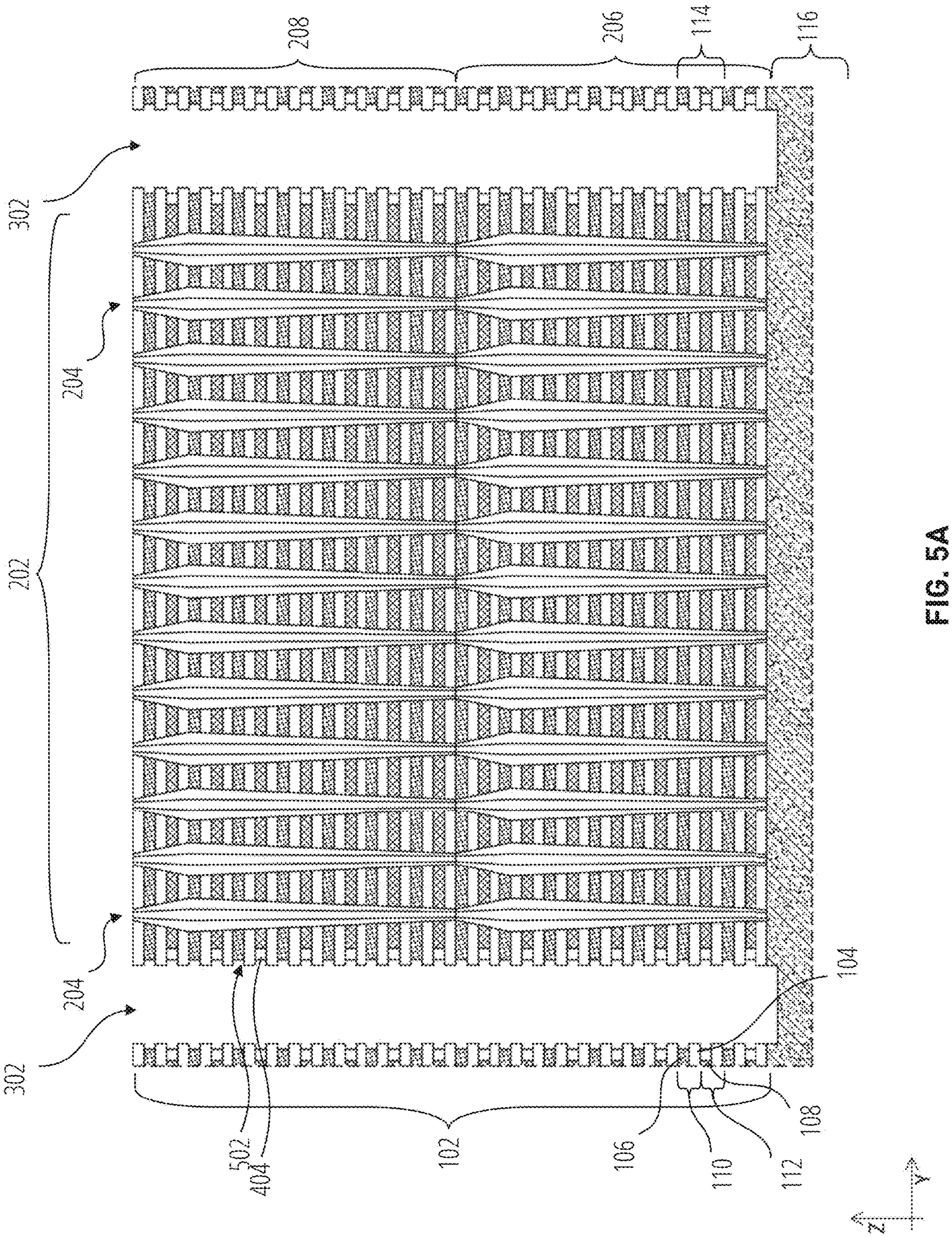
Figure 5B:
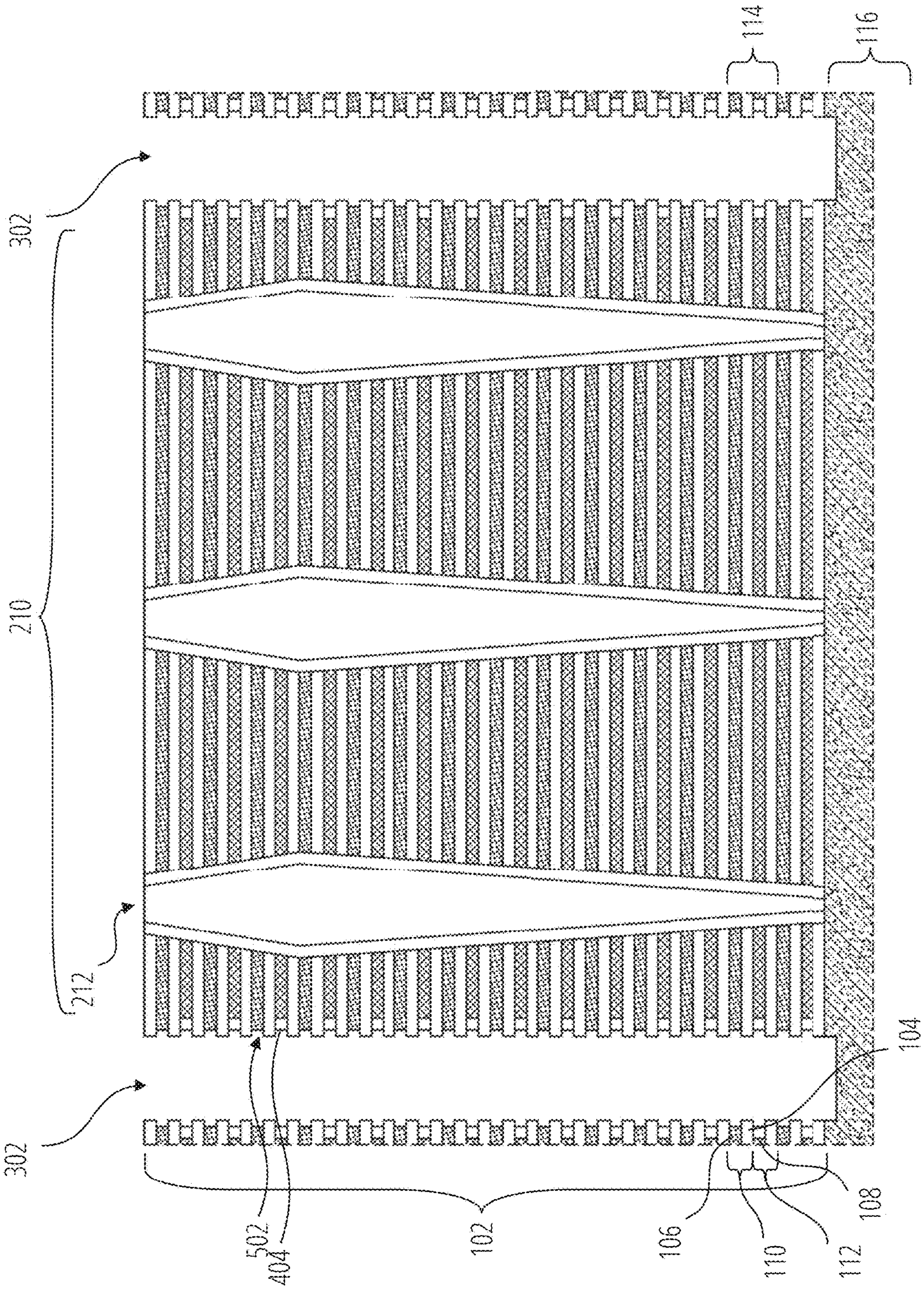

Referring to FIGS. 5A and 5B, one or more oxide-specific etchants (e.g., gas-phase etchant(s), such as HF and $H_2O$ vapor, $NF_3$ and $NH_3$ vapor; liquid-phase oxide etchant(s), such as dilute HF or BOE ("buffered oxide etch") etchant(s)) may be introduced into the slit openings 302 so as to remove the native oxide material from at least the first native oxide regions 402 (FIGS. 4A and 4B), re-exposing the first par-sac structures 106 in the slit openings 302, such as where indicated by arrow 502.

Removing the first native oxide regions 402 (FIGS. 4A and 4B) may, in some embodiments, result in some (but not all) of the second native oxide regions 404 and/or some (but not all) of the insulative structures 104 being removed. The native-oxide-removing chemistry and/or conditions may be controlled so as to prevent removal of all of the second native oxide regions 404, preventing exposure of the second par-sac structures 108.

With the first par-sac structures 106 re-exposed to the slit openings 302, a first material-removal (e.g., exhumation) is performed to remove the first par-sac structures 106 in at least some regions of the stack (e.g., the pillar array regions 202 (FIG. 6A) and the staircase regions 210 (FIG. 6B)). Substances (e.g., etchants), techniques, and/or other conditions used during the first material-removal process may be selected or otherwise controlled so as to selectively remove the first par-sac structures 106 without removing the second native oxide regions 404 and the insulative structures 104. For example, an etchant used in conventional replacement gate techniques, for the exhumation of silicon nitride material, may be used (e.g., a phosphoric acid-based solution).

The exhumation may be stopped without wholly removing the first par-sac structures 106 from one or more regions of the device, as discussed further below. The region(s) retaining the first par-sac structures 106, and therefore the precursor stack 102 structure, may be horizontally adjacent or spaced from the pillar array regions 202 and the staircase regions 210.

Figure 6A:
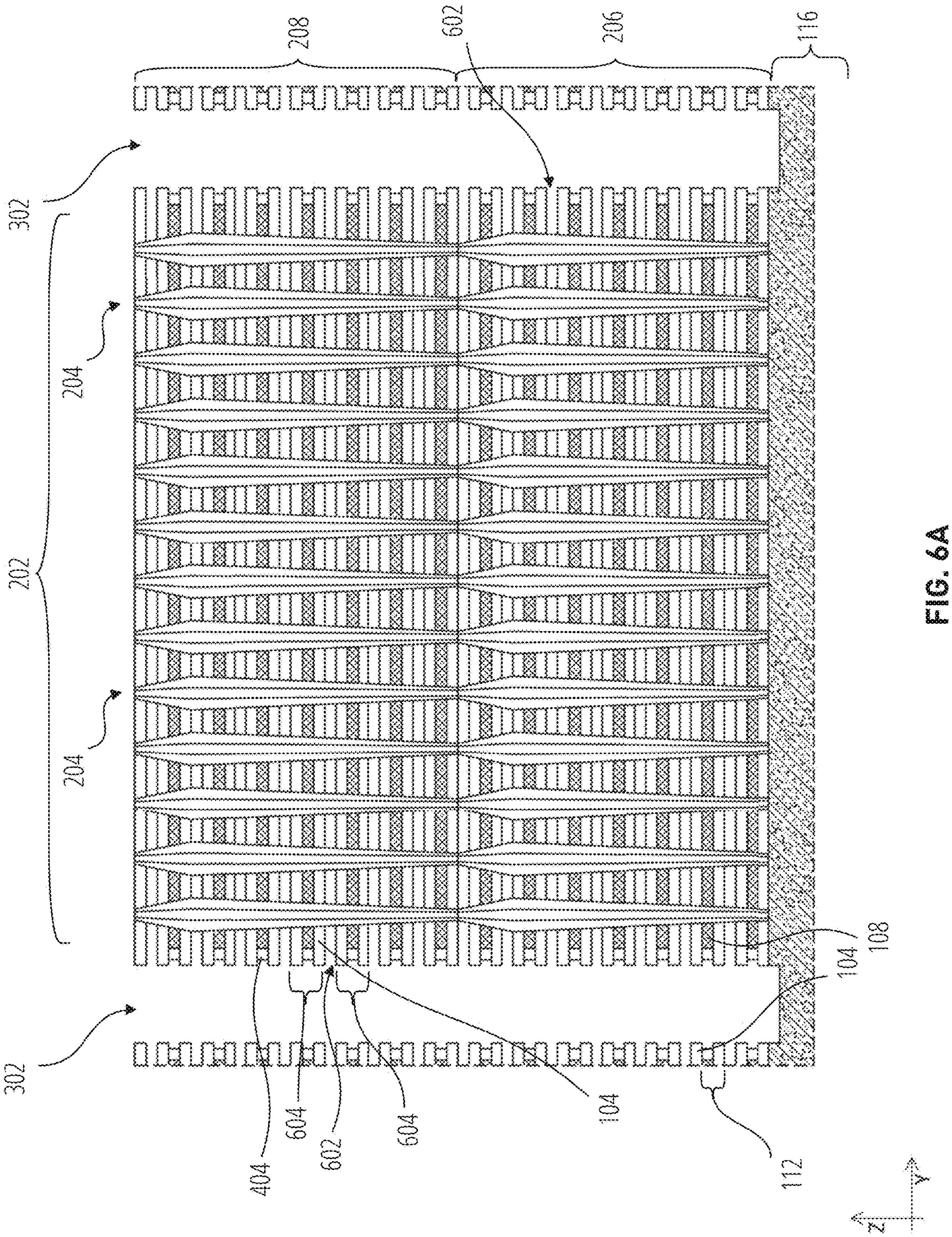
Figure 6B:
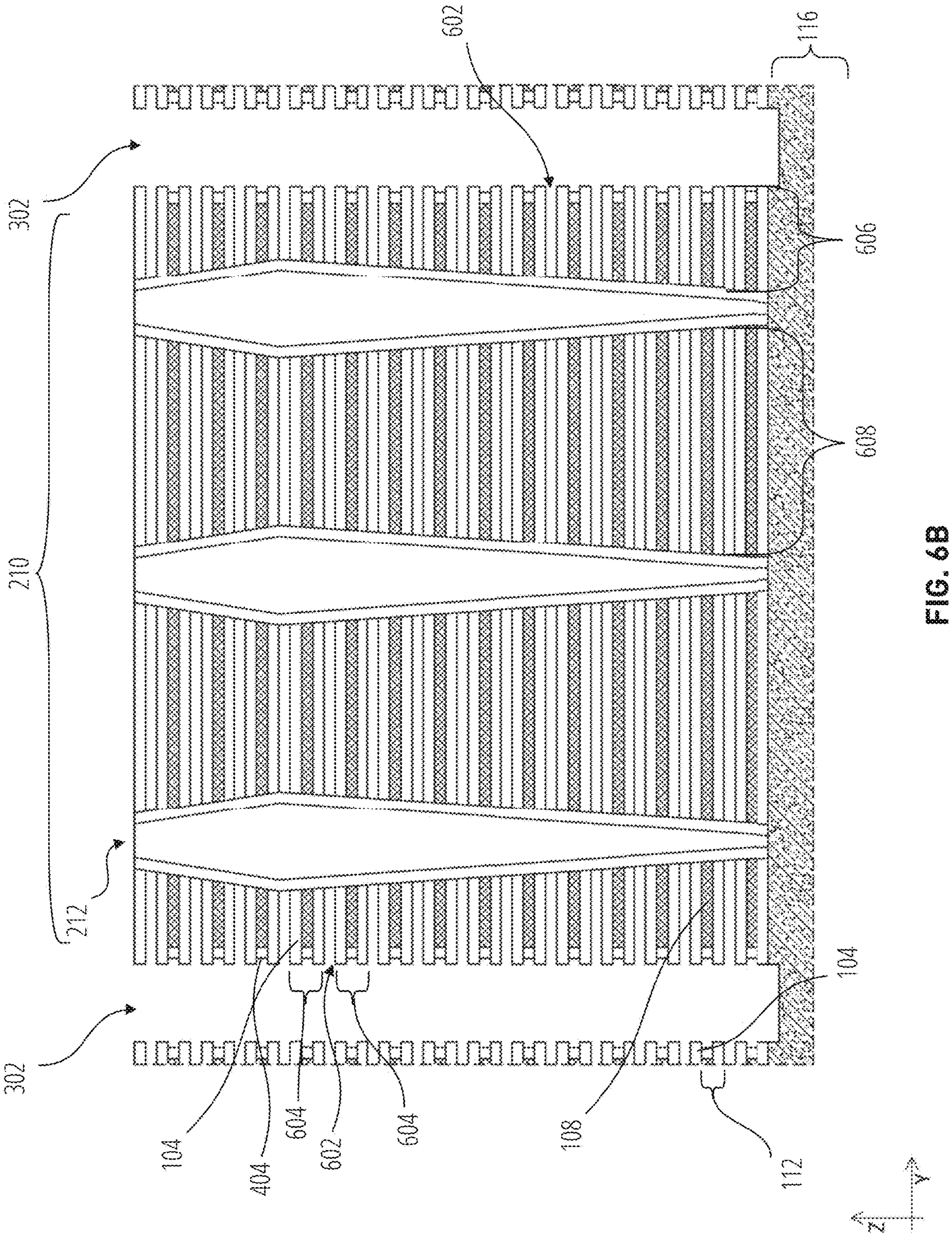

In embodiments in which the first par-sac structures 106 and the second par-sac structures 108 are formulated other than as N-rich and Si-rich SiN materials, respectively, (e.g., as non-doped and as doped materials, respectively), the first exhumation stage illustrated in FIGS. 6A and 6B may follow the stage illustrated in FIGS. 3A and 3B, without the formation and selective removal of native oxide regions described with regard to FIGS. 4A through 5B.

As illustrated in FIGS. 6A and 6B, exhuming the first par-sac structures 106 (FIGS. 5A and 5B) forms voids 602 between multi-structure groups 604 (for at least other than the uppermost and/or lowermost void 602). Each multi-structure group 604 includes at least three structures with one of the second par-sac structures 108 between a pair of the insulative structures 104.

By removing (e.g., exhuming) only every fourth structure of the precursor stack 102 (FIGS. 5A and 5B), rather than every-other structure, the remaining structures (e.g., in the multi-structure groups 604)—including the insulative structures 104—may be more structurally sound and, therefore, less likely to exhibit deformation (e.g., bending, sagging, collapse) into the voids 602. Therefore, and with reference to FIG. 6B, even the longest cantilever portions 606 of the multi-structure groups 604 (e.g., where the multi-structure groups 604 extend toward the slit openings 302) and even the longest spanning portions 608 of the multi-structure groups 604 (e.g., where the multi-structure groups 604 extend between neighboring support structures 212) may be relatively more structurally sound and less likely to exhibit deformation. The longest cantilever portions 606 and longest spanning portions 608 tend to be the cantilever portions 606 and spanning portions 608 in relatively lower elevations of the stack, where openings (e.g., slit openings 302) and features (e.g., the support structures 212) may have tapered to their narrowest horizontal dimensions.

The added structural support provided by ensuring there are multiple structures (e.g., the multi-structure groups 604) above and below each exhumation-formed void 602 may also facilitate forming the structures of the stack (e.g., the precursor stack 102 (FIG. 1) and, eventually, the final stack) at relatively lesser thicknesses. That is, if a minimum thickness of "X" nanometers for insulative structure 104 is needed to avoid deformation of the insulative structure 104 with exhumation of levels immediately above and below the insulative structure 104, a minimum thickness of less-than-"X" nanometers may be sufficient if the insulative structure 104 is adjacent two other non-exhumed structures (e.g., another insulative structure 104 and a par-sac structure). Correspondingly, a relatively lesser thickness for the first par-sac structures 106 (FIG. 1) and for the second par-sac structures 108 may also be suitable. Accordingly, a relatively greater number of first tiers 110 (FIG. 1) and second tiers 112 may be formed in a given height of precursor stack 102; and, therefore, a relatively greater number of conductive structures (e.g., conductive gates, access lines, word lines) may be included in the stack of the final device. Accordingly, the methods and structures according to disclosed embodiments may facilitate vertical scaling.

The additional structural support to the cantilever portions 606, by having at least three structures in the multi-structure group 604 above each void 602, may also facilitate designing the microelectronic device with longer cantilever portions 606, which may provide a broader processing margin for feature fabrication. For example, with a longer cantilever portion 606, there may be less risk of unintentionally removing all or more-than-a-desired amount of the cantilever portion 606 during material-removal processes, which may help ensure the device includes, at all appropriate levels of the stack, a sufficient so-called "conductive rail" portion of the conductive structures to be formed in replacement of the par-sac structures.

Figure 7A:
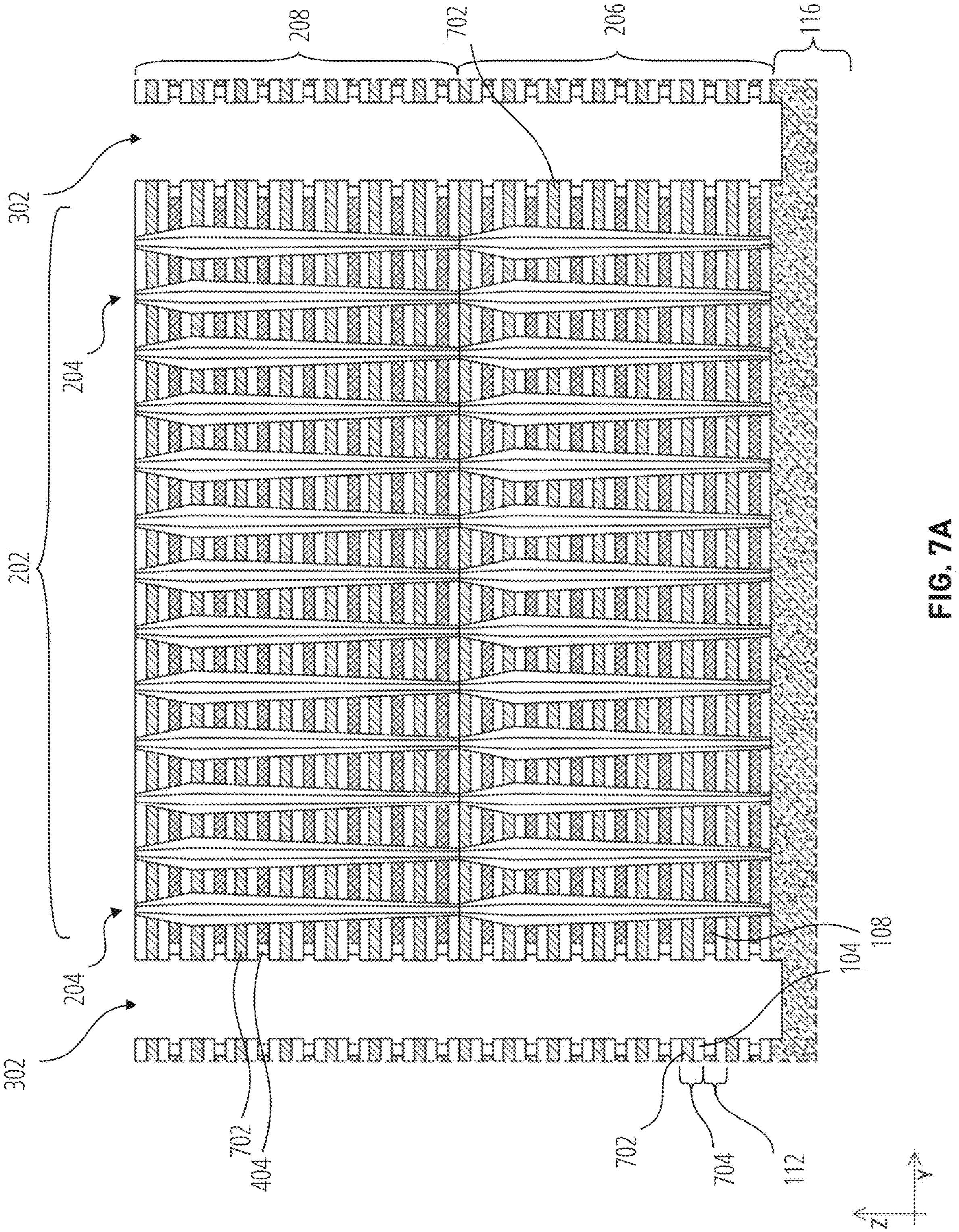
Figure 7B:
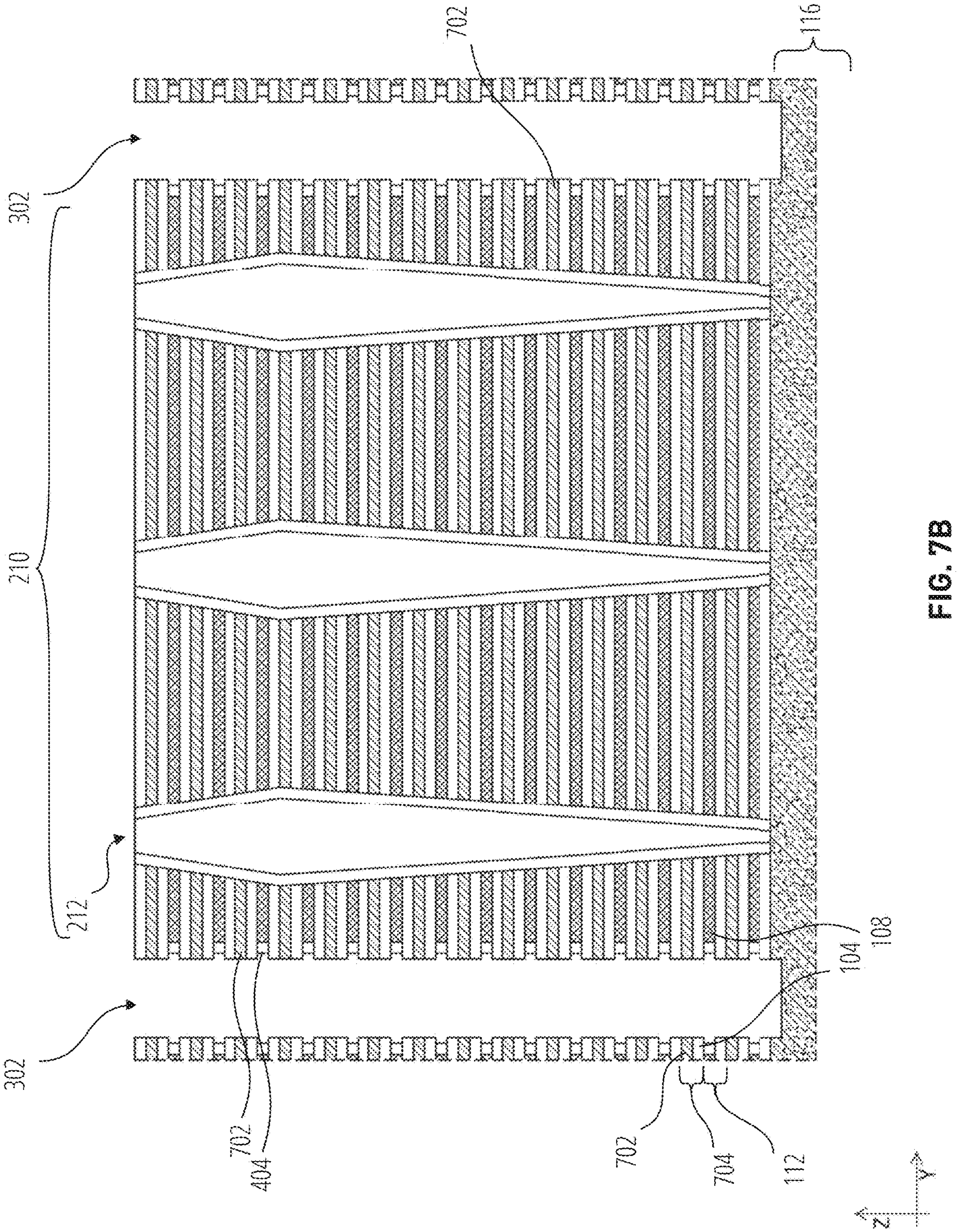

Referring to FIGS. 7A and 7B, one or more conductive materials are formed (e.g., deposited) in the voids 602 (FIGS. 6A and 6B) to form conductive structures 702 in the levels previously occupied by the first par-sac structures 106. Thus, the first tiers 110 (FIG. 1) that previously included the first par-sac structures 106 are effectively converted to first tiers 704 that include the conductive structures 702. The conductive structures 702 may be formed of and include (e.g., each be formed of and include) one or more conductive materials, such as one or more of: at least one metal (e.g., one or more of tungsten, titanium, nickel, platinum, rhodium, ruthenium, iridium, aluminum, copper, molybdenum, silver, gold), at least one alloy (e.g., an alloy of one or more of the aforementioned metals), at least one metal-containing material that includes one or more of the aforementioned metals (e.g., metal nitrides, metal silicides, metal carbides, metal oxides, such as a material including one or more of titanium nitride (TiN), tantalum nitride (TaN), tungsten nitride (WN), titanium aluminum nitride (TiAlN), iridium oxide ($IrO_x$), ruthenium oxide ($RuO_x$), alloys thereof), at least one conductively-doped semiconductor material (e.g., conductively-doped silicon, conductively-doped germanium, conductively-doped silicon germanium), and at least one other material exhibiting electrical conductivity. In some embodiments, the conductive structures 702 include at least one of the aforementioned conductive materials along with at least one additional of the aforementioned conductive materials formed as a liner. The liner may be formed (e.g., conformally deposited) in the voids 602 (FIGS. 6A and 6B), and then the remaining conductive material(s) may be formed (e.g., deposited) on the liner.

Figure 8A:
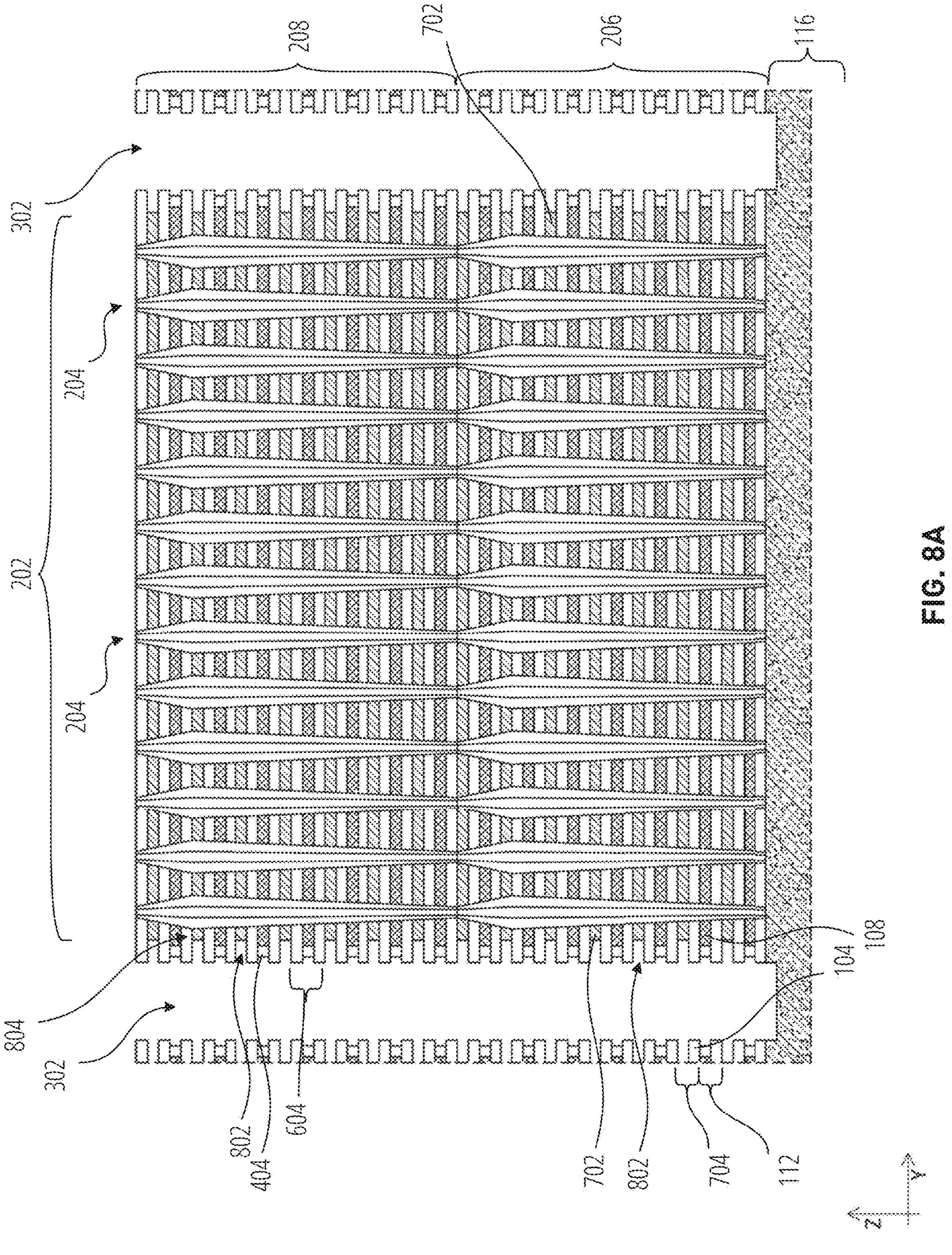
Figure 8B:
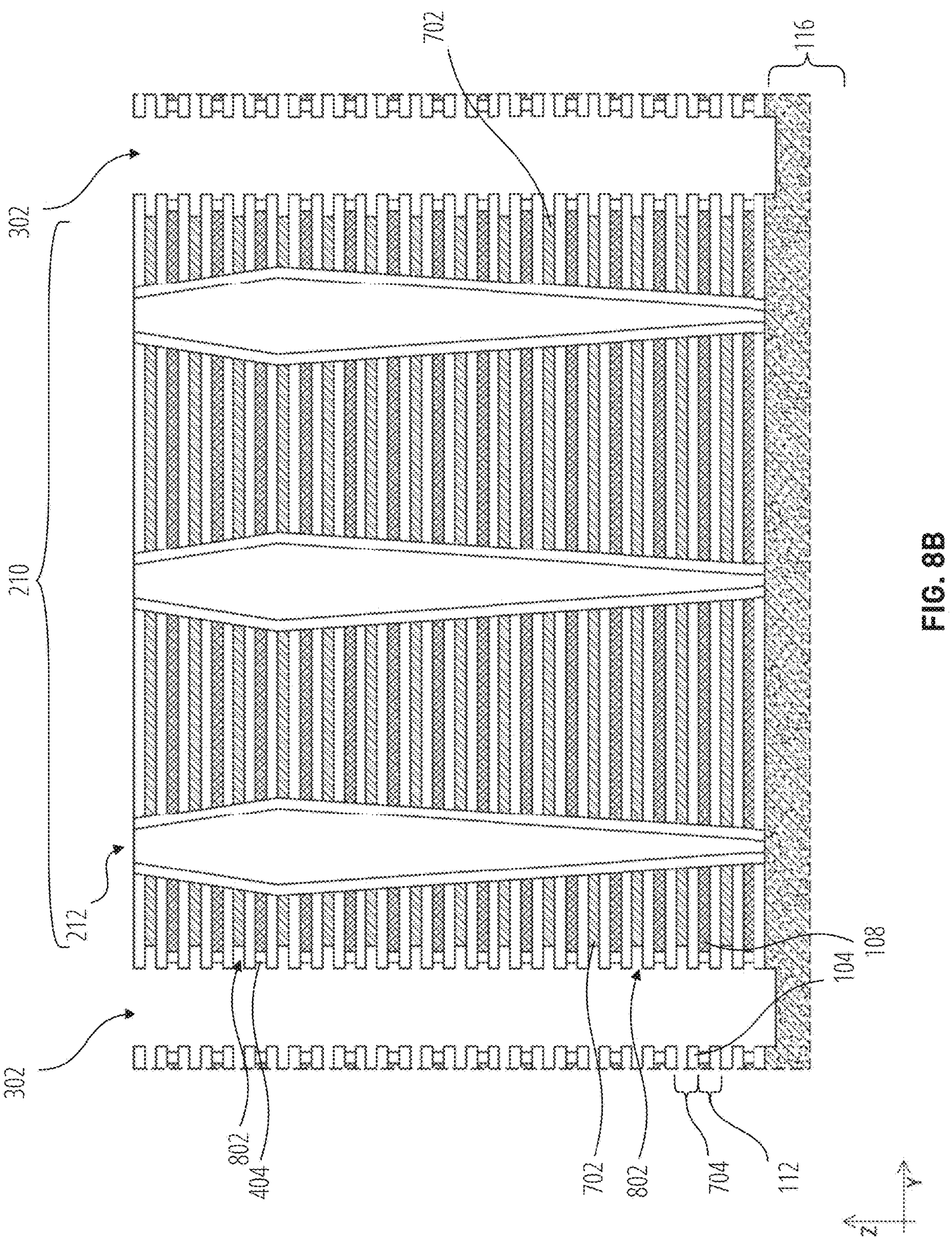

Referring to FIGS. 8A and 8B, in some embodiments, a material-removal process (e.g., etching) is performed to recess the conductive structures 702 relative to the insulative structures 104 along the slit opening 302, forming recesses 802, which may ensure each conductive structure 702 is physically and electrically isolated from vertically neighboring conductive structures 702. Recess 802 formation may be controlled (e.g., limited in time and/or other conditions) so as to retain at least a minimum so-called "conductive rail" 804 between the slit opening 302 and the pillars 204. The relatively-wider processing margin discussed above—which may be facilitated by having the multi-structure group 604 (FIGS. 6A and 6B) of at least three structures remaining during the individual exhumation stages—may lessen the risk of unintentionally wholly removing the conductive rail 804 at any particular elevation of the stack 1102.

Figure 9A:
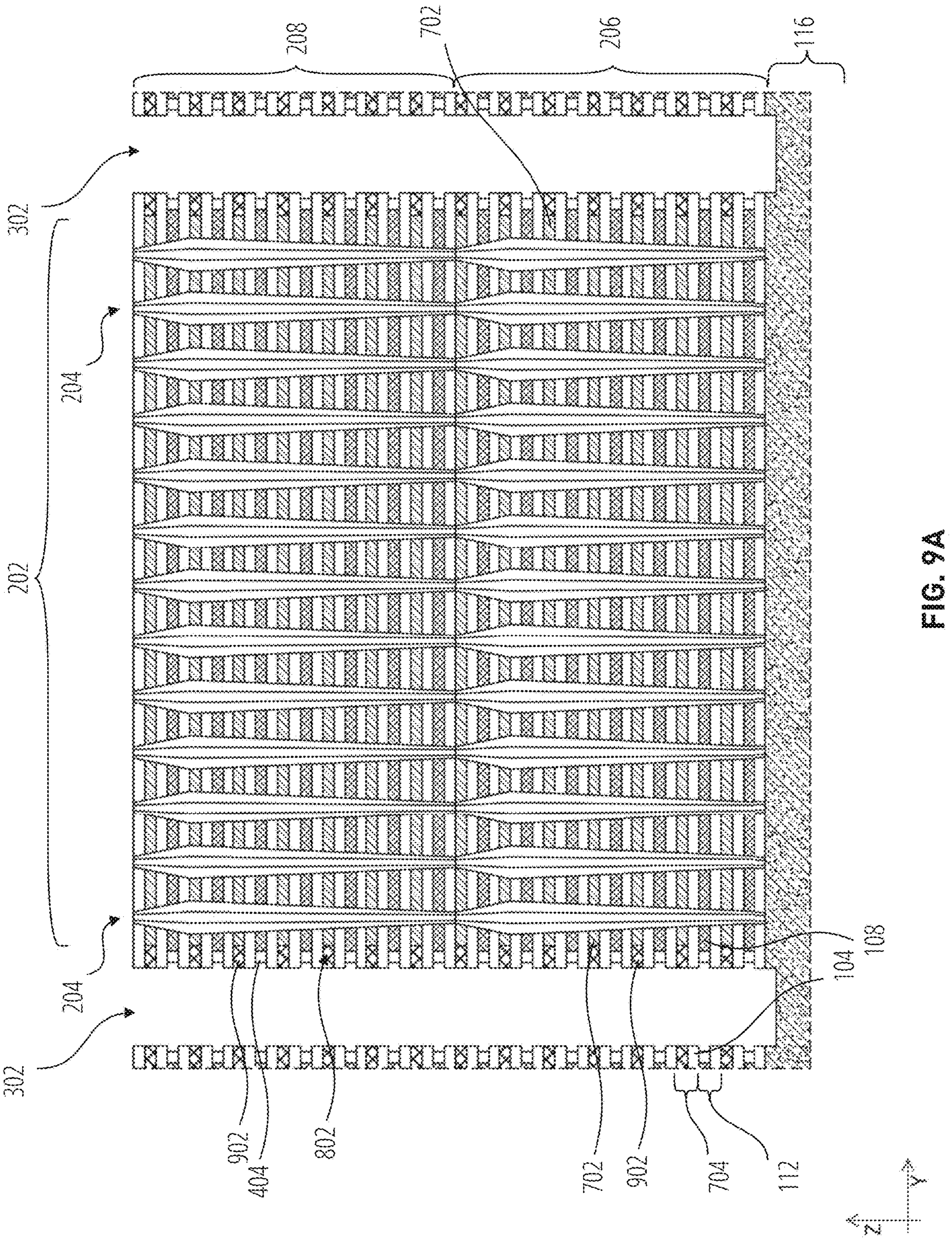
Figure 9B:
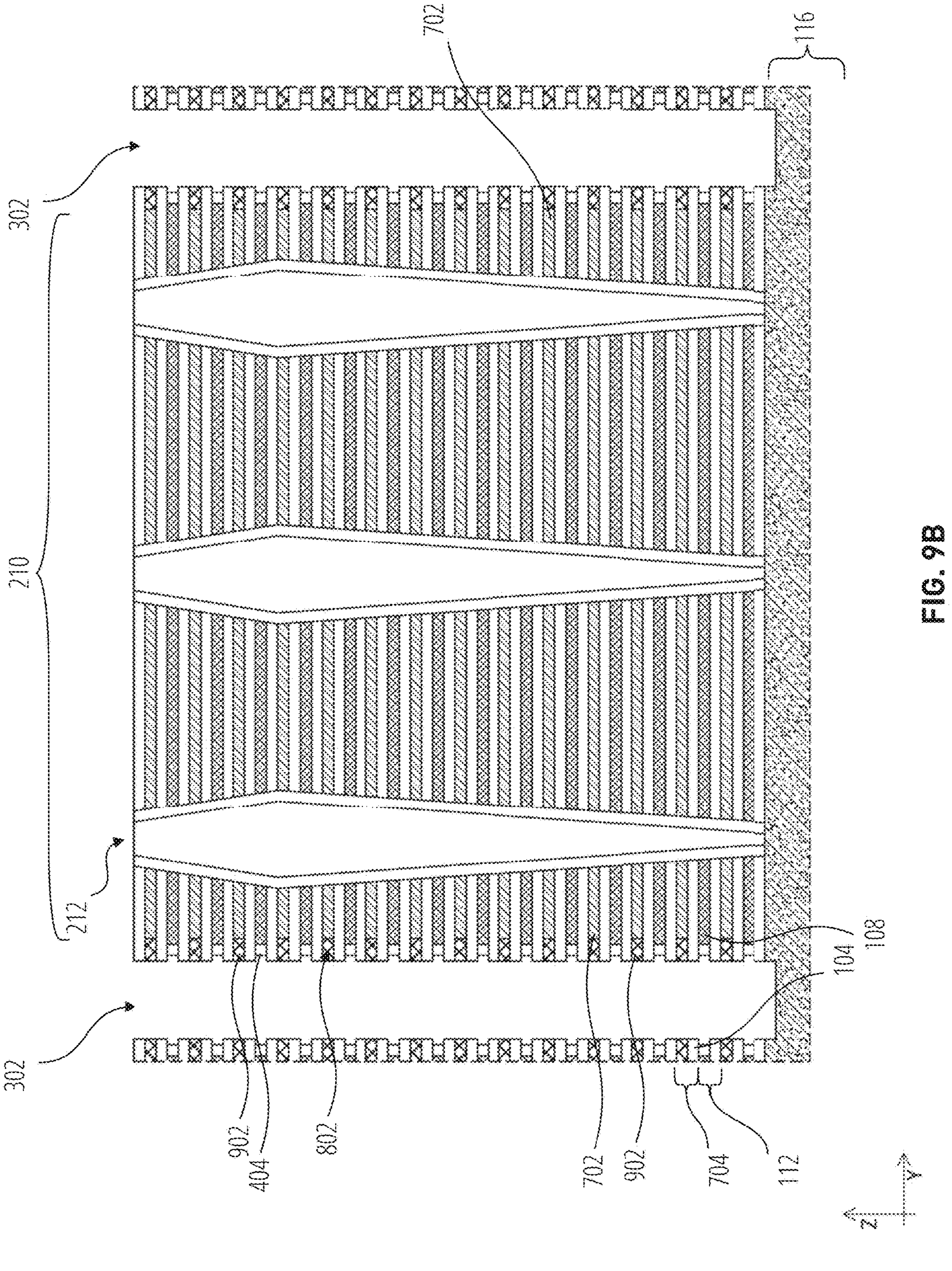

Referring to FIGS. 9A and 9B, a sacrificial cap 902 may be formed (e.g., deposited) in the recesses 802 so that the conductive structures 702 are no longer exposed in the slit openings 302. The material(s) of the sacrificial caps 902 may be selected or otherwise formulated so that the material(s) thereof survive subsequent selective etching of the second native oxide regions 404 and the second par-sac structures 108. In some embodiments, the sacrificial caps 902 are formed of and include one or more of silicon (e.g., polycrystalline silicon, amorphous silicon), carbon, and/or another material (e.g., tungsten).

With the protection of the sacrificial caps 902 in place covering the sidewalls of the conductive structures 702, the second native oxide regions 404 (if present) may be removed (e.g., etched). The embodiments in which second native oxide regions 404 are removed during the stage(s) illustrated in FIGS. 9A and 9B may be the embodiments in which the first par-sac structures 106 (FIG. 1) and the second par-sac structures 108 comprise different silicon nitride materials. The same or a different etch chemistry may be used for the removal of the second native oxide regions 404 as used for the removal of the first native oxide regions 402 (FIGS. 4A and 4B).

The embodiments in which no second native oxide regions 404 are present or need be removed during the stage(s) illustrated in FIGS. 9A and 9B may be the embodiments in which the first par-sac structures 106 (FIG. 1) and the second par-sac structures 108 comprise differently-doped materials, such as non-doped material and a doped material, respectively.

With the second native oxide regions 404 exposed in the slit openings 302 and the conductive structures 702 not exposed, a second material-removal (e.g., exhumation) process removes the second par-sac structures 108 in at least some regions of the device (e.g., from the pillar array region 202 (FIG. 9A) and/or from the staircase region 210 (FIG. 9B)). The same or different etch chemistry may be used to remove the second par-sac structures 108 as was used to remove the first par-sac structures 106 (FIGS. 5A and 5B). The exhumation may not remove the second par-sac structures 108 from all regions of the device, so the second par-sac structures 108 may remain in at least one other region (as discussed further below) horizontally adjacent or spaced from the pillar array regions 202 and/or the staircase regions 210. In some embodiments, as discussed below, the second par-sac structures 108 may be removed from one or more regions in which the first par-sac structures 106 remain, and/or the second par-sac structures 108 may remain in one or more regions from which the first par-sac structures 106 were removed.

Removing the second par-sac structures 108 forms additional voids 1002 that—except for, perhaps, the lowermost and/or uppermost additional void 1002—are between multi-structure groups 1004 of at least three structures each. Each multi-structure group 1004 may include a single conductive structure 702 between a pair of the insulative structures 104. As with the multi-structure groups 604 (FIGS. 6A and 6B), the multi-structure groups 1004 may exhibit sufficient structural integrity to inhibit deformation (e.g., sagging, bending, collapsing) into the additional voids 1002, even at the longest cantilever portions 606 and spanning portions 608.

Figure 11A:
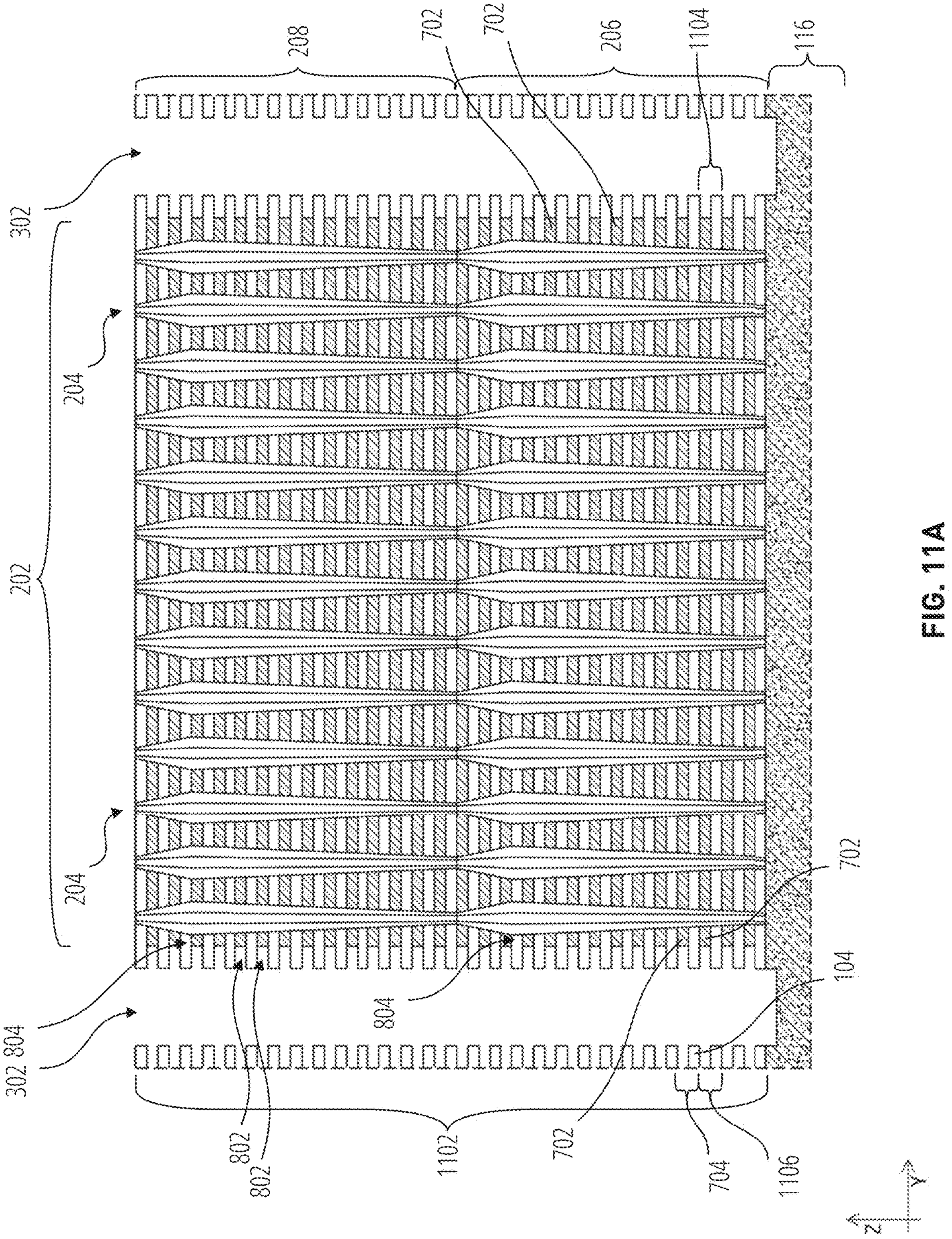
Figure 11B:
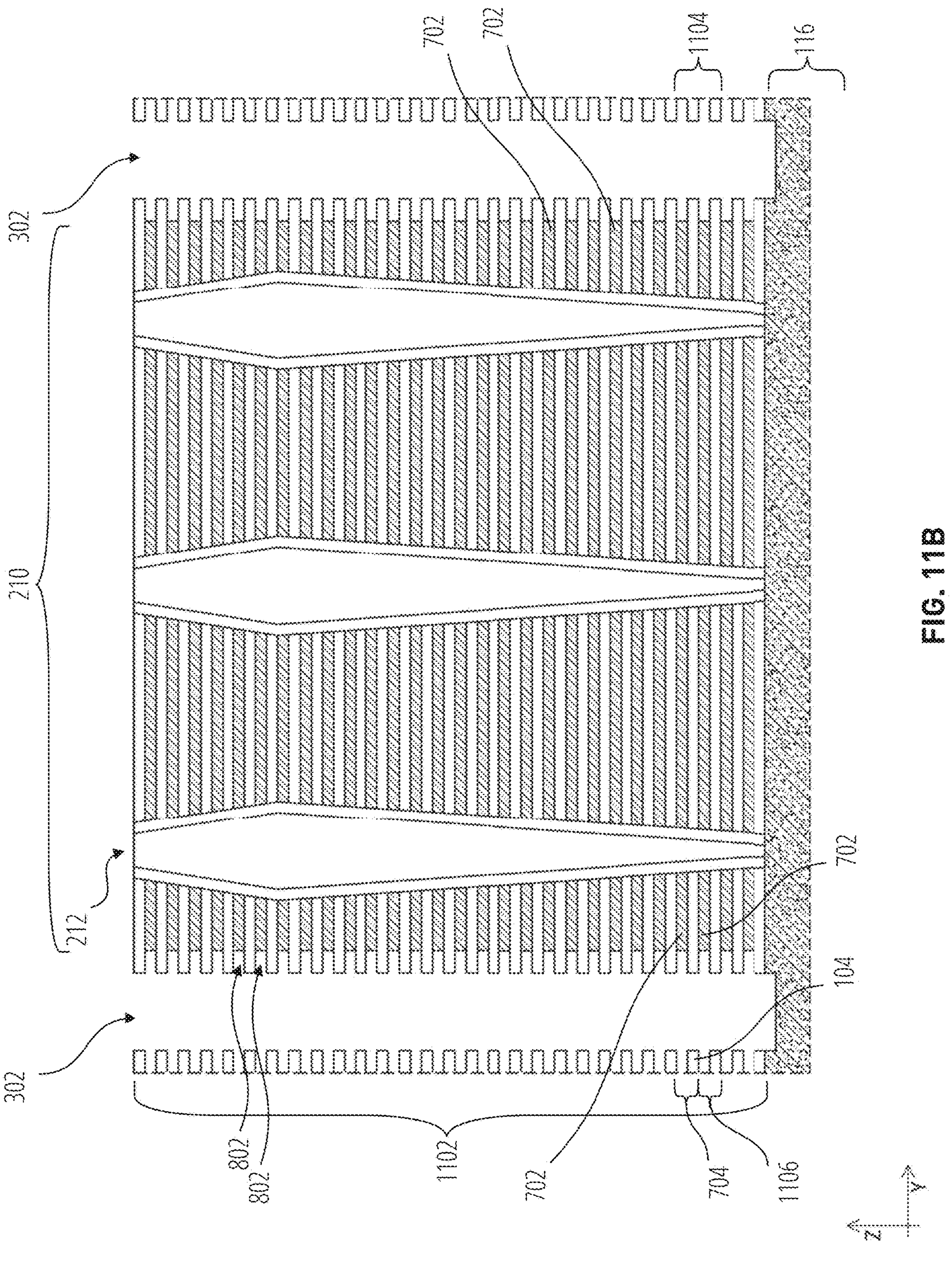

Conductive material(s) are then formed in the additional voids 1002, providing additional conductive structures 702 (as illustrated in FIGS. 11A and 11B) in the levels previously occupied by the second par-sac structures 108 (FIGS. 9A and 9B). This forms—e.g., in the pillar array regions 202 (FIG. 11A) and/or the staircase regions 210 (FIG. 11B)—a stack 1102 with the insulative structures 104 vertically interleaved with only conductive structures 702. Each conductive structure 702 is therefore vertically between a pair of the insulative structures 104, and the resulting repeating unit of the stack 1102 may be a two-structure tier group 1104 with a single insulative structure 104 and a single conductive structure 702.

In some embodiments, the same materials and formation processes are used to form the conductive structures 702 of second tiers 1106 as used to form the conductive structures 702 of first tiers 704, such that all of the conductive structures 702 in the stack 1102 may have substantially the same material composition and structure (e.g., microstructure) as one another. In other embodiments, different material(s) and/or processes are used to form the conductive structures 702 of the second tiers 1106 than was used to form the conductive structures 702 of the first tiers 704, so the conductive structures 702 of the second tiers 1106 may have a different material composition and/or structure (e.g., microstructure) than the conductive structures 702 of the first tiers 704. Like the conductive structures 702 of the first tiers 704, the conductive structures 702 of the second tiers 1106 may be recessed relative to the insulative structures 104, providing additional recesses 802 adjacent the slit openings 302.

Figure 12A:
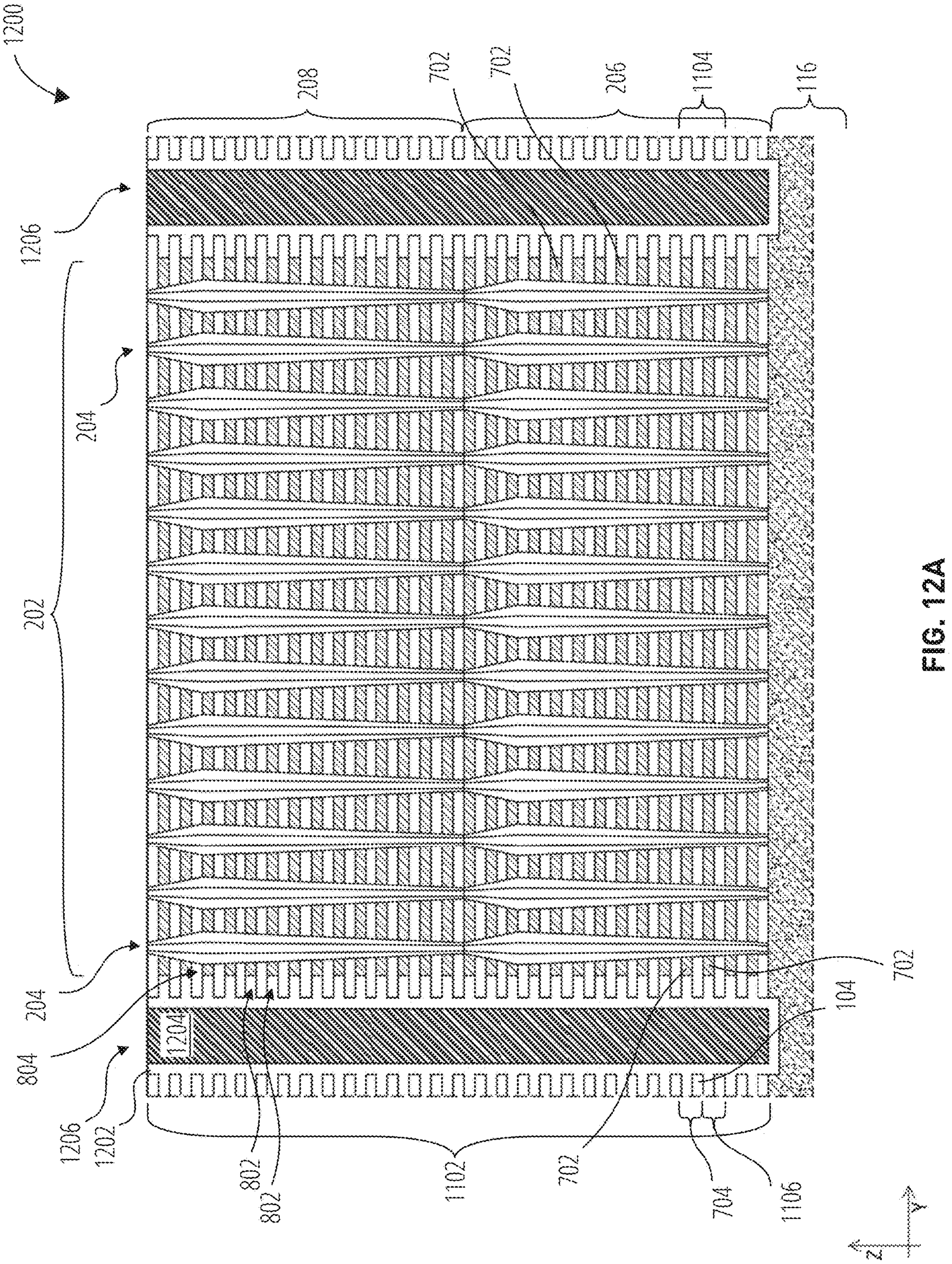
Figure 12B:
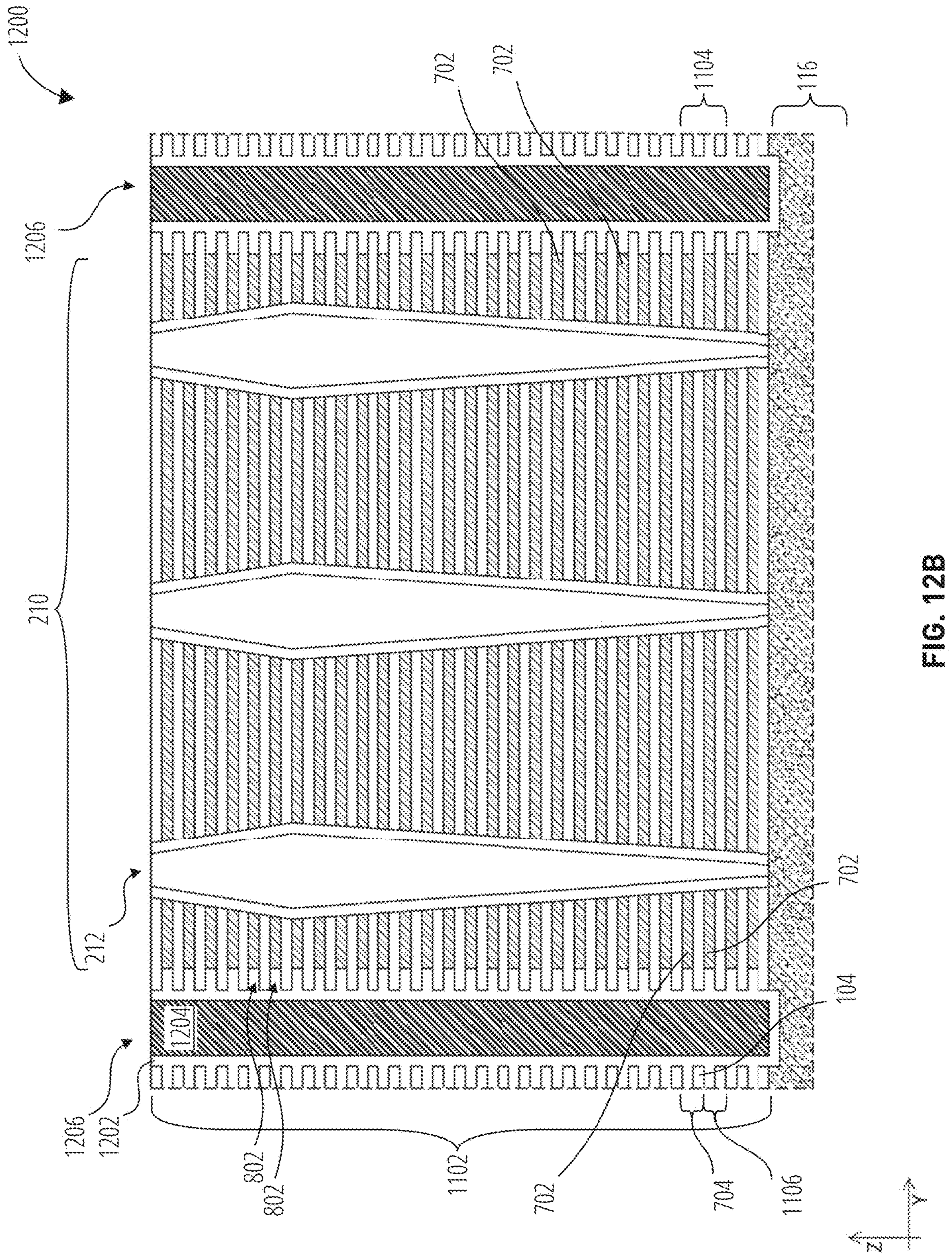

Referring to FIGS. 12A and 12B, one or more insulative liners 1202 and/or nonconductive material(s) 1204 may be formed (e.g., deposited) in the slit openings 302 to form slit structures 1206. The insulative liners 1202 may extend into and fill the recesses 802.

A resulting microelectronic device structure 1200 includes the pillar array regions 202 (FIG. 12A) and/or the staircase regions 210 (FIG. 12B) with the stack 1102 of vertically alternating insulative structures 104 and conductive structures 702, and which may be formed by a process in which no lone (e.g., single) structure is left between voids as a result of exhuming sacrificial or par-sac structures of the initial precursor stack 102 (FIG. 1). In some embodiments, the microelectronic device structure also includes other features (e.g., conductive contacts, access lines, other circuitry). Because at least a portion of the par-sac structures remains in the final microelectronic device structure 1200, one or more other regions of the microelectronic device structure 1200 include one or both of the first par-sac structures 106 and/or the second par-sac structures 108.

In some embodiments, one or more regions of the microelectronic device structure 1200 may retain the precursor stack 102 structure of FIG. 1, with both the first par-sac structures 106 and second par-sac structures 108. Therefore, such regions include insulative structures 104 vertically alternating with par-sac structures (e.g., the first par-sac structures 106, the second par-sac structures 108).

Figure 12D:
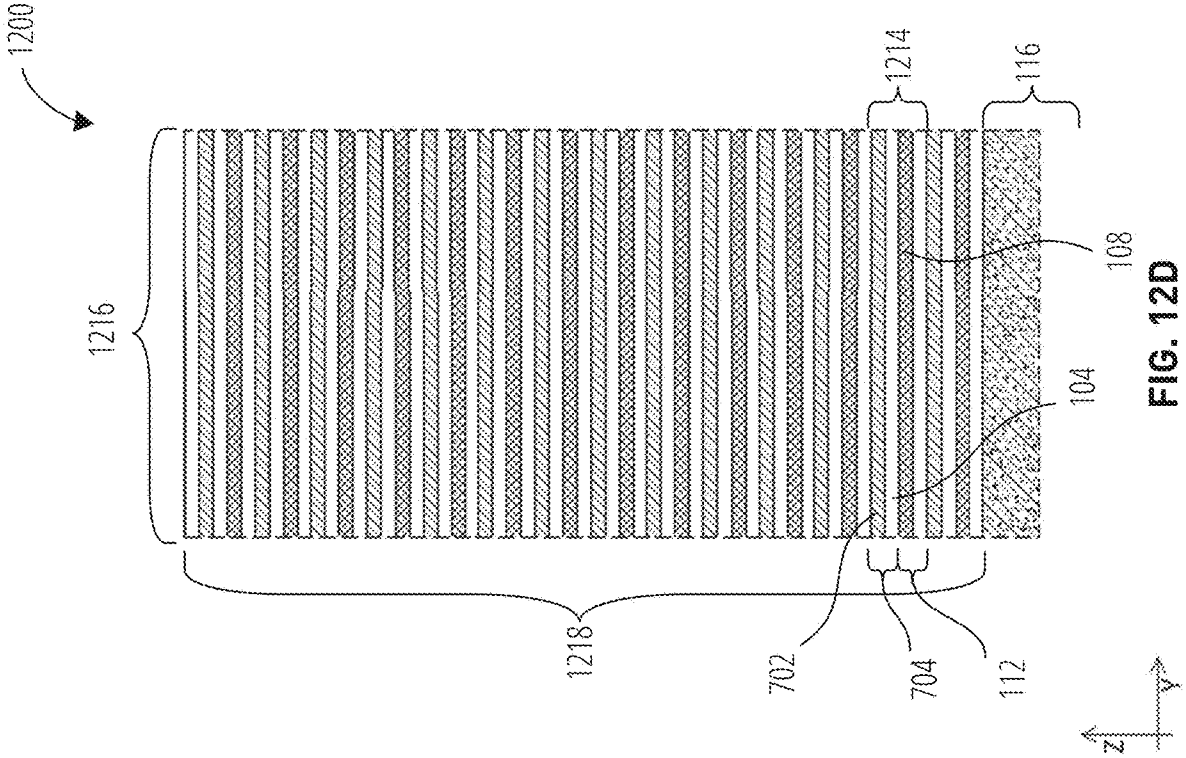
Figure 12C:
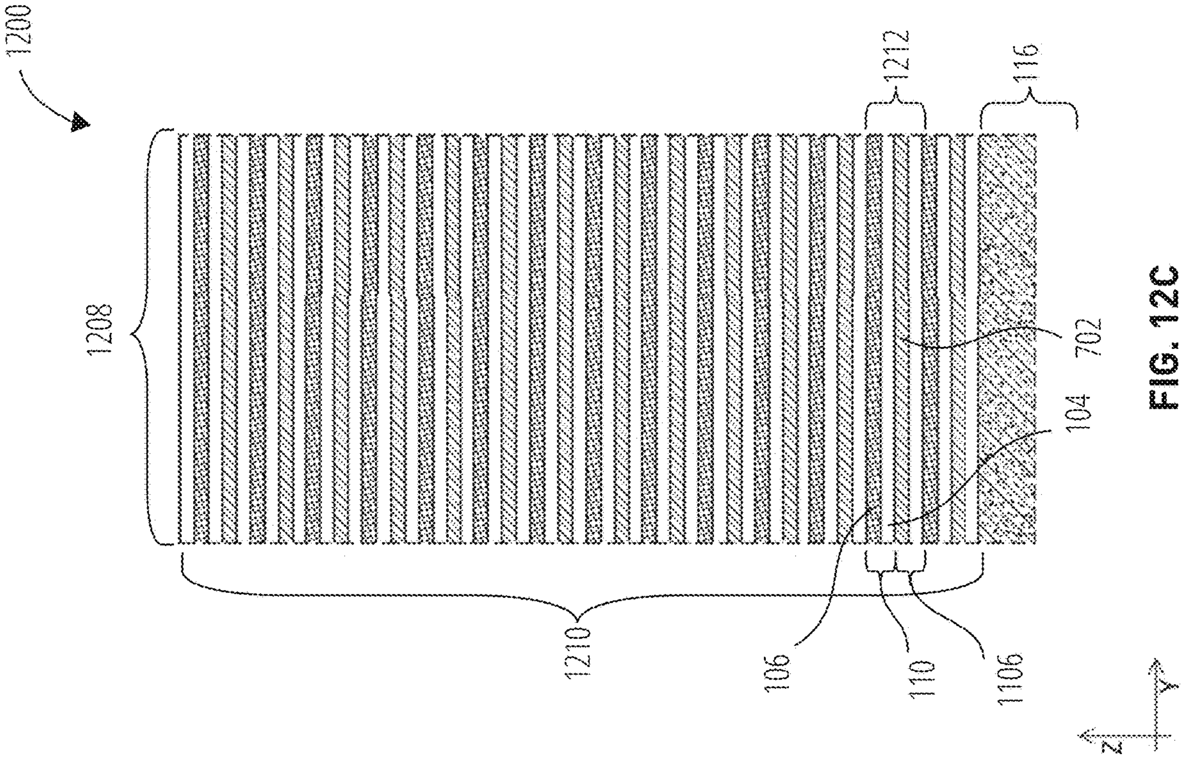

Referring to FIGS. 12C and 12D, in some embodiments, one or more other regions of the microelectronic device structure 1200 include a stack with both conductive structures 702 and some retained original par-sac structures. For example, referring to FIG. 12C, one or more other regions 1208 may include conductive structures 702 and first par-sac structures 106 in a first partially-conductive stack 1210. As used herein, the term "partially-conductive stack" means and refers to a stack that includes, per repeating tier group (e.g., tier group 1214), at least one conductive structure 702 and at least one other-material (e.g., non-conductive, in some embodiments) par-sac structure, in addition to insulative structures 104. The first partially-conductive stack 1210 has a repeating tier group 1212 of one first tier 110 and one second tier 1106. The first tier 110 includes one insulative structure 104 and one first par-sac structure 106. The second tier 1106 includes one insulative structure 104 and one conductive structure 702. The other regions 1208 of the microelectronic device structure 1200 may be regions where exhumation-and-replacement of the second par-sac structures 108 (FIG. 1) was completed but where the first par-sac structures 106 were not removed.

As another example, referring to FIG. 12D, in some embodiments, one or more additional regions 1216 of the microelectronic device structure 1200 include conductive structures 702 and second par-sac structures 108 in a second partially-conductive stack 1218. The second partially-conductive stack 1218 has a repeating tier group 1214 of one first tier 704 and one second tier 112. The first tier 704 includes one insulative structure 104 and one conductive structure 702. The second tier 112 includes one insulative structure 104 and one second par-sac structure 108. These additional regions 1216 of the microelectronic device structure 1200 may be regions where exhumation-and-replacement of the first par-sac structures 106 (FIG. 1) was completed but where the second par-sac structures 108 were not removed.

Microelectronic devices and microelectronic device structures 1200, according to embodiments of the disclosure, may include one or more regions with a stack structure having conductive structures 702 vertically alternating with insulative structures 104 (e.g., as in the pillar array region 202 of FIG. 12A and/or the staircase region 210 of FIG. 12B), one or more regions with insulative structures 104 vertically alternating with other-material (e.g., non-conductive structures (e.g., as in the precursor stack 102 of FIG. 1), and/or one or more regions with insulative structures 104 vertically alternating with both conductive structures 702 and other-material (e.g., non-conductive) structures (e.g., as in the first partially-conductive stack 1210 of FIG. 12C or the second partially-conductive stack 1218 of FIG. 12D).

In some embodiments, microelectronic devices and microelectronic device structures 1200, according to embodiments of the disclosure, include one or more stack structure type, such as with one or more pillar array region 202 (FIG. 12A), one or more staircase region 210 (FIG. 12B), one or more other region 1208 (FIG. 12C), one or more additional region 1216 (FIG. 12D), and/or one or more precursor stack 102 region (FIG. 1).

Accordingly, disclosed is a microelectronic device comprising a region comprising a tiered stack. The tiered stack comprises insulative structures, conductive structures, and other (e.g., non-conductive) structures arranged in tiers. The insulative structures vertically alternate with both the conductive structures and with the other (e.g., non-conductive) structures. Each of the conductive structures is vertically spaced from another of the conductive structures by at least one of the other (e.g., non-conductive) structures and by at least two of the insulative structures. A composition of the other (e.g., non-conductive) structures differs from a composition of the insulative structures and from a composition of the conductive structures.

Also disclosed is a method for forming a microelectronic device. The method comprises forming a precursor stack comprising insulative structures vertically alternating with both first other (e.g., non-conductive) structures and second other (e.g., non-conductive) structures. In at least one region of the precursor stack, the first other (e.g., non-conductive) structures are substantially removed—without removing the second other (e.g., non-conductive) structures—to form voids vertically between tier groups. Each of the tier groups comprises at least two of the insulative structures and at least one of the second other (e.g., non-conductive) structures. Conductive structures are formed in the voids.

Including both the first partially-conductive stack 1210 (with the other region 1208) and (the second partially-conductive stack 1218 (with the additional region 1216) in a microelectronic device structure may facilitate forming device features with improved reliability. For example, using both types of partially-conductive/partially-sacrificial stack structures may accommodate forming conductive contacts to the conductive structures 702—e.g., in staircased stadiums—with relatively less risk of contact overextension and/or electrical shorting to a non-target conductive structure 702. Such methods and microelectronic device structures are illustrated in FIGS. 13 through 26C and described below.

Figure 13:
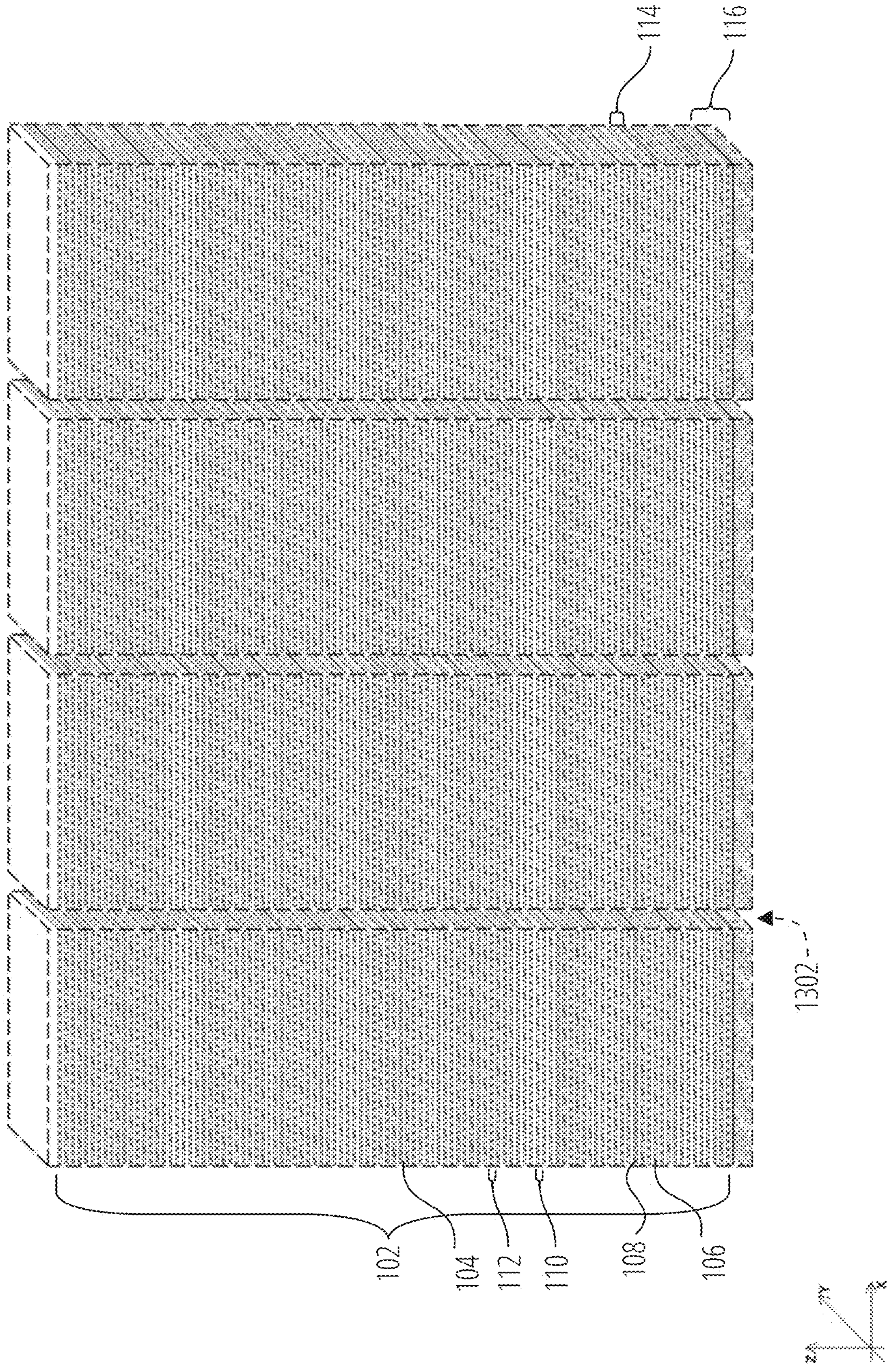

Referring to FIG. 13, the precursor stack 102 may be formed on the base structure 116 in substantially the same manner described above with regard to FIG. 1.

Figure 14:
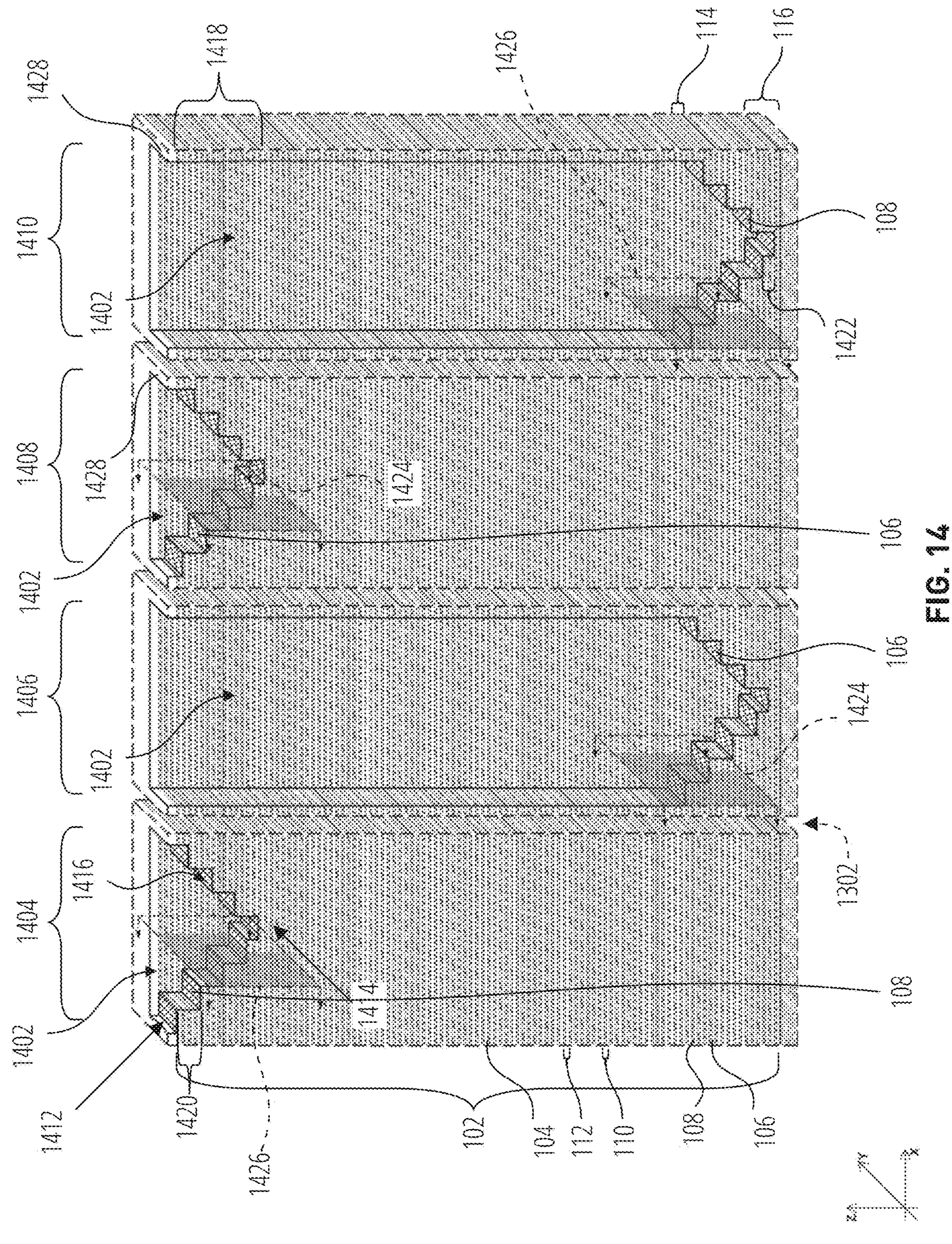

Referring to FIG. 14, one or more series of stadium openings 1402 may be formed (e.g., patterned, etched, and/or extended) within the precursor stack 102, extending to different depths in different areas of the precursor stack 102 (e.g., in a first stadium area 1404, a second stadium area 1406, a third stadium area 1408, and a fourth stadium area 1410). The stadium openings 1402 define, at their bases, staircases (e.g., a descending staircase 1412 and an ascending staircase 1414). In a single stadium opening 1402, steps 1416 are provided by exposed upper surface areas of either the second par-sac structures 108 (e.g., in the first stadium area 1404 and the fourth stadium area 1410) or the first par-sac structures 106 (e.g., in the second stadium area 1406 and the third stadium area 1408). Accordingly, the steps 1416 of some stadiums are provided by other-material (e.g., non-conductive) structures of a first par-sac material type, while the steps 1416 of others of the stadiums are provided by other-material (e.g., non-conductive) structures of a second par-sac material type.

The staircase profile defined by each stadium opening 1402 may be tailored so that the staircases (e.g., the descending staircase 1412 and the ascending staircase 1414) at the base of a single stadium opening 1402 define steps 1416 at each of the first par-sac structures 106 or the second par-sac structures 108 that are in the elevations 1418 to which the stadium opening 1402 extends. To accomplish this, each staircase (e.g., the descending staircase 1412 and the ascending staircase 1414) may define a riser height 1420 of twice the number of structures in the tier group 114, and the ascending staircase 1414 may be vertically offset from the descending staircase 1412 by a vertical offset 1422 of the number of structures in the tier group 114. Accordingly, in some embodiments in which the repeating unit of the precursor stack 102 is composed of four structures (e.g., two insulative structures 104, one first par-sac structure 106, and one second par-sac structure 108), the riser height 1420 may be equivalent to the height of eight structures (e.g., the height of two first par-sac structures 106, two second par-sac structures 108, and four insulative structures 104) and the offset 1422 may be equivalent to the height of four structures (e.g., the height of one first par-sac structure 106, one second par-sac structure 108, and two insulative structures 104).

To provide a step for each non-insulative level of the precursor stack 102 (e.g., for each first par-sac structure 106 and for each second par-sac structure 108), one stadium opening 1402 (e.g., in the third stadium area 1408) may define steps 1416 at the first par-sac structure 106 levels in a group of elevations 1418, and another stadium opening 1402 (e.g., in the first stadium area 1404) may define steps 1416 at the second par-sac structure 108 levels in the same group of elevations 1418. Accordingly, multiple pairs of stadium openings 1402 (and pairs of corresponding staircased stadiums) may be formed in the same series of stadium openings 1402 (e.g., and the same series of staircased stadiums) to provide steps 1416 at all of the other-material (e.g., non-conductive, non-insulative) levels within the precursor stack 102 that are to eventually be replaced with conductive structures.

Though FIG. 14 illustrates four stadium areas and four stadium openings 1402, the disclosure is not so limited. There may be one or more additional stadium openings 1402 (e.g., and additional staircased stadiums) disposed between the illustrated stadium areas (between the first stadium area 1404 and the second stadium area 1406, between the second stadium area 1406 and the third stadium area 1408, and/or between the third stadium area 1408 and the fourth stadium area 1410), such as in non-illustrated portions generally represented by intermediate regions 1302. Additionally or alternatively, one or more additional stadium openings 1402 (and staircased stadiums) may be disposed laterally adjacent to the first stadium area 1404 and/or the fourth stadium area 1410. Any such additional stadium openings 1402 (and staircased stadiums) may also be within the elevations of the precursor stack 102 as illustrated in FIG. 14 or within other elevations of the precursor stack 102 not illustrated in FIG. 14, such as in higher-still elevations of the precursor stack 102 or such as in lower-still elevations of the precursor stack 102, formed between the illustrated tier groups 114 and the base structure 116.

Though FIG. 14 illustrates relatively deeper stadium openings 1402 (and relatively lower staircased stadiums) in the second stadium area 1406 and the fourth stadium area 1410, laterally interspersed with relatively shallower stadium openings 1402 (and relatively higher staircased stadiums) in the first stadium area 1404 and the third stadium area 1408, the disclosure is not limited to this lateral arrangement of stadium openings 1402 (and staircased stadiums). In some embodiments, the lateral order (e.g., lateral arrangement) may be such that the stadium openings 1402 increase in depth (and the staircased stadiums decrease in elevation) with increasing lateral position, the stadium openings 1402 decrease in depth (and the staircased stadiums increase in elevation) with increasing lateral position, or otherwise vary in depth with lateral position.

In some embodiments, the staircase profile defined by each of the stadium openings 1402 (and provided by each of the staircased stadiums) may be the same (e.g., a same riser height 1420 and a same offset 1422, if any) though formed at different elevation groups in the precursor stack 102. In other embodiments, one or more of the stadium openings 1402 (and staircased stadiums) may define (or provide) a different staircase profile than others of the stadium openings 1402 (and staircased stadiums).

Hereinafter, in the descriptions of FIGS. 14 through 26C, each step 1416 with a tread provided by a first par-sac structure 106 is equally represented by illustrations corresponding to section plane 1424 of FIG. 14, and each step 1416 with a tread provided by a second par-sac structure 108 is equally represented by illustrations corresponding to section plane 1426 of FIG. 14. Accordingly, the Y-Z sectional view of FIG. 15A effectively illustrates any single step 1416 at the base of the stadium openings 1402 in the first stadium area 1404 and the fourth stadium area 1410 of FIG. 14, and the Y-Z sectional view of FIG. 15B effectively illustrates any single step 1416 at the base of the stadium openings 1402 in the second stadium area 1406 and the third stadium area 1408 of FIG. 14.

Figure 15A:
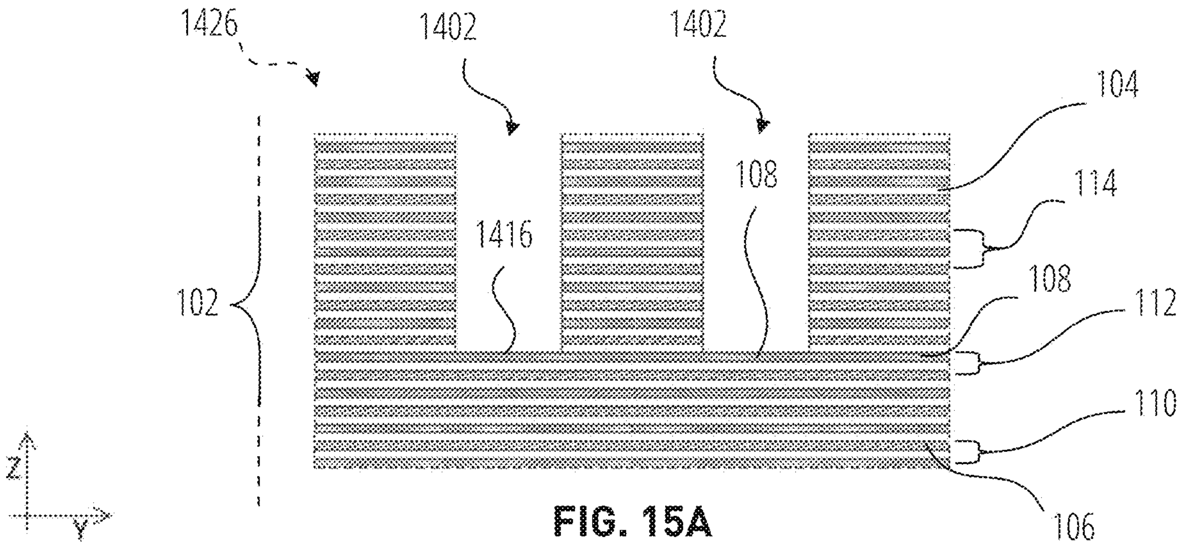
Figure 15B:
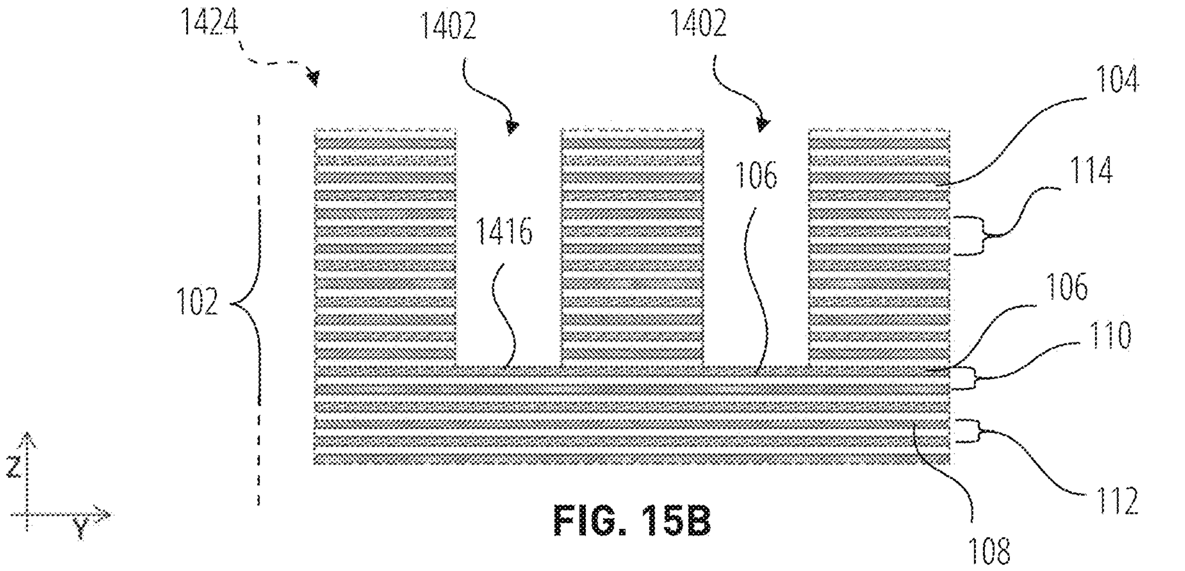
Figure 15C:
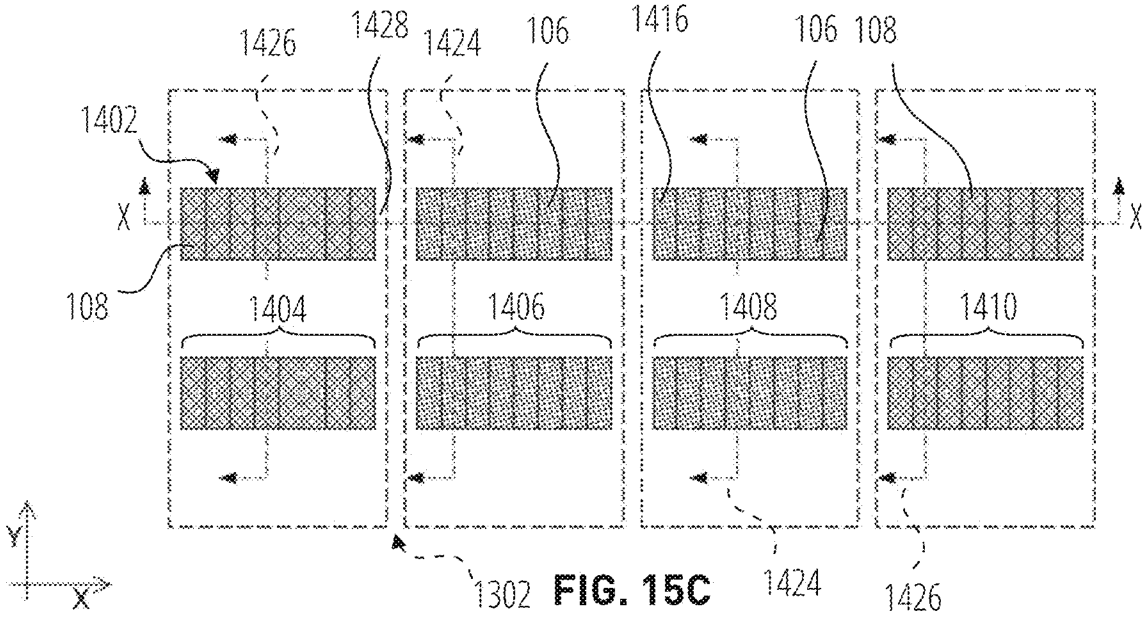

FIG. 15C is a top-plan view of the structure of FIG. 14, and the view of FIG. 14 corresponds to section line X-X of FIG. 15C. Accordingly, the view of FIG. 14 may illustrate a longitudinal half (e.g., length-wise half) of the series of stadium openings 1402 (and series of staircased stadiums). The other longitudinal half may be a mirror image of that which is illustrated in FIG. 14, symmetrical across the front cross-sectional surface illustrated in FIG. 14.

Referring to FIGS. 15A, 15B, and 15C, in some embodiments, stadium openings 1402 longitudinally neighboring one another (e.g., in the "Y"-axis direction) define steps 1416 at the same elevations of the precursor stack 102 as one another. Accordingly, some longitudinally neighboring stadium openings 1402 (e.g., in the first stadium areas 1404 and the fourth stadium areas 1410) define steps 1416 at second par-sac structures 108, and other longitudinally neighboring stadium openings 1402 (e.g., in the second stadium areas 1406 and the third stadium areas 1408) define steps 1416 at first par-sac structures 106.

Figure 16A:
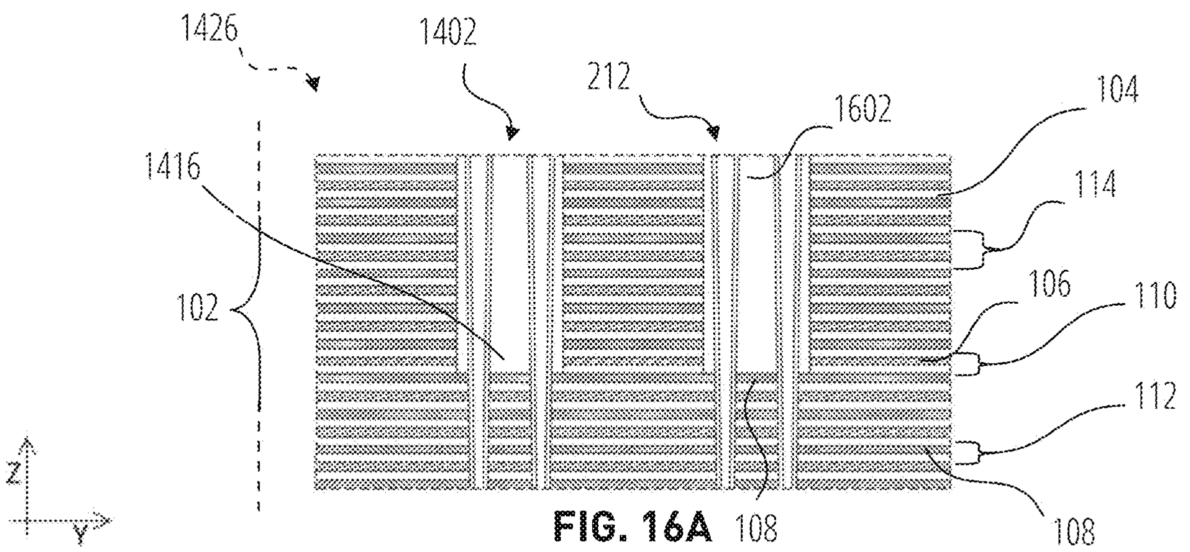
Figure 16B:
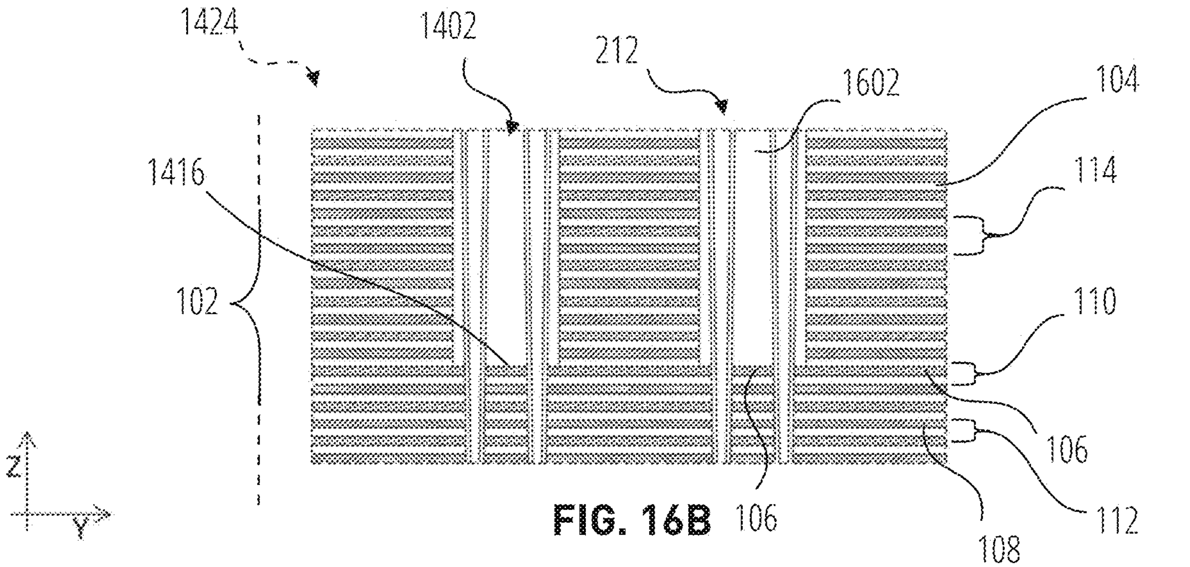
Figure 16C:
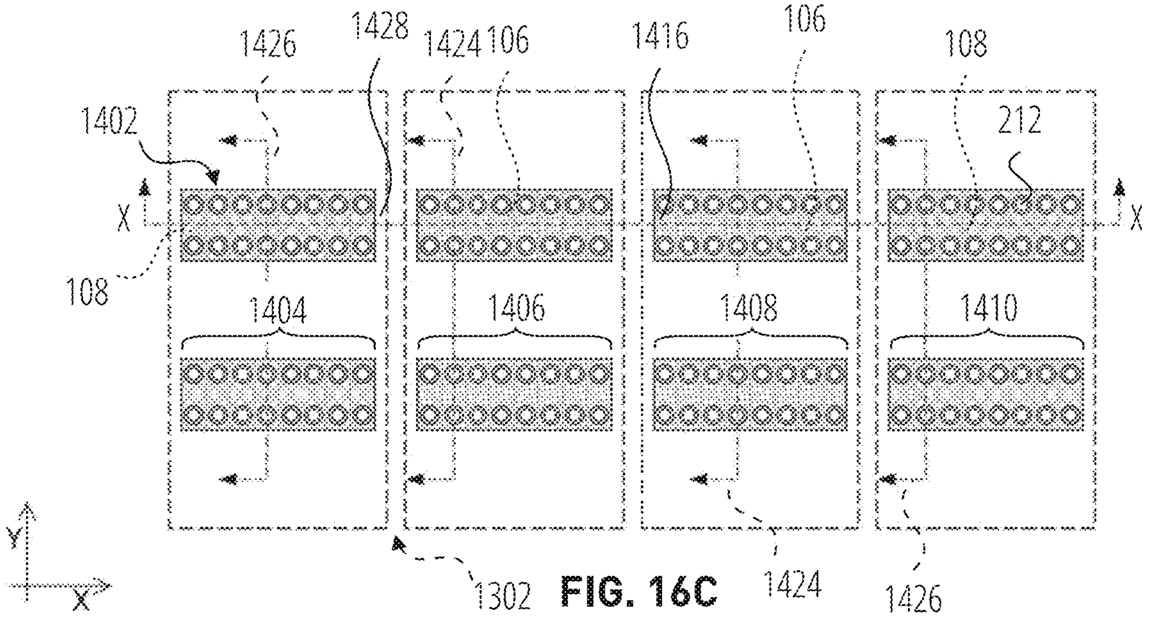

Referring to FIGS. 16A, 16B, and 16C, fill materials 1602 (e.g., non-conductive fill material, such as one or more insulative materials, which may be of the same or different composition as the material(s) of the insulative structures 104) may be formed (e.g., deposited) to substantially fill the stadium openings 1402. Openings may be formed (e.g., etched) through the fill material(s) 1602 and/or portions of the precursor stack 102, and the support structures 212 may be formed in the openings to provide structural support to the device structure.

In some embodiments, before, during, or after the stage(s) illustrated in FIGS. 16A through 16C, the stage(s) described above with regard to FIG. 2A may be performed in the pillar array regions 202 of the device, which pillar array regions 202 may be laterally adjacent the structures illustrated in FIGS. 16A through 16C.

Figure 17A:
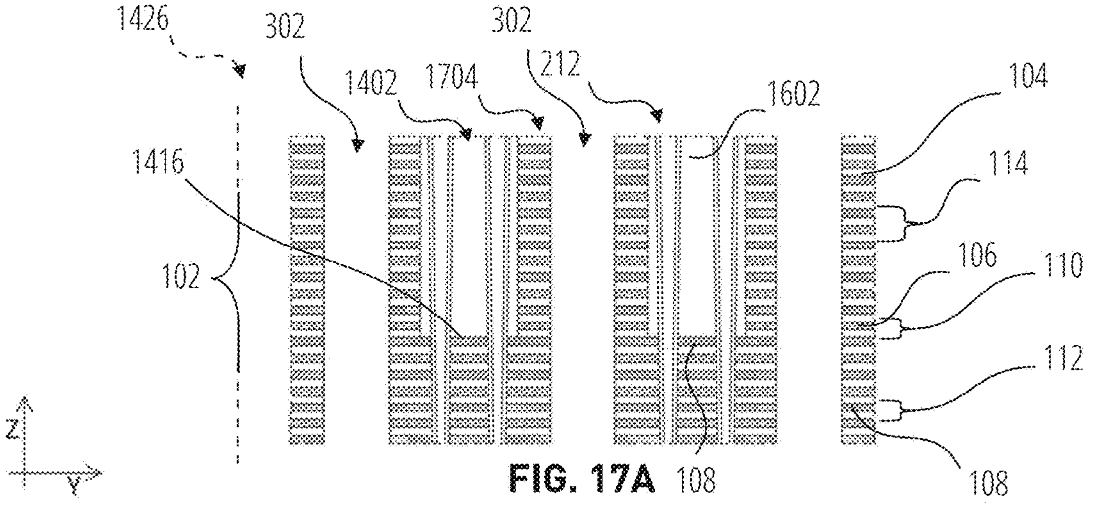
Figure 17B:
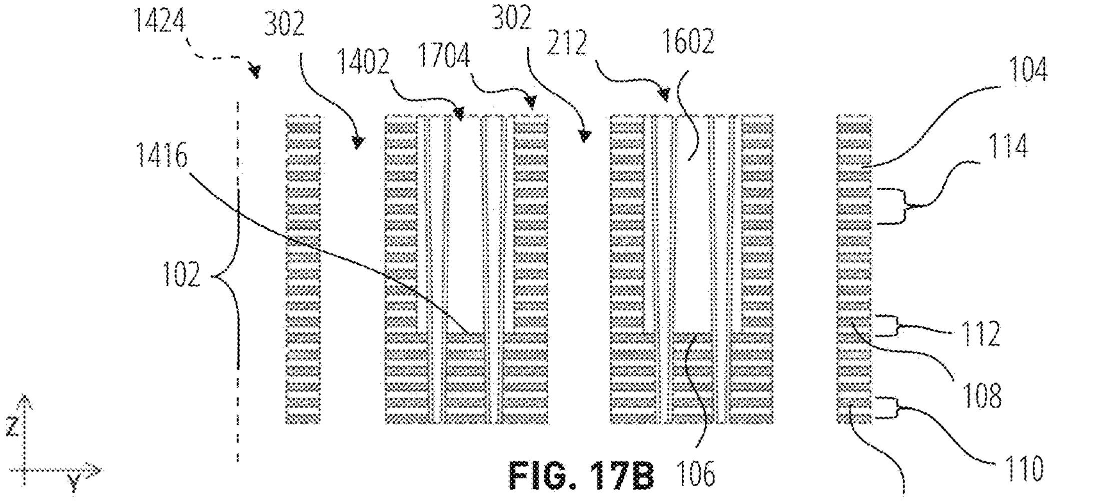
Figure 17C:
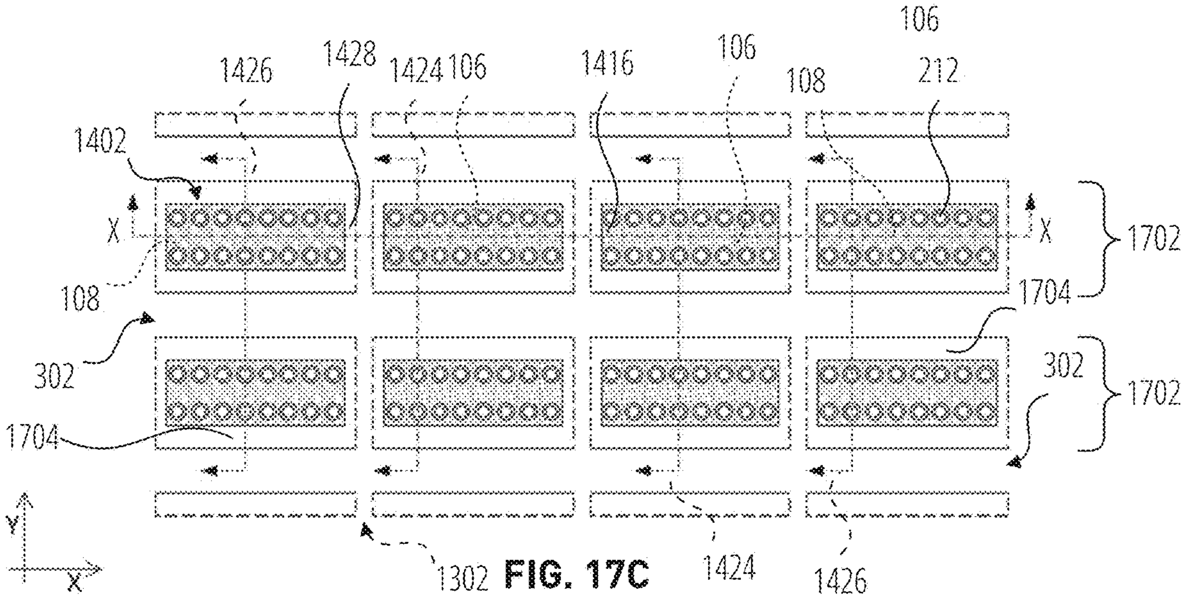

Referring to FIGS. 17A, 17B, and 17C, a series of the slit openings 302 may be formed (e.g., etched) through the precursor stack 102 in substantially the same manner described above with regard to FIGS. 3A and 3B. Forming the slit openings 302 divides longitudinally neighboring series of the stadium openings 1402 into separate blocks 1702.

Non-patterned portions of the precursor stack 102 may provide crests 1428 that horizontally (e.g., laterally) space one stadium opening 1402 (and staircased stadium) from its neighbor. Other non-patterned portions of the precursor stack 102 may provide bridges 1704 extending horizontally (e.g., laterally) along the width of the blocks 1702. In some embodiments, each block 1702 includes two bridges 1704, and each bridge 1704 borders a different one of the slit openings 302 that define the block 1702, as illustrated in FIG. 17C. The two bridges 1704 may be effectively connected to one another via the crests 1428. In other embodiments, each block 1702 includes two bridges 1704 that are isolated from each other.

Via the one or more bridges 1704, distal portions of a given par-sac structure (e.g., the first par-sac structure 106, the second par-sac structure 108)—and, therefore, eventually of the conductive structure 702 (e.g., FIG. 12B) that will be formed in replacement of the par-sac structure—are part of a continuous, single structure. Therefore, once replaced by one of the conductive structures 702 (e.g., FIG. 12B), an electrical connection to the step(s) 1416 of a respective conductive structure 702 (e.g., FIG. 12B) may provide an electrical connection to the whole of that conductive structure 702 (e.g., FIG. 12B) throughout the block 1702.

In some embodiments, concurrent with performing the stage(s) illustrated in FIGS. 17A through 17C, the stage(s) described above with regard to FIG. 3A may be performed in the pillar array regions 202 of the device.

Figure 18A:
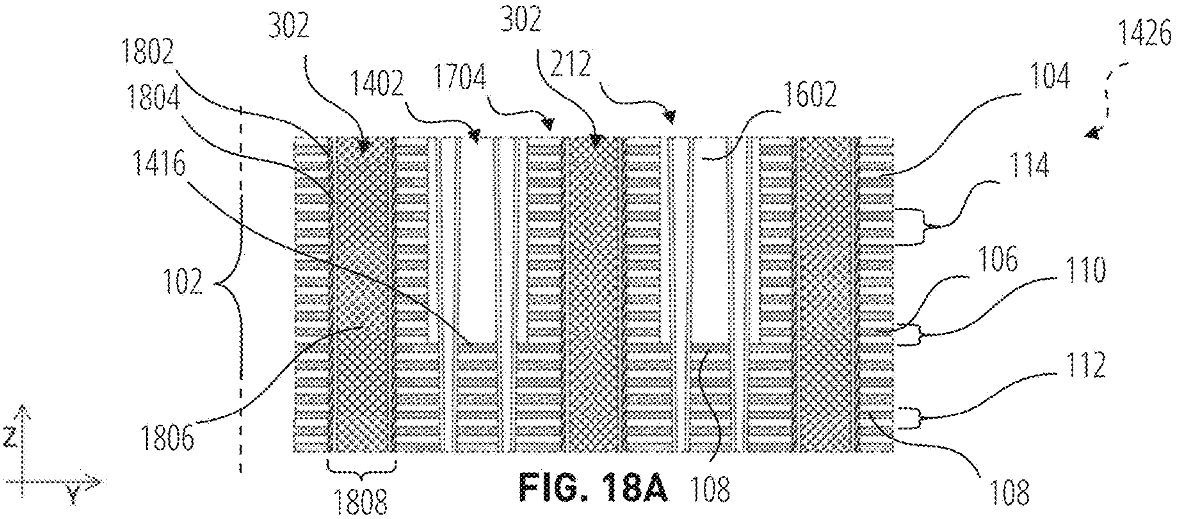
Figure 18B:
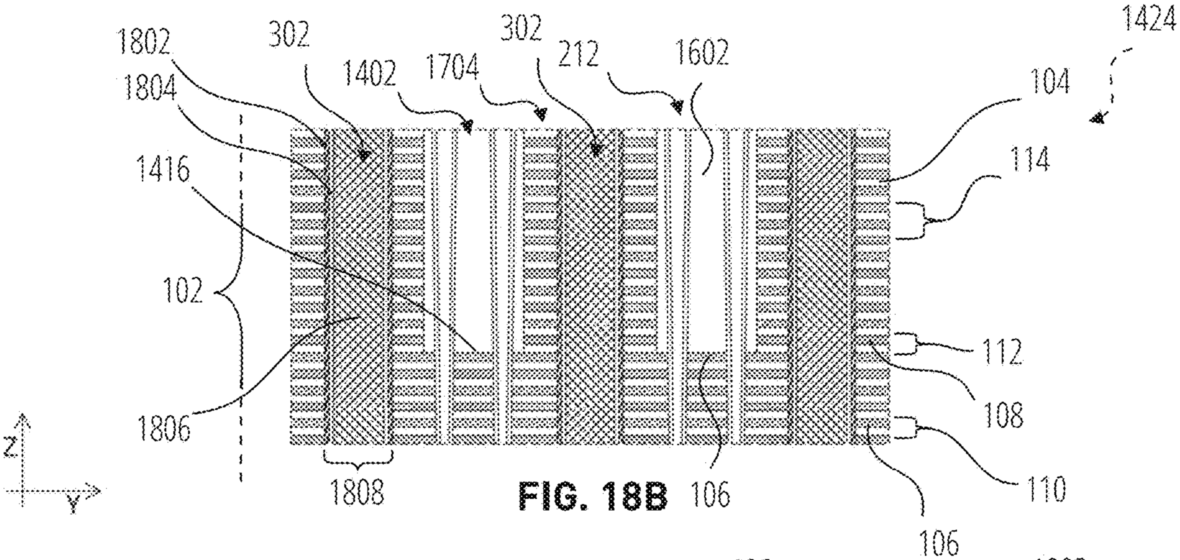
Figure 18C:
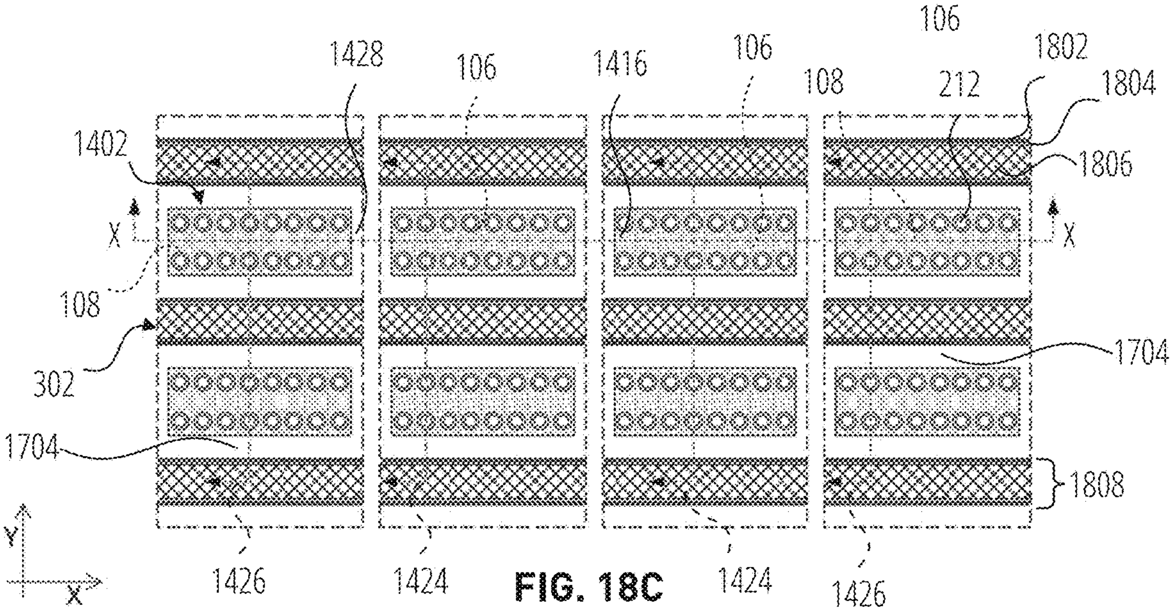

Referring to FIGS. 18A, 18B, and 18C, sacrificial liners of different compositions are formed in the slit openings 302 (e.g., along a whole of each slit opening 302). In some embodiments, a nitride liner 1802 and an oxide liner 1804 are formed (e.g., conformally formed, deposited), in sequence.

Sacrificial fill material(s) 1806 may be formed (e.g., deposited) on the sacrificial liners (e.g., directly on the oxide liner 1804) to at least cover the oxide liner 1804 and, in some embodiments, to fill or partially-fill the slit openings 302, forming sacrificial slit structures 1808. The sacrificial fill material(s) 1806 may be selected or otherwise formulated so as to be selectively removable (e.g., etchable) relative to the oxide liner 1804.

In some embodiments, for example, the nitride liner 1802 is formed of and includes silicon nitride, the oxide liner 1804 is formed of and includes silicon oxide, and the sacrificial fill material(s) 1806 is formed of and includes silicon (e.g., polycrystalline silicon).

Figure 19A:
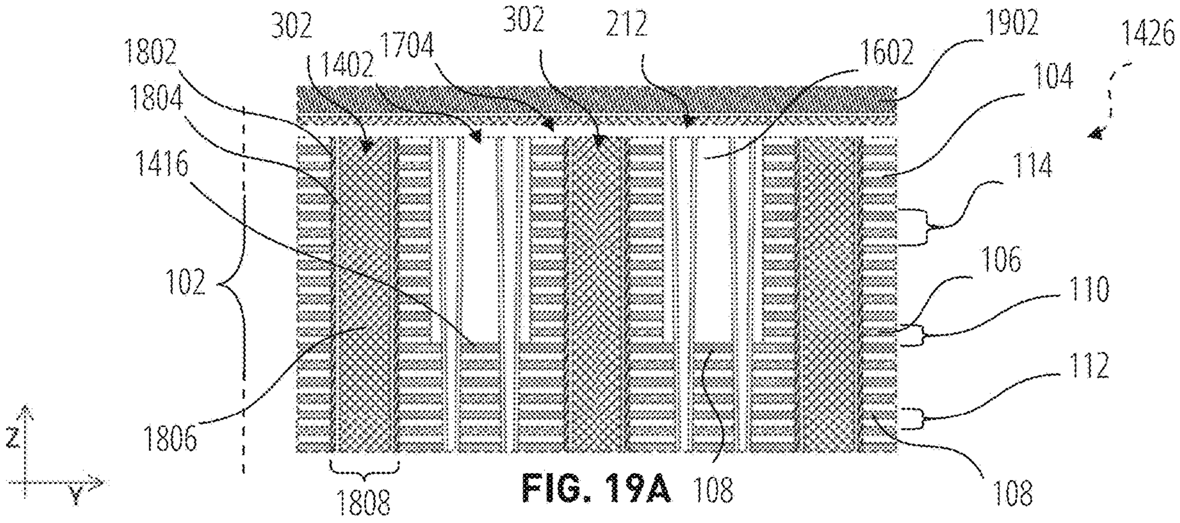
Figure 19B:
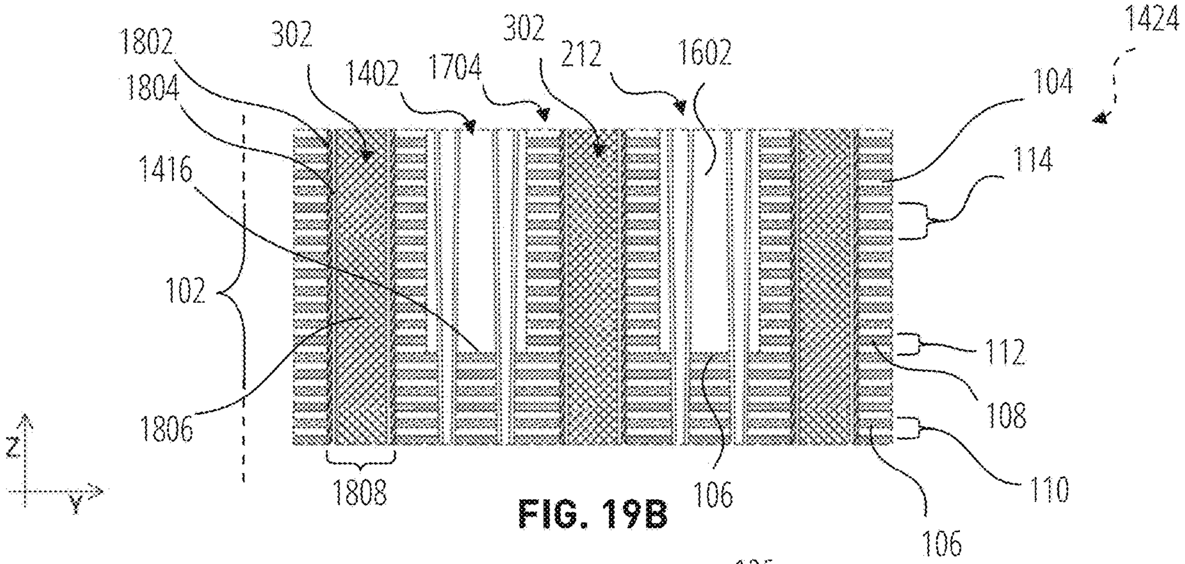
Figure 19C:
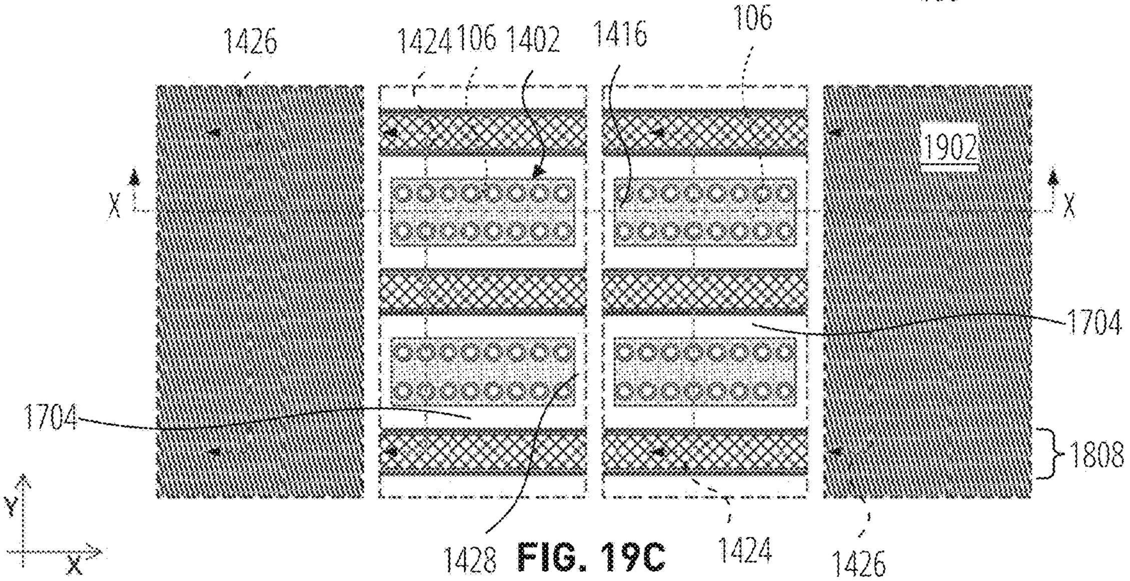

Referring to FIGS. 19A, 19B, and 19C, the stadium areas with steps 1416 defined by one of the par-sac structure types (e.g., the second par-sac structures 108) and the longitudinally adjacent portions of the sacrificial slit structures 1808 may be covered by one or more mask (e.g., hardmask) and/or resist 1902 materials, as illustrated in FIGS. 19A and 19C. The stadium areas with the steps 1416 defined by the other of the par-sac structure types (e.g., the first par-sac structures 106) and the longitudinally adjacent portions of the sacrificial slit structures 1808 may be left exposed, or the mask and/or resist 1902 materials may be patterned to expose those areas, as illustrated in FIGS. 19B and 19C.

Figure 20A:
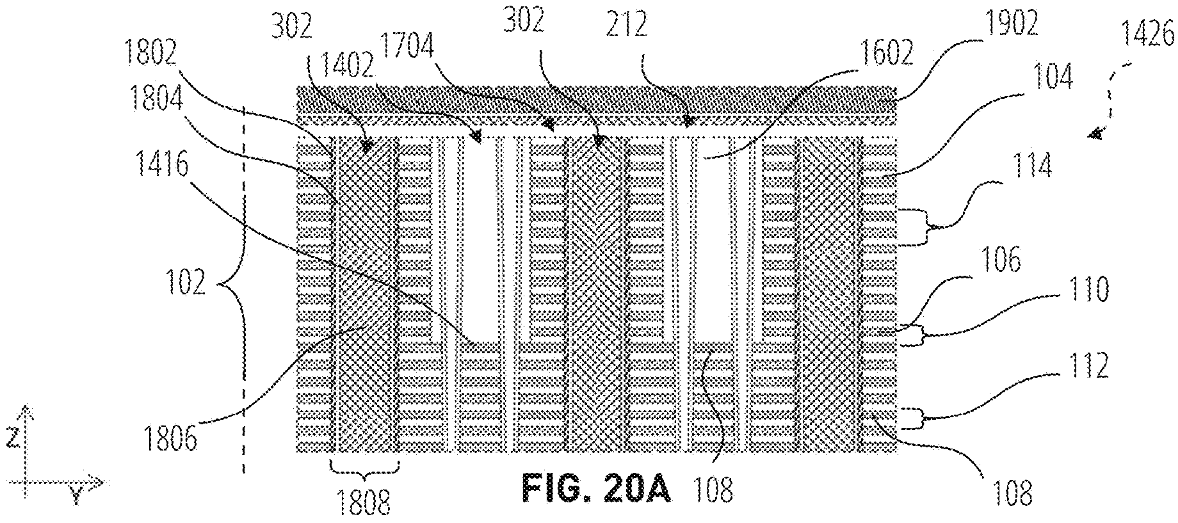
Figure 20B:
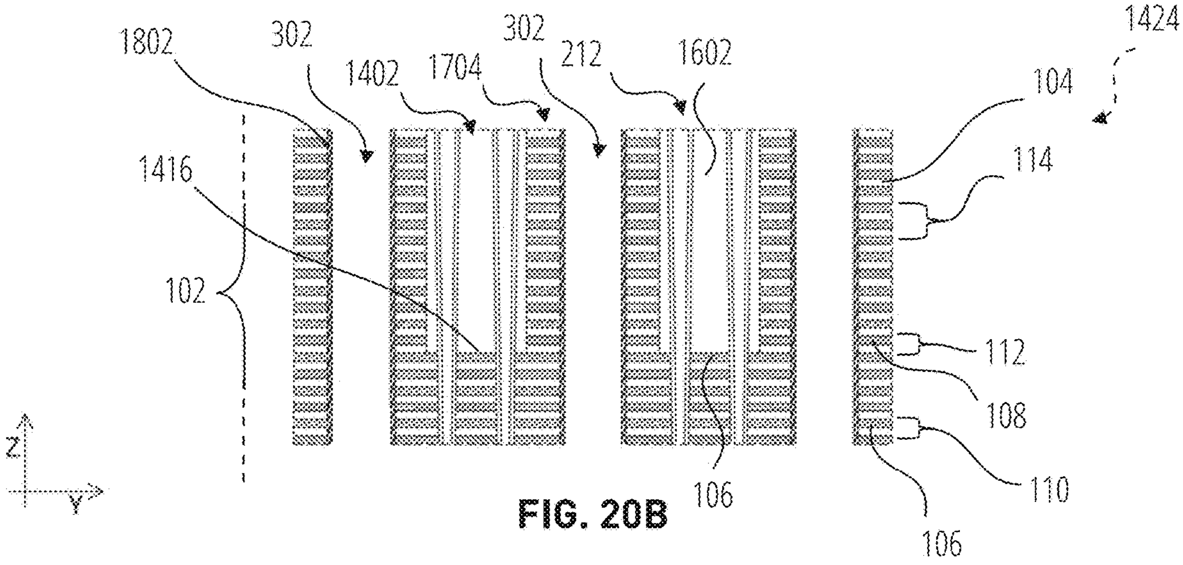
Figure 20C:
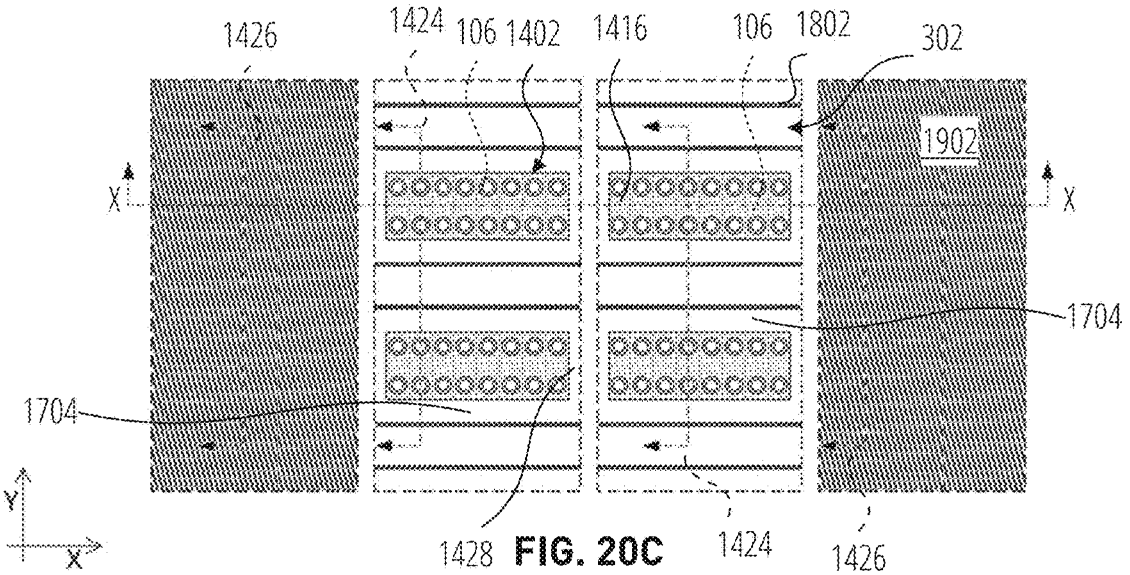

Referring to FIGS. 20A, 20B, and 20C, the sacrificial fill material(s) 1806 and the oxide liner 1804 may be removed (e.g., etched) in one or more stages—without removing the nitride liner 1802—in the exposed areas (e.g., not covered by the hardmask and/or resist 1902 materials), as illustrated in FIGS. 20B and 20C. Methods for selectively removing silicon (e.g., of the sacrificial fill material(s) 1806) and oxide (e.g., of the oxide liner 1804) materials without substantially removing nitride material (e.g., of the nitride liner 1802) are known in the art and so are not described herein.

Removing the sacrificial fill material(s) 1806 and the oxide liner 1804 in the exposed areas leaves only the nitride liner 1802 in the slit openings 302 while, in the covered areas, the nitride liner 1802 remains covered by the oxide liner 1804 and the sacrificial fill material(s) 1806, as illustrated in FIG. 20A.

Figure 21A:
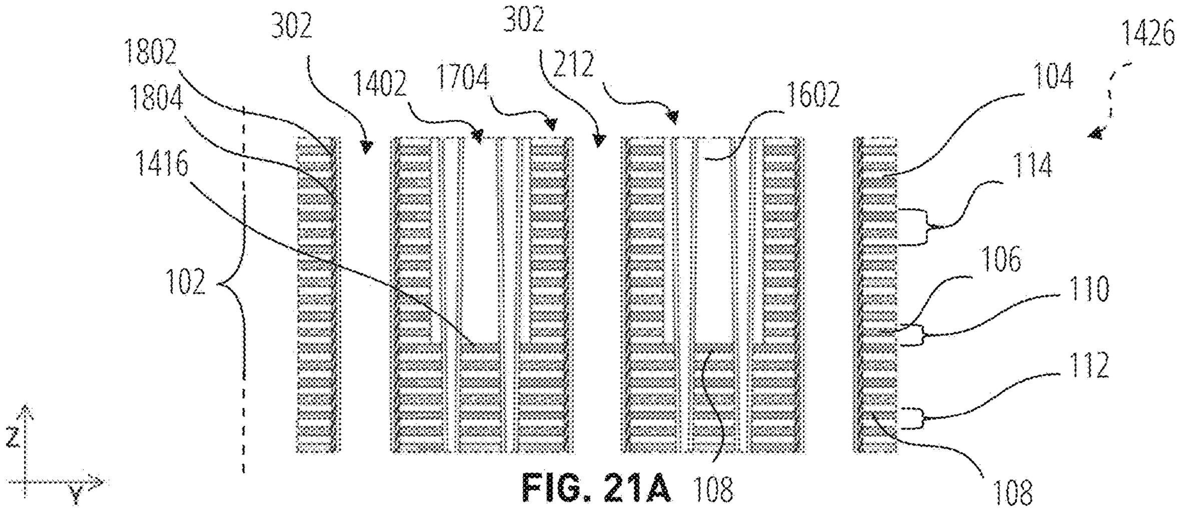
Figure 21B:
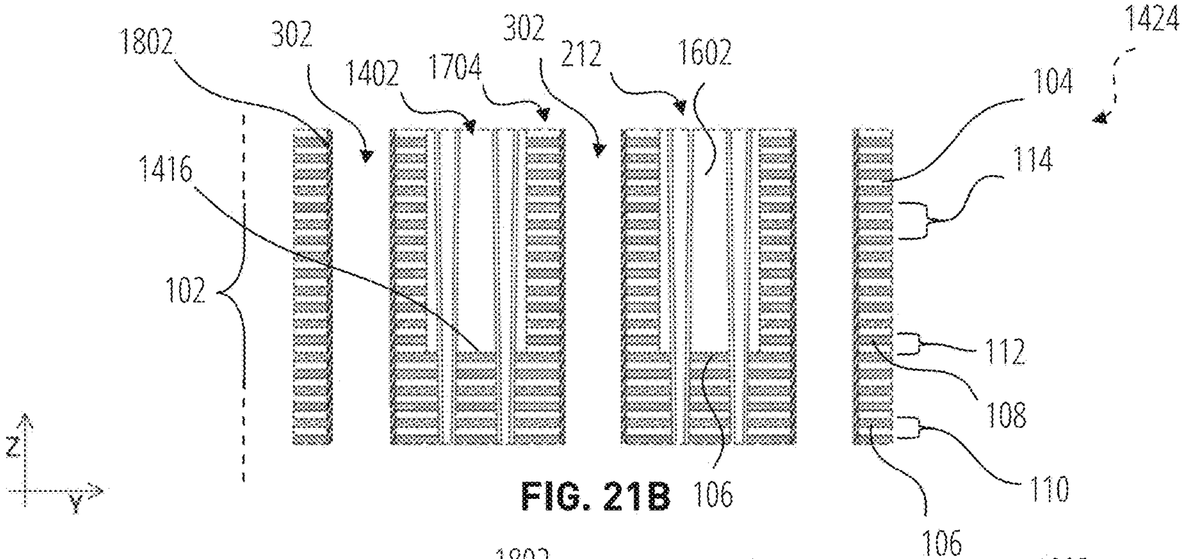
Figure 21C:
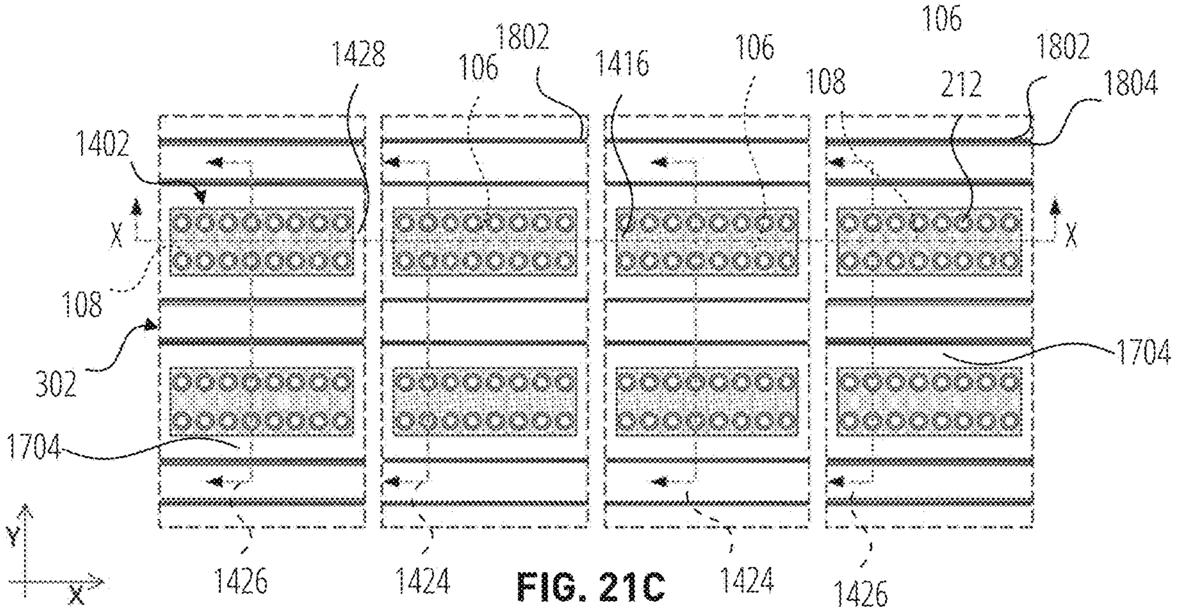

The remaining portions of the resist 1902 and/or hardmask materials may then be removed, and the sacrificial fill material(s) 1806 of the sacrificial slit structures 1808 may also be removed. As a result, both the nitride liner 1802 and the oxide liner 1804 remain in the portions of the slit openings 302 longitudinally adjacent the stadium openings 1402 defining steps 1416 at the second par-sac structures 108, as illustrated in FIGS. 21A and 21C, while only the nitride liner 1802 remains in the portions of the slit openings 302 longitudinally adjacent the stadium openings 1402 defining steps 1416 at the first par-sac structures 106, as illustrated in FIGS. 21B and 21C.

Figure 22A:
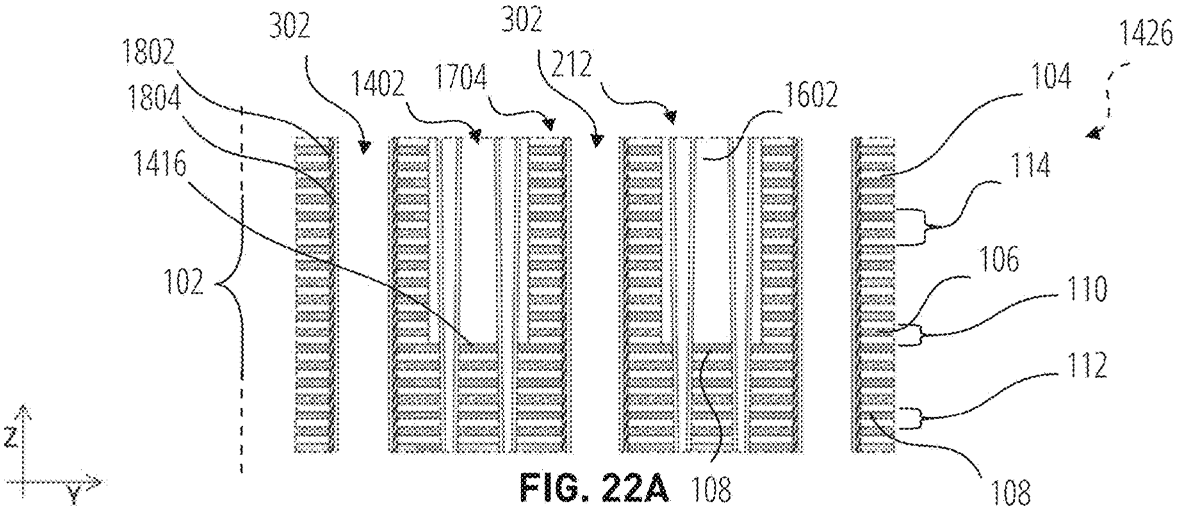

A nitride-removal process may be performed to remove the nitride liner 1802 where exposed (e.g., where the nitride liner 1802 is not covered by the oxide liner 1804). Accordingly, as illustrated in FIGS. 22A and 22C, the nitride liner 1802 remains in those portions of the slit openings 302 that are longitudinally adjacent the stadium openings 1402 with steps 1416 at the second par-sac structures 108. Concurrently, and as illustrated in FIGS. 22B and 22C, the nitride liner 1802 is removed in those portions of the slit openings 302 that are longitudinally adjacent the stadium openings 1402 with steps 1416 at the first par-sac structures 106.

Removing the nitride liner 1802 in the selected areas of the slit openings 302 exposes the first par-sac structures 106, the second par-sac structures 108, and the insulative structures 104 in the slit openings 302 in only those selected areas. As illustrated in FIG. 22B, the first par-sac structures 106 may be removed (e.g., exhumed) in those select areas without exhuming the second par-sac structures 108 in those select areas, in substantially the same manner described above with regard to FIGS. 4A through 6B.

Figure 22B:
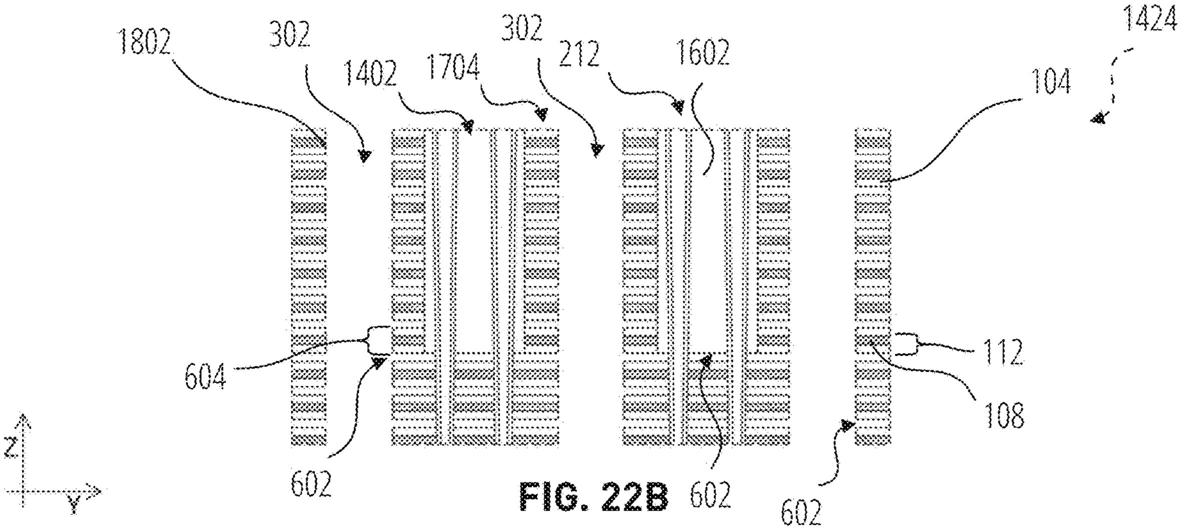
Figure 22C:
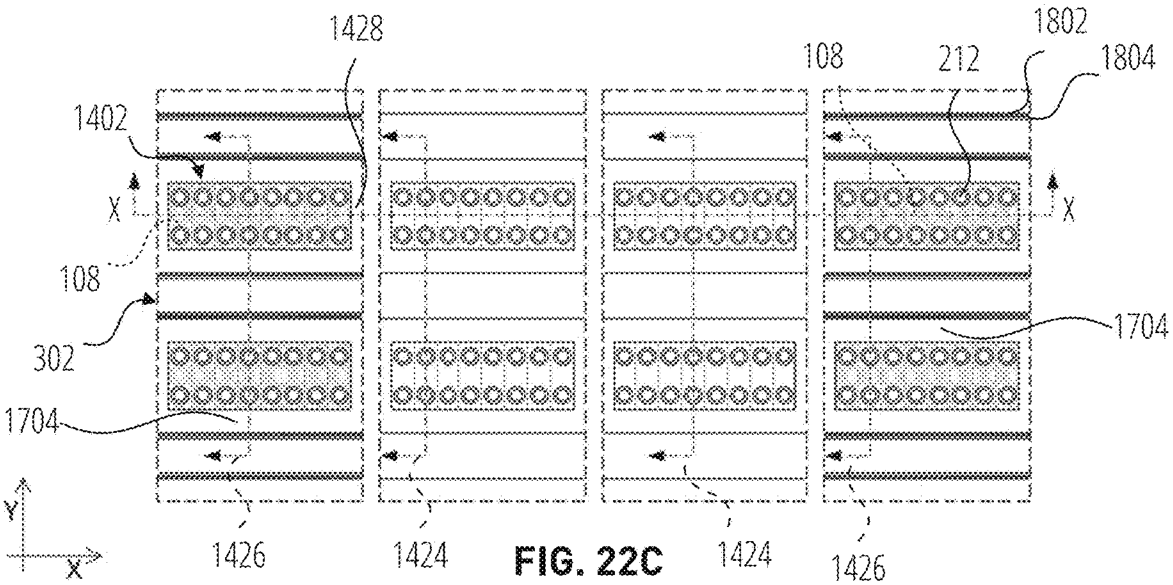

In some embodiments, concurrent with performing the stage(s) illustrated in FIGS. 22A through 22C, the stage(s) described above with regard to FIGS. 4A, 5A, and 6A may be performed in the pillar array regions 202 of the device.

Figure 23A:
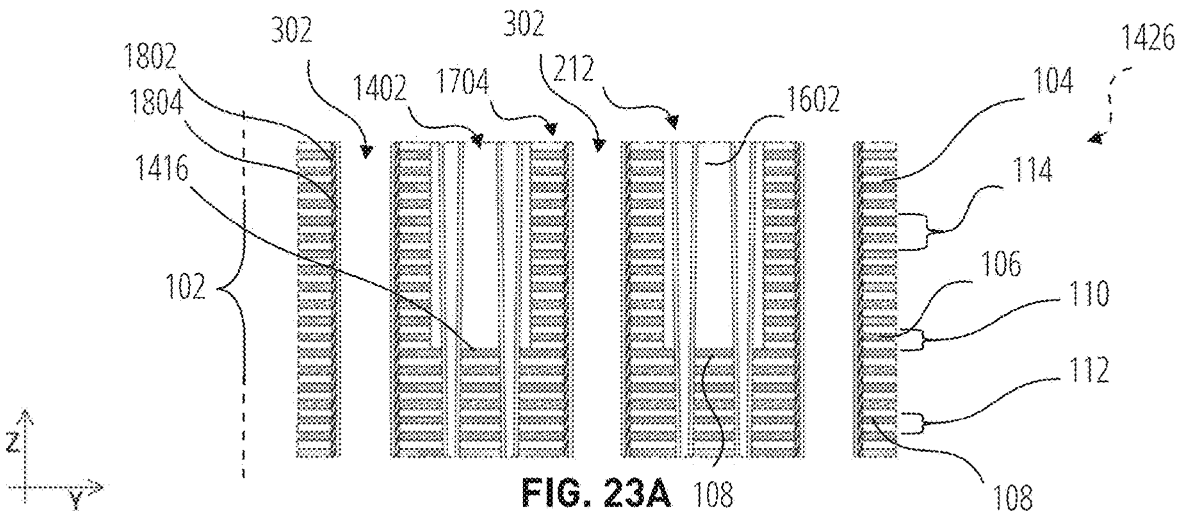
Figure 23B:
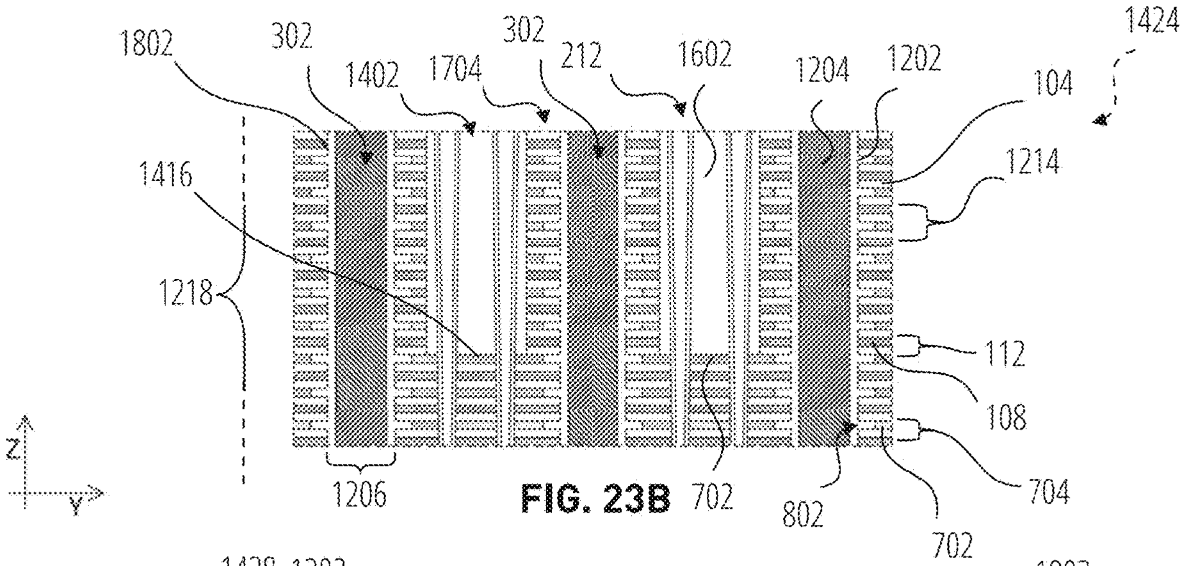
Figure 23C:
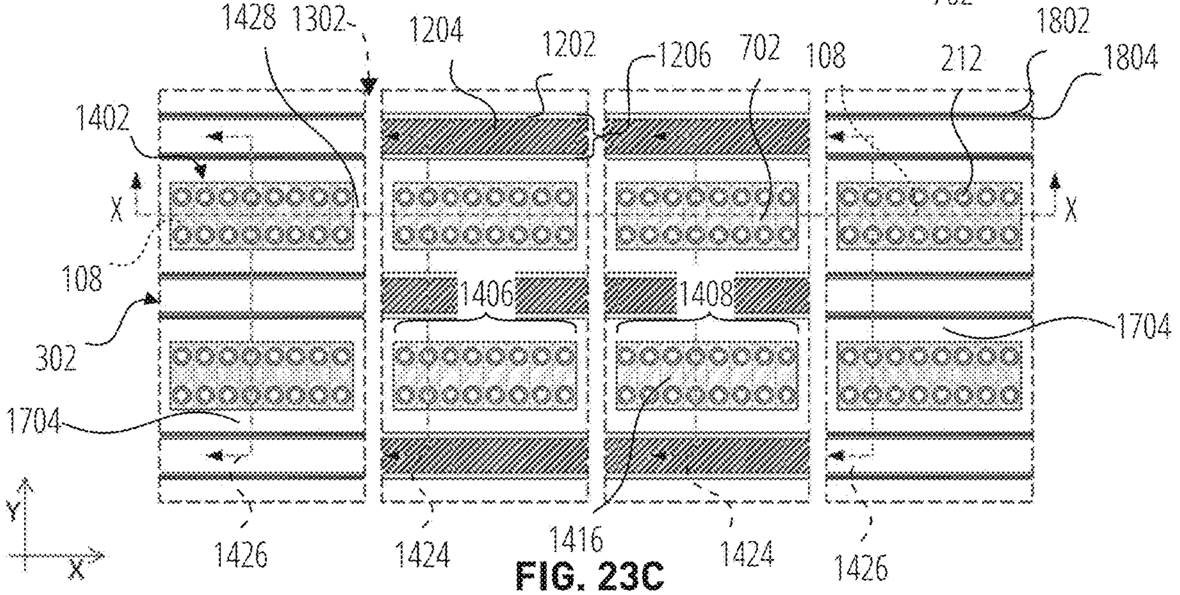

Referring to FIGS. 23A, 23B, and 23C, the conductive structures 702 may be formed in the voids 602 (FIG. 22B) at the levels previously occupied by the first par-sac structures 106, in those areas at which the first par-sac structures 106 were exhumed, in substantially the same manner described above with regard to FIGS. 7A through 8B. Thus, in only select areas, the precursor stack 102 (FIG. 14) is effectively converted into the second partially-conductive stack 1218 described above with regard to FIG. 12D. Accordingly, the stadium openings 1402 in the select, second stadium area 1406 and third stadium area 1408 now extend in regions (e.g., additional regions 1216 (FIG. 12D)) having the second partially-conductive stack 1218 structure with the repeating tier group 1214 of one conductive structure 702, one second par-sac structure 108, and a pair of the insulative structures 104. Accordingly, the stadium openings 1402 in these areas then include steps 1416 wholly provided by surfaces of the conductive structures 702 of the second partially-conductive stack 1218, as illustrated in FIG. 23B.

The insulative liner 1202 and the nonconductive material 1204 may be formed (e.g., deposited) in the areas of the slit openings 302 longitudinally adjacent the second partially-conductive stack 1218 regions to form the slit structures 1206 longitudinally adjacent the stadium openings 1402 that are above staircased stadiums with steps 1416 at the conductive structures 702, as illustrated in FIGS. 23B and 23C.

In some embodiments, the materials of the slit structures 1206 are formed only in the areas of the slit openings 302 that are longitudinally adjacent the second partially-conductive stack 1218 portions, leaving the other areas of the slit openings 302 with the oxide liner 1804 exposed, as illustrated in FIG. 23A. Accordingly, the other areas of the slit openings 302 may be covered during formation of the slit structures 1206, and these other areas may be re-exposed.

Figure 10A:
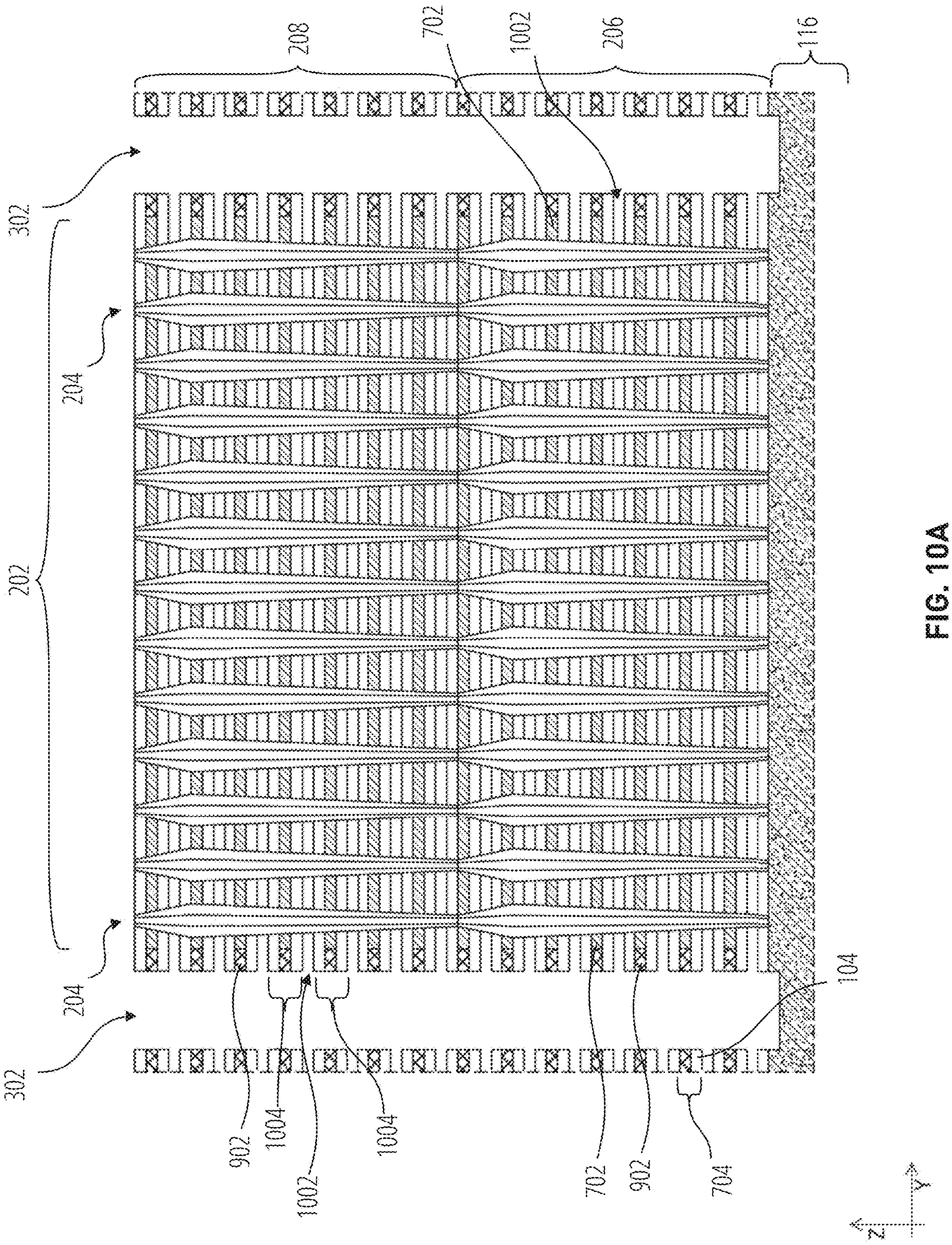
Figure 10B:
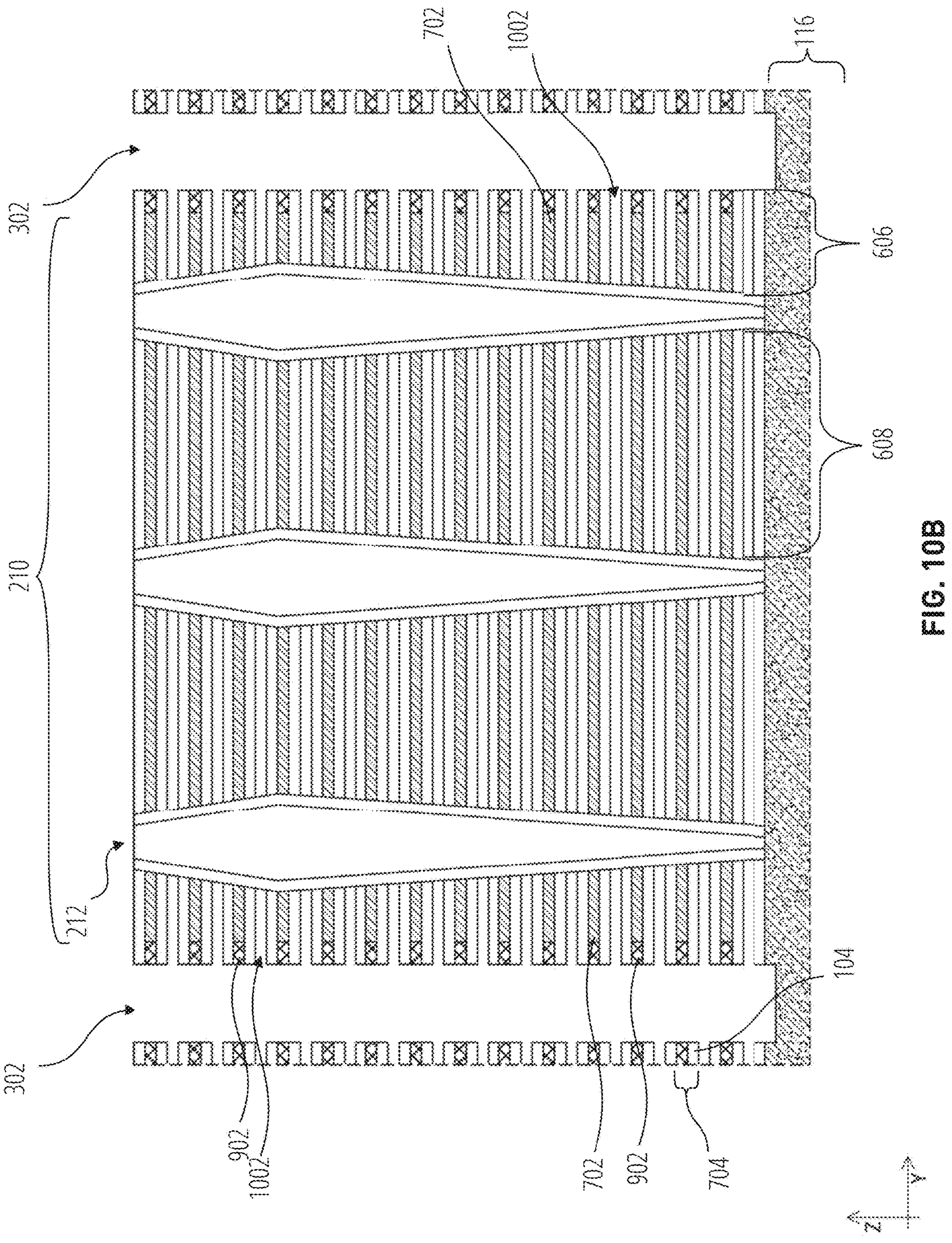
Figure 24A:
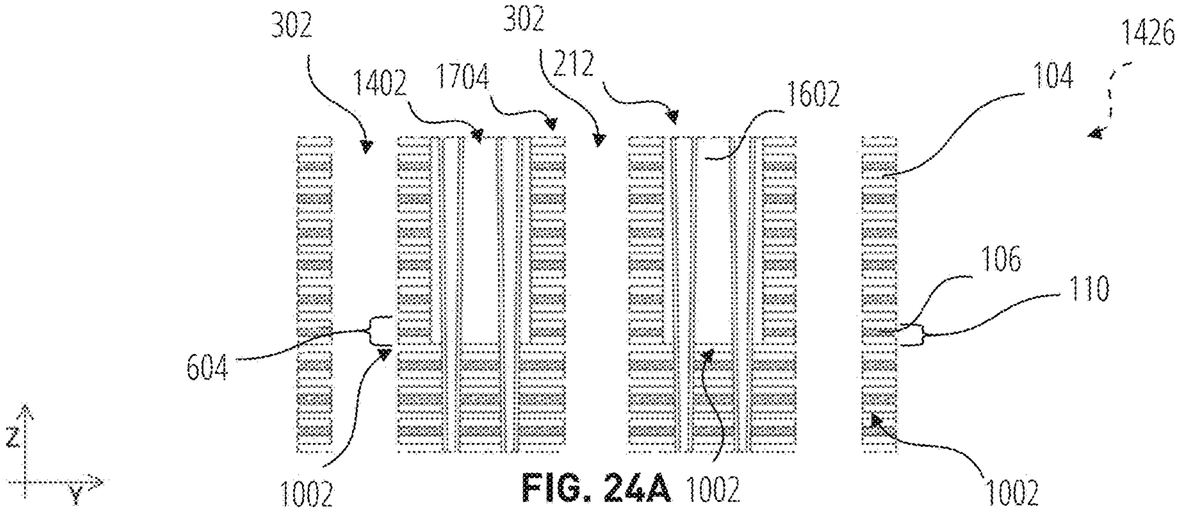
Figure 24B:
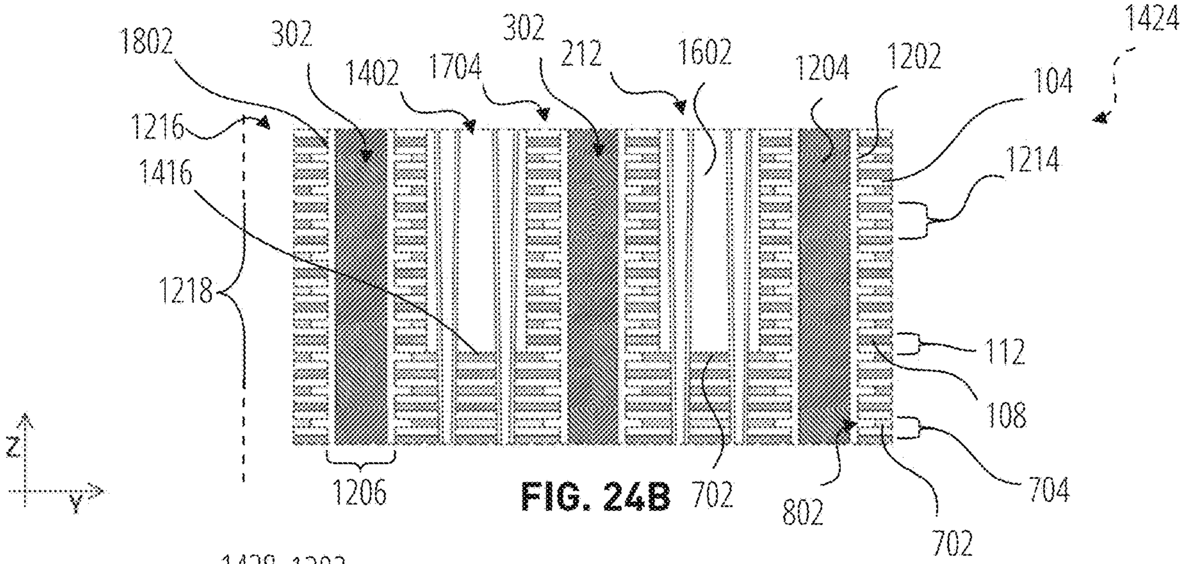
Figure 24C:
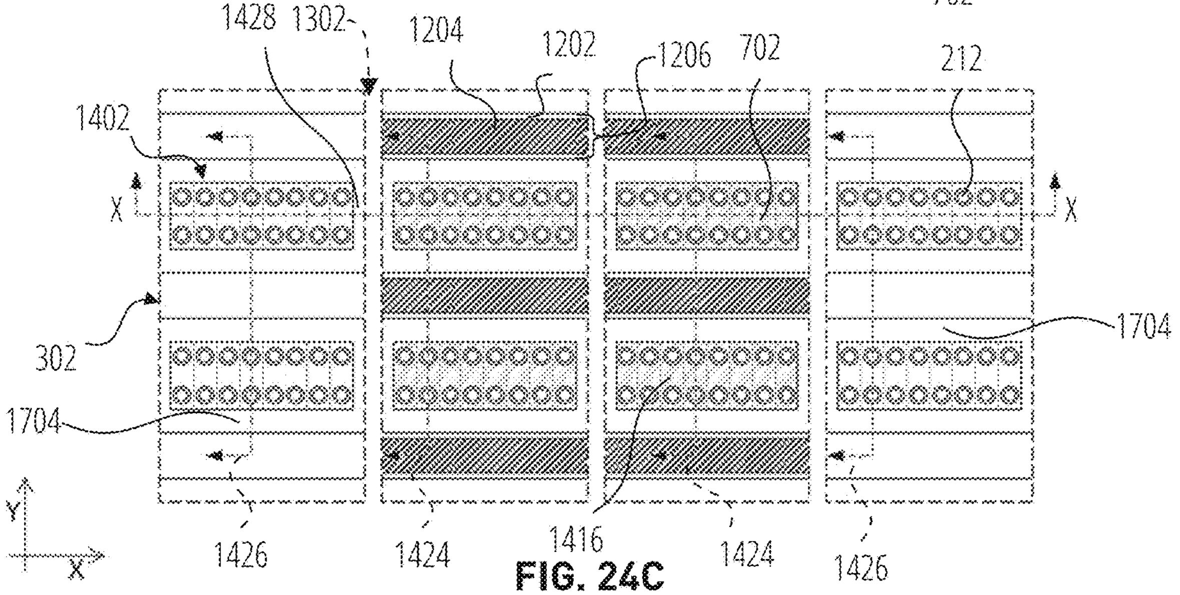

Referring to FIGS. 24A, 24B, and 24C, the remnant portions of the oxide liner 1804 and the nitride liner 1802 may be removed in one or more stages. Concurrently or subsequently, the second par-sac structures 108 may be removed (e.g., exhumed) from the regions that were still formed of the precursor stack 102 (FIG. 23A), in substantially the same manner described above with regard to FIGS. 10A and 10B. Thus, as illustrated in FIG. 24A, additional voids 1002 are formed between multi-structure groups 604. Because the slit structures 1206 occupy the slit openings 302 portions longitudinally adjacent the regions already converted to the second partially-conductive stack 1218, the second par-sac structures 108 in the second partially-conductive stack 1218 portions (FIG. 24B) remain unaffected by the removal of the second par-sac structures 108 from the other region(s) (FIG. 24A).

In some embodiments, concurrent with performing the stage(s) illustrated in FIGS. 24A through 24C, the stage(s) described above with regard to FIG. 10A may be performed in the pillar array regions 202 of the device.

Figure 25A:
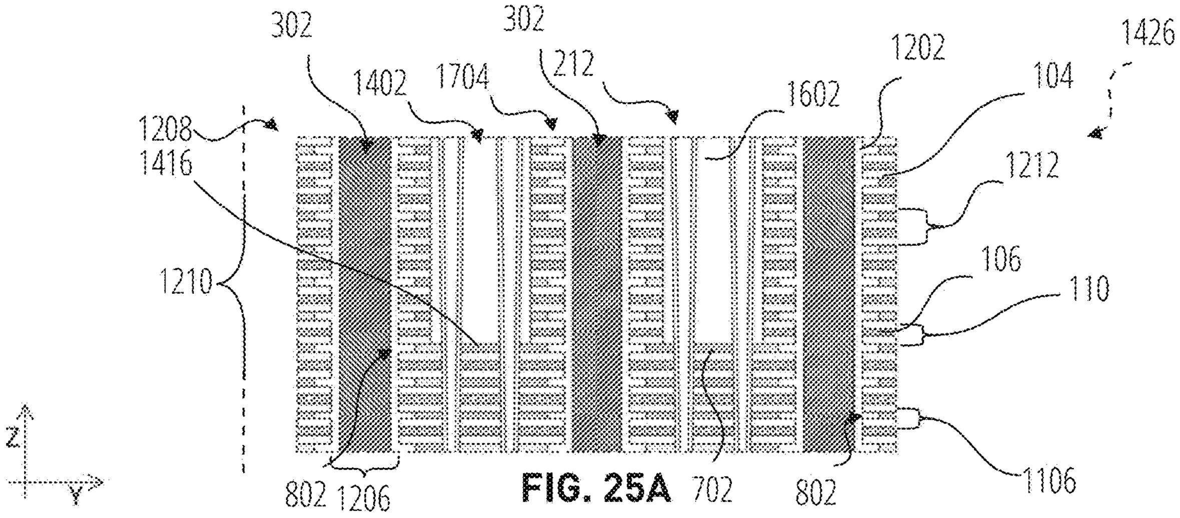
Figure 25B:
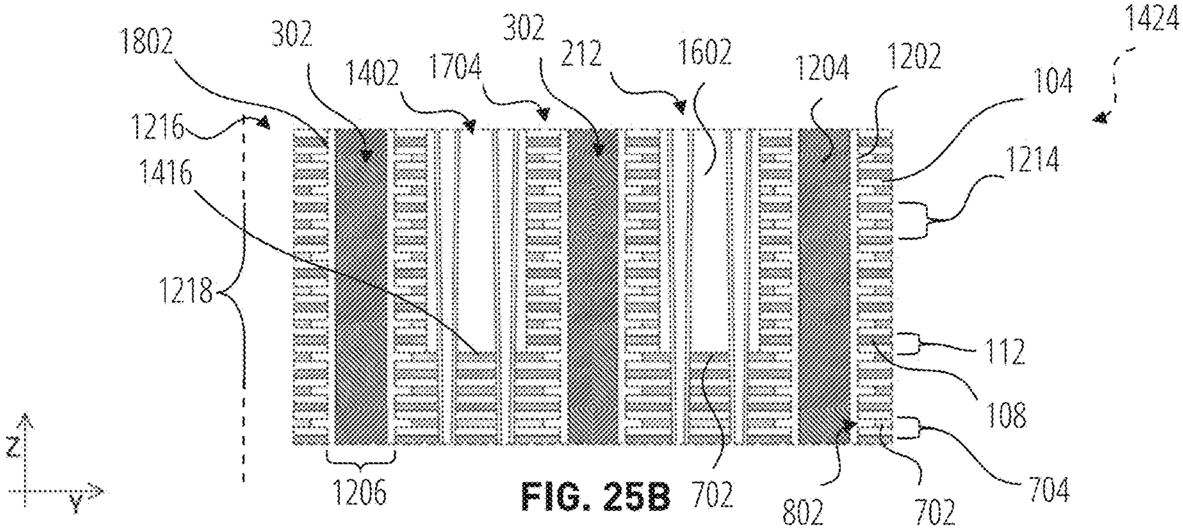
Figure 25C:
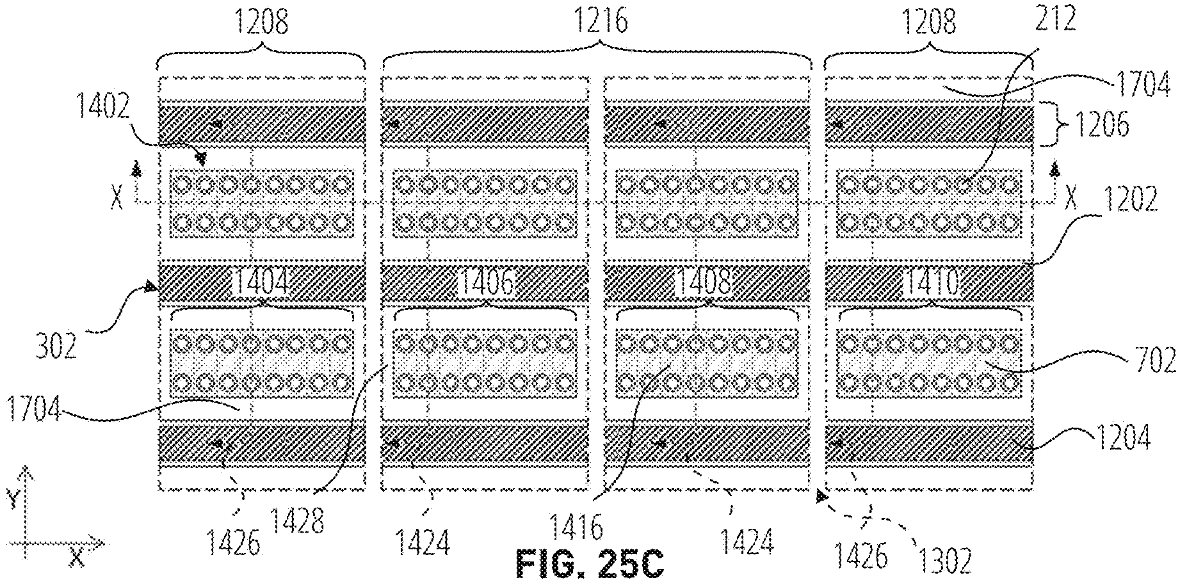

Referring to FIGS. 25A, 25B, and 25C, the conductive structures 702 may be formed in the additional voids 1002 (FIG. 24A), in the elevations and regions from which the second par-sac structures 108 were removed, to form regions (e.g., like the other region 1208 of FIG. 12C) with the structure of the first partially-conductive stack 1210 that includes, as the repeating tier group 1212, one of the conductive structures 702, one of the first par-sac structures 106, and a pair of the insulative structures 104. Accordingly, the steps 1416 at the base of the stadium openings 1402 in these regions are then provided by surfaces of the conductive structures 702 of the first partially-conductive stack 1210, as illustrated in FIG. 26A.

The insulative liners 1202 and nonconductive materials 1204 of the slit structures 1206 may be formed in the adjacent portions of the slit openings 302 to complete the formation of the slit structures 1206 throughout the width of the slit openings 302.

In some embodiments, concurrent with performing the stage(s) illustrated in FIGS. 25A through 25C, the stage(s) described above with regard to FIGS. 11A and 12A may be performed in the pillar array regions 202 of the device.

Figure 26A:
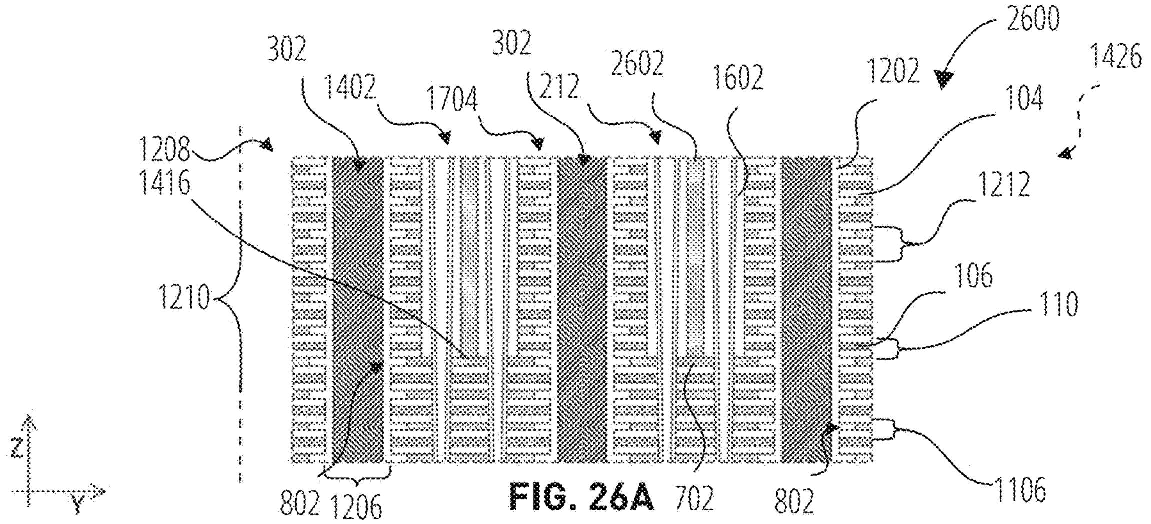
Figure 26B:
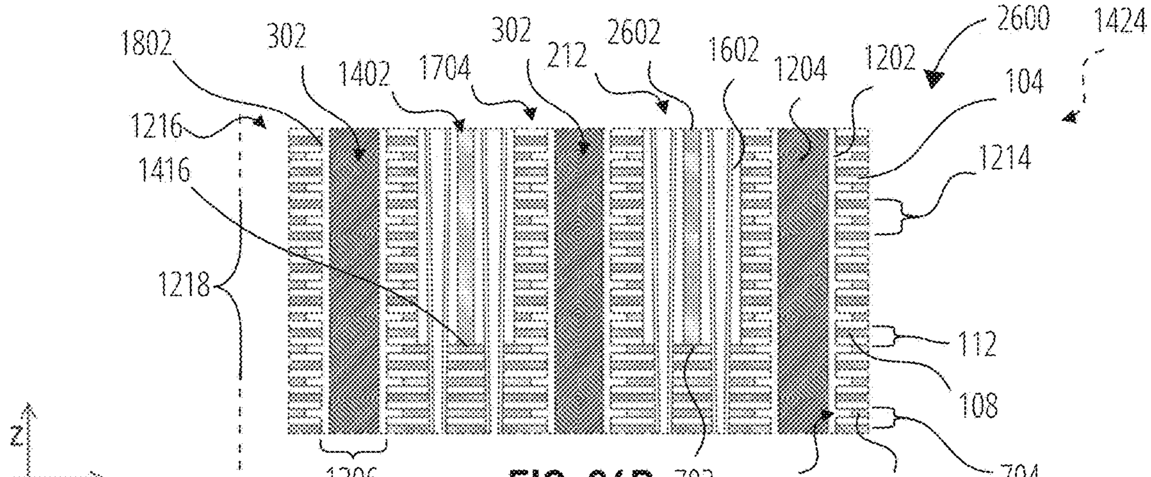
Figure 26C:
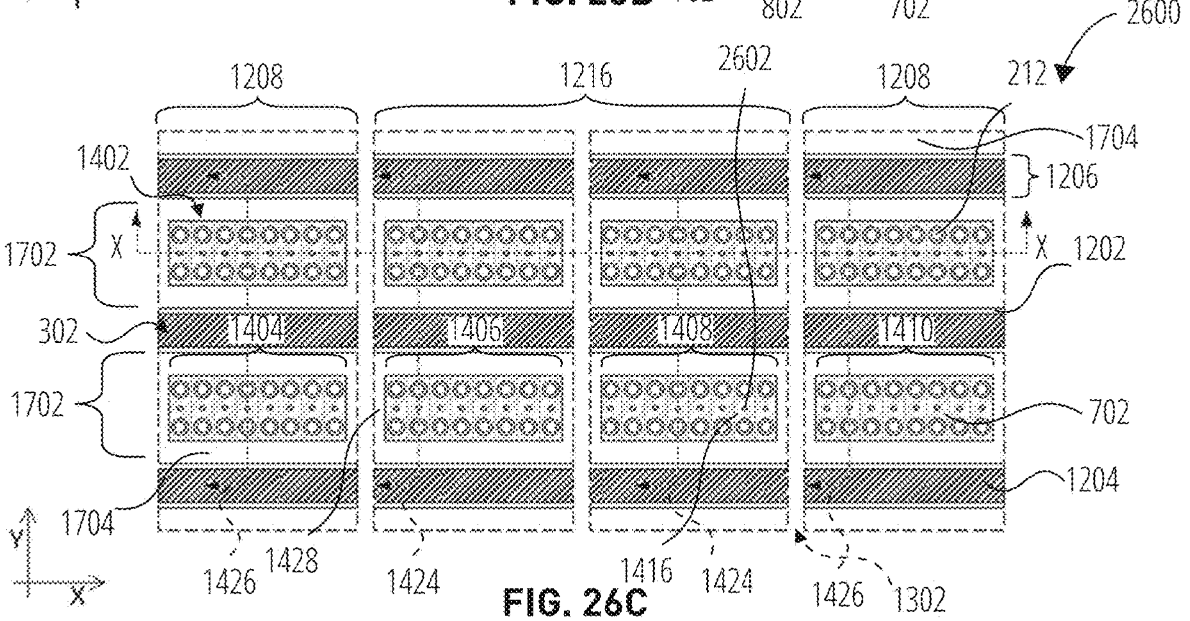

Referring to FIGS. 26A, 26B, and 26C, step contacts 2602 are formed through the fill material(s) 1602 of the stadium openings 1402 to land on the steps 1416 at the base of each respective stadium opening 1402. Each step contact 2602 (e.g., access line contact, word line contact) may be a conductive structure (e.g., optionally with an insulative liner) that extends to a respective one of the steps 1416. In the microelectronic device, the step contacts 2602 may function to provide electrical communication to one of the conductive structures 702 and other electrical components of the device.

Forming the step contacts 2602 may include forming openings of various high-aspect-ratios through the fill material(s) 1602 and then forming (e.g., depositing) conductive material(s) (or, in some embodiments, forming at least one insulative liner and then conductive material(s)) to form the step contacts 2602 that extend to different elevations of the stack (e.g., second partially-conductive stack 1218 or first partially-conductive stack 1210).

Accurately forming step contacts 2602 to a variety of depths (e.g., by forming openings of different high-aspect-ratios) tends to present challenges. Some contact openings may, however unintentionally, be "over-etched" and inadvertently extend through a targeted step 1416 tread. By forming the stack (e.g., first partially-conductive stack 1210, second partially-conductive stack 1218) so that the conductive structures 702 are at every fourth structure, there may be less risk of any single contact opening inadvertently over extending to expose the next-lowest conductive structure 702. Therefore, when forming conductive material(s) in the contact openings, the risk of any single step contact 2602 unintentionally "shorting" to a non-target conductive structure 702 is significantly lessened, relative to a stack with conductive structures at every other structural elevation.

Accordingly, a microelectronic device structure 2600 may include a series of stadium openings 1402 above stadiums with staircases (e.g., descending staircases 1412, ascending staircases 1414 (FIG. 14)) having steps 1416 provided by surfaces of conductive structures 702. At least some of the stadium openings 1402 extend into regions (e.g., other regions 1208 as in FIG. 12C) with the first partially-conductive stack 1210, having insulative structures 104 interleaved with alternating conductive structures 702 and first par-sac structures 106. At least some others of the stadium openings 1402 extend into regions (e.g., additional regions 1216 as in FIG. 12D) with the second partially-conductive stack 1218 having insulative structures 104 interleaved with alternating conductive structures 702 and second par-sac structures 108. The conductive structures 702 in the second partially-conductive stack 1218 are at different elevations than the conductive structures 702 in the first partially-conductive stack 1210. Conductive step contacts 2602 extend to the steps 1416.

While the microelectronic device structure 2600 of FIGS. 26A and 26B includes stadium openings 1402 within differently structured stacks (that is, each stadium opening 1402 is either in the first partially-conductive stack 1210 (FIG. 26A) or in the second partially-conductive stack 1218 (FIG. 26B)), in other embodiments, a single stadium opening may be partially within a stack of one structure type (e.g., within the first partially-conductive stack 1210) and partially within another stack of another structure type (e.g., within the second partially-conductive stack 1218).

For example, and referring to FIGS. 27 through 36B, illustrated are various stages of forming a microelectronic device with stadium openings that, in the final structure, are partially within one partially-conductive stack and partially within another partially-conductive stack. Step treads are provided, in a first portion, by conductive structures of one partially-conductive stack (e.g., the first partially-conductive stack 1210 (FIG. 12C)) and, in a second portion, by par-sac structures of another partially-conductive stack (e.g., the second partially-conductive stack 1218 (FIG. 12D)). Multiple step contacts extend to each such dual-portioned step, either landing on the conductive structure portion of the step tread or extending through the par-sac structure portion of the step tread to land on a lower conductive structure.

Figure 27:
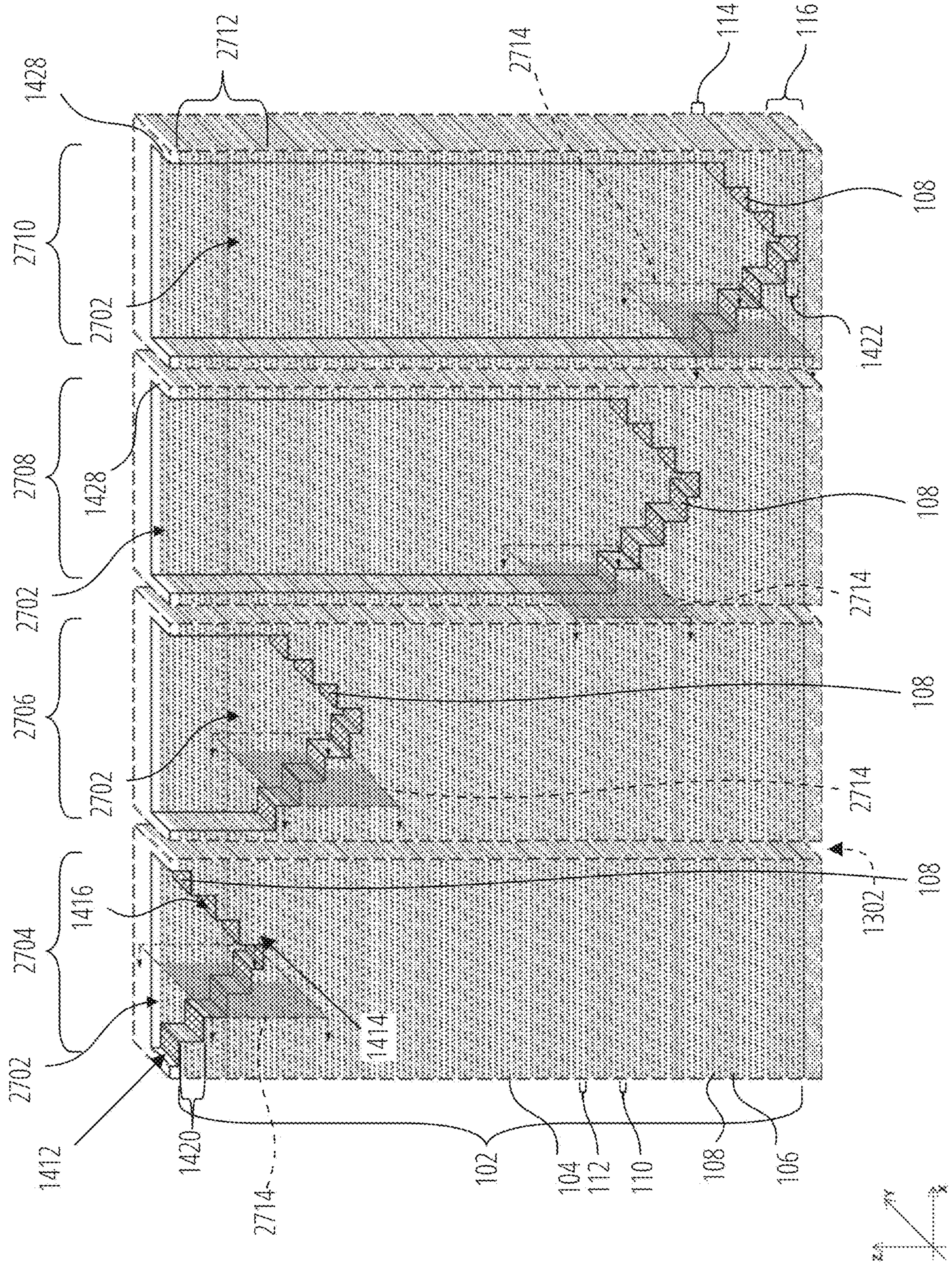

Referring to FIG. 27, which stage may follow the stage of FIG. 14 described above, a series of stadium openings 2702 is formed in the precursor stack 102 so as to define a series of staircased stadiums. The stadium openings 2702 (and staircased stadiums) may be formed in substantially the same way described above with regard to FIG. 14 except that each of the stadium openings 2702 may be structured and formed so that the steps 1416 of the stadiums in a single series are provided by surfaces of a same type of par-sac structure. For example, each step 1416 may be provided by one of the second par-sac structures 108. In other embodiments, each step 1416 is provided by one of the first par-sac structures 106.

Though FIG. 27 illustrates the stadium openings 2702 as being arranged in increasing depth (and the staircased stadiums as being arranged in decreasing elevation) with increasing lateral position (e.g., with the stadium opening 2702 of the first stadium area 2704 being shallowest, the stadium opening 2702 of the second stadium area 2706 being second shallowest, the stadium opening 2702 of the third stadium area 2708 being second deepest, and the stadium opening 2702 of the fourth stadium area 2710 being deepest), the disclosure is not limited to this lateral arrangement. In some embodiments, the lateral order (e.g., lateral arrangement) is such that the stadium openings 2702 decrease in depth (and the staircased stadiums increase in elevation) with increasing lateral position. In other embodiments, the relatively-deeper stadium openings 2702 (and relatively lower staircased stadiums) are laterally interspersed with the relatively-shallower stadium openings 2702 (and relatively higher staircased stadiums).

Whereas, in the embodiments described above with regard to FIGS. 14 through 26B, a pair of staircased stadiums together provided step contact access to the non-insulative structures within a single group of elevations 1418 (FIG. 14) (e.g., with one stadium opening 1402 exposing steps 1416 at the elevations of the first par-sac structures 106 and with a different stadium opening 1402 exposing steps 1416 at the elevations of the second par-sac structures 108 within the group of elevations 1418 of the precursor stack 102), according to embodiments illustrated in FIGS. 27 through 36B, a single stadium opening 2702 provides step contact access to the non-insulative structures within a single group of elevations 2712, as described further below. Therefore, relatively fewer stadium openings 2702 (and staircased stadiums) in a given block may achieve the same number of step-contact-to-conductive-structure connections, which facilitates device scaling.

Figure 28A:
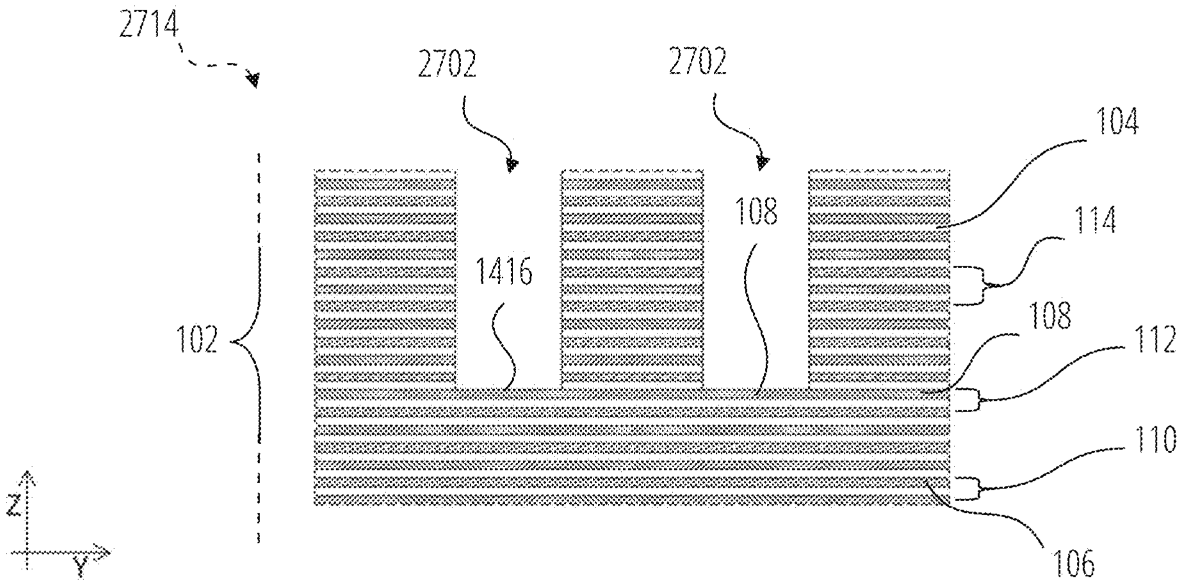
Figure 28B:
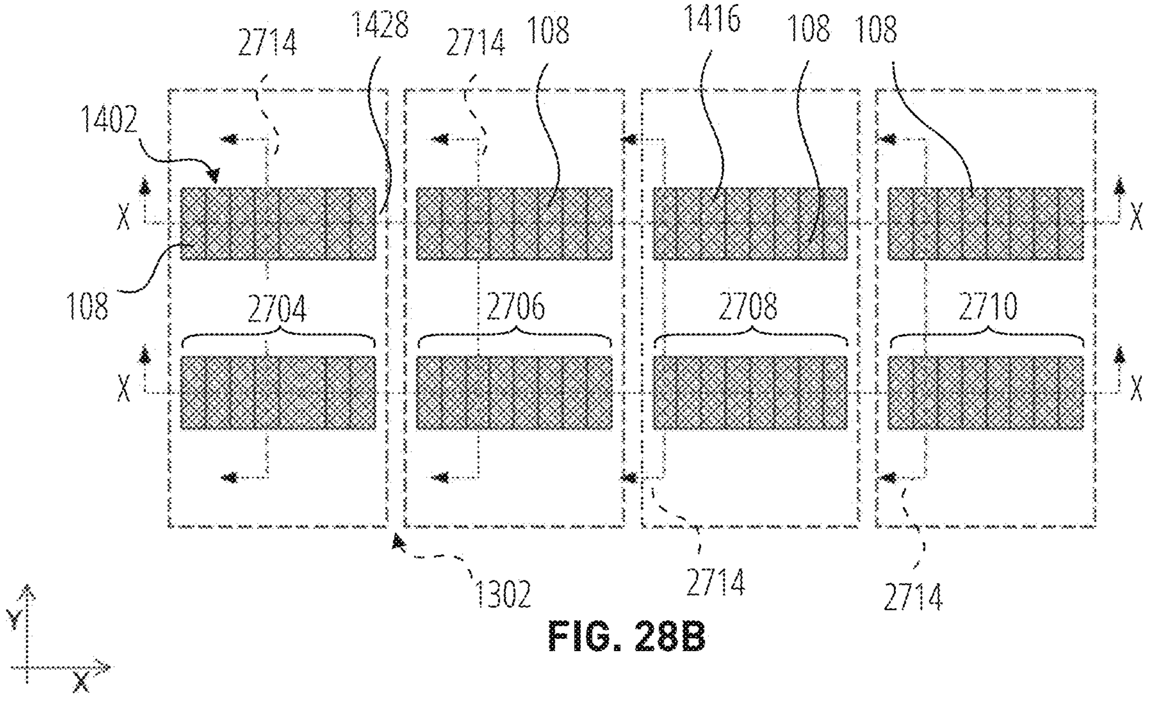

Because each stadium opening 2702 defines steps 1416 at the same type of par-sac structure (e.g., at the second par-sac structures 108, as illustrated in FIGS. 28A and 28B), each step 1416—including any intersected by section planes 2714 of FIG. 27—is of substantially the same structure and composition. These and any other steps 1416 at the base of any stadium opening 2702 are equally represented by the steps 1416 illustrated in FIG. 28A. The Y-Z sectional views of subsequent "A" figures, from FIGS. 28A through 36A, correspond to and illustrate any step 1416 at the base of any of the stadium openings 2702, regardless of whether in first stadium area 2704, second stadium area 2706, third stadium area 2708, fourth stadium area 2710, or any other area of the series of stadium openings 2702.

Figure 29A:
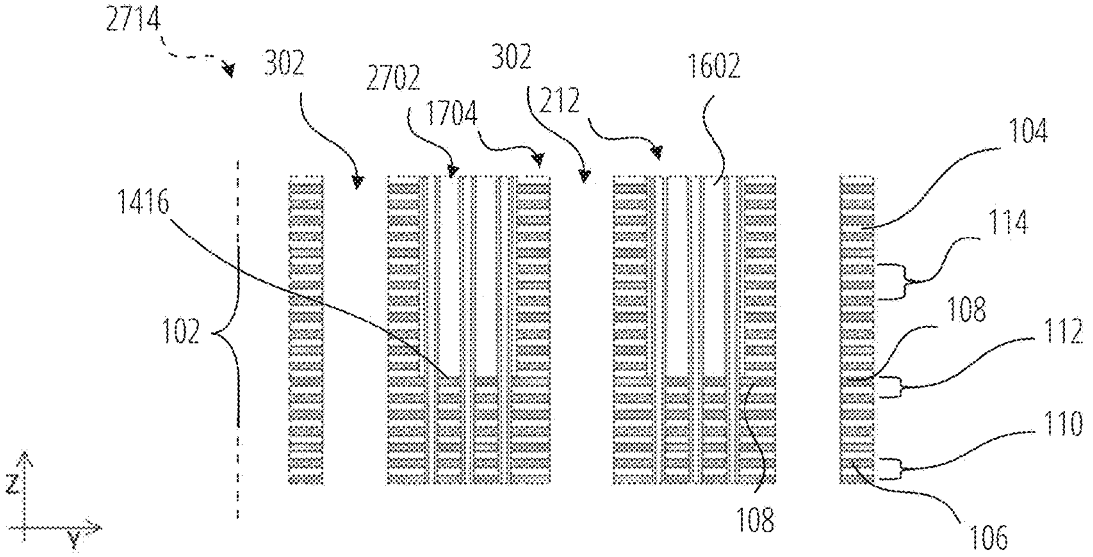
Figure 29B:
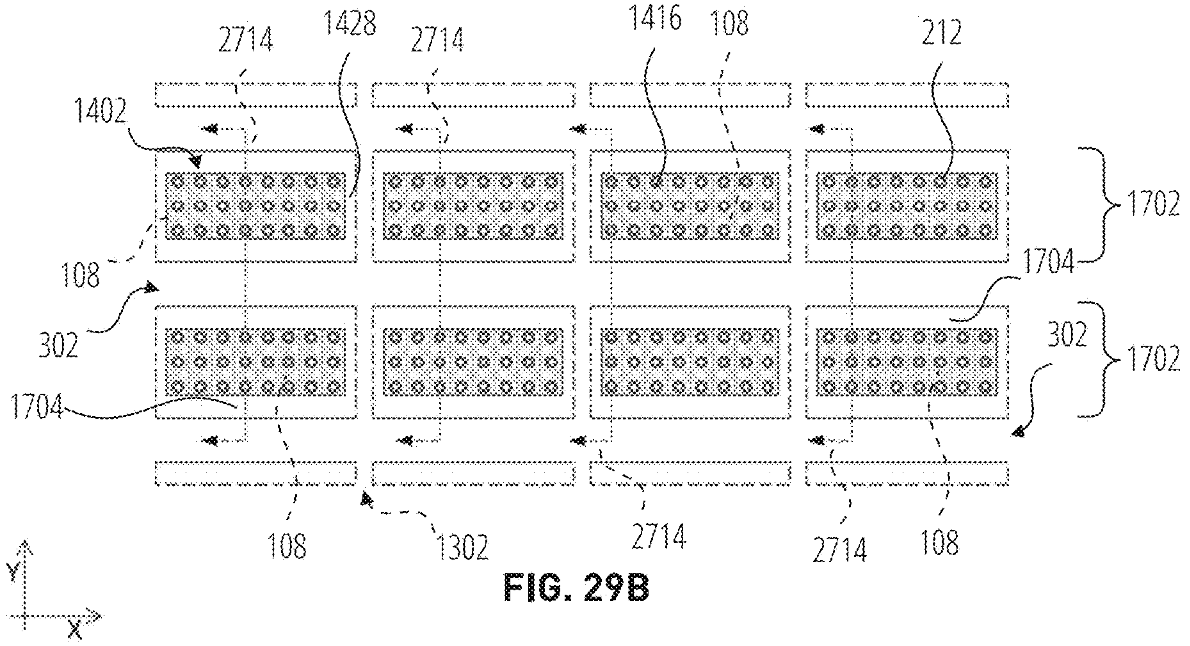

Referring to FIGS. 29A and 29B, fill material(s) 1602 and support structures 212 may be formed in substantially the same manner described above with regard to FIGS. 16A through 16C. In some embodiments, before, during, or concurrent with these stages, the stage(s) described above with regard to FIG. 2A are performed in the pillar array regions 202 of the device, which regions may be laterally adjacent the structures illustrated in FIGS. 29A and 29B.

Slit openings 302 are formed, in substantially the same manner described above with regard to FIGS. 17A, 17B, and 17C, to divide the precursor stack 102 into blocks 1702. Each block 1702 includes one laterally arranged series of stadium openings 2702 (and staircased stadiums) formed in the precursor stack 102. In some embodiments, concurrent with forming the slit openings 302 illustrated in FIGS. 29A and 29B, the stage(s) described above with regard to FIG. 3A may be performed in the pillar array regions 202 of the device.

Figure 30A:
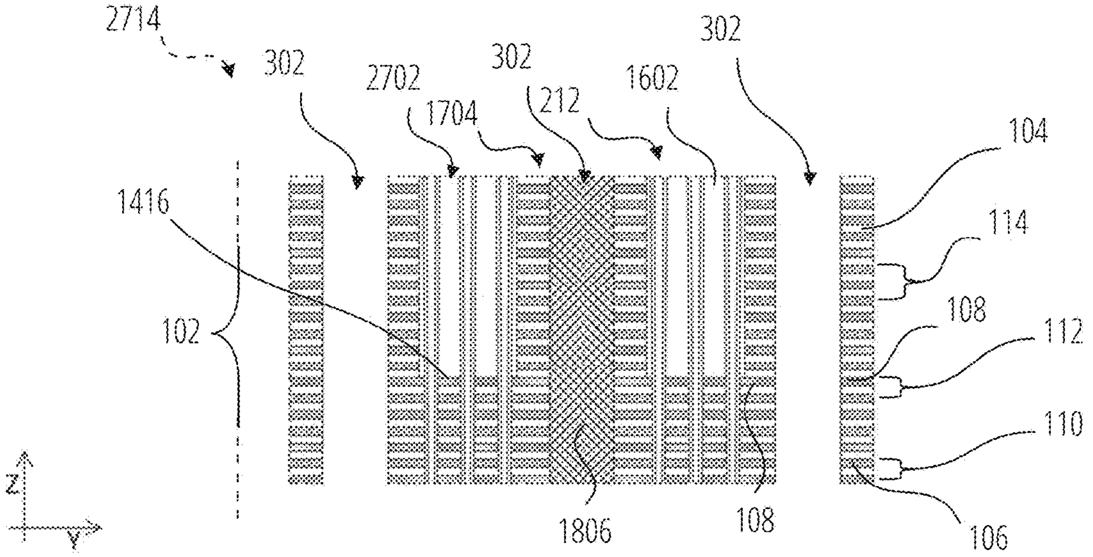
Figure 30B:
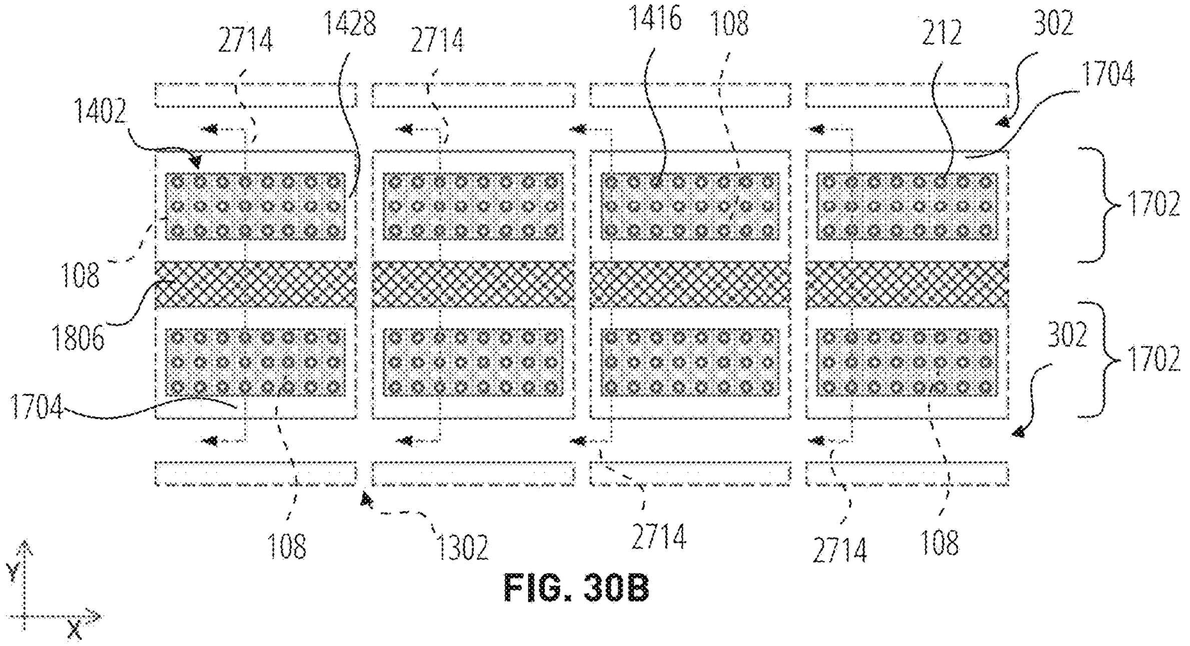

Referring to FIGS. 30A and 30B, one or more sacrificial fill material(s) 1806 may be formed (e.g., deposited) in every other slit opening 302 to at least cover the sidewall surfaces of the materials of the precursor stack 102 in every other slit opening 302. In some embodiments, the sacrificial fill material(s) 1806 are formed in each slit opening 302 and then removed (e.g., etched) from every other slit opening 302. Accordingly, the slit openings 302 across the length of the staircase areas of the device alternate between empty slit openings 302 and slit openings 302 with at least sidewalls covered by the sacrificial fill material(s) 1806.

The sacrificial fill material(s) 1806 may be selected or otherwise formulated to be selectively removable (e.g., etchable) relative to the materials of the precursor stack 102. In some embodiments, the sacrificial fill material(s) 1806 are formed of and include silicon (e.g., polysilicon).

With the sacrificial fill material(s) 1806 in every other slit opening 302, the materials of the precursor stack 102 of each block 1702 are exposed to only one slit opening 302, to only one longitudinal side of the block 1702.

Figure 31A:
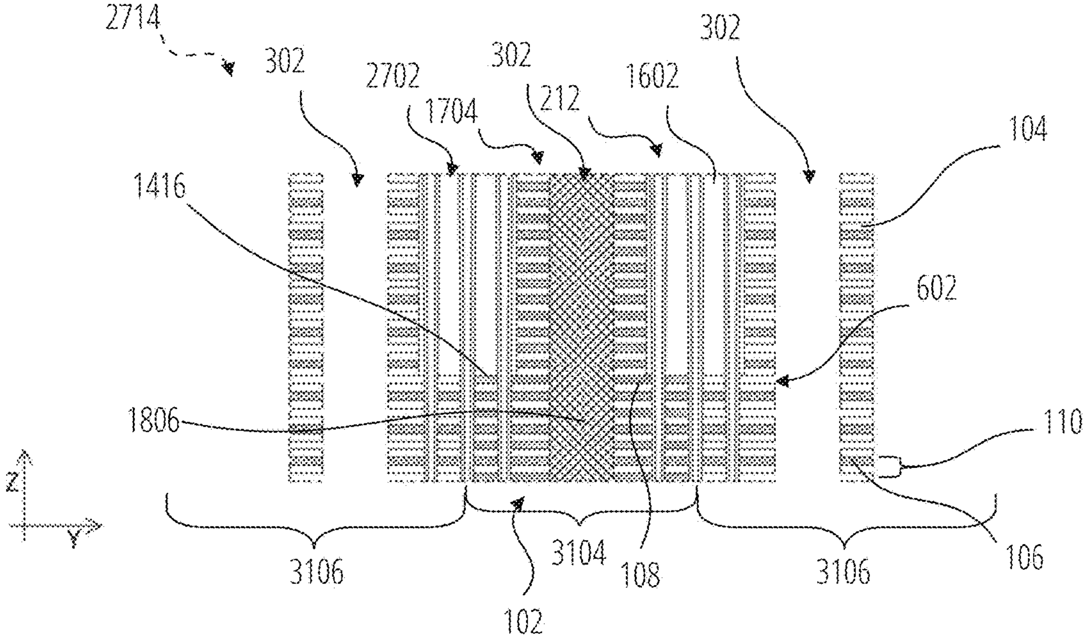
Figure 31B:
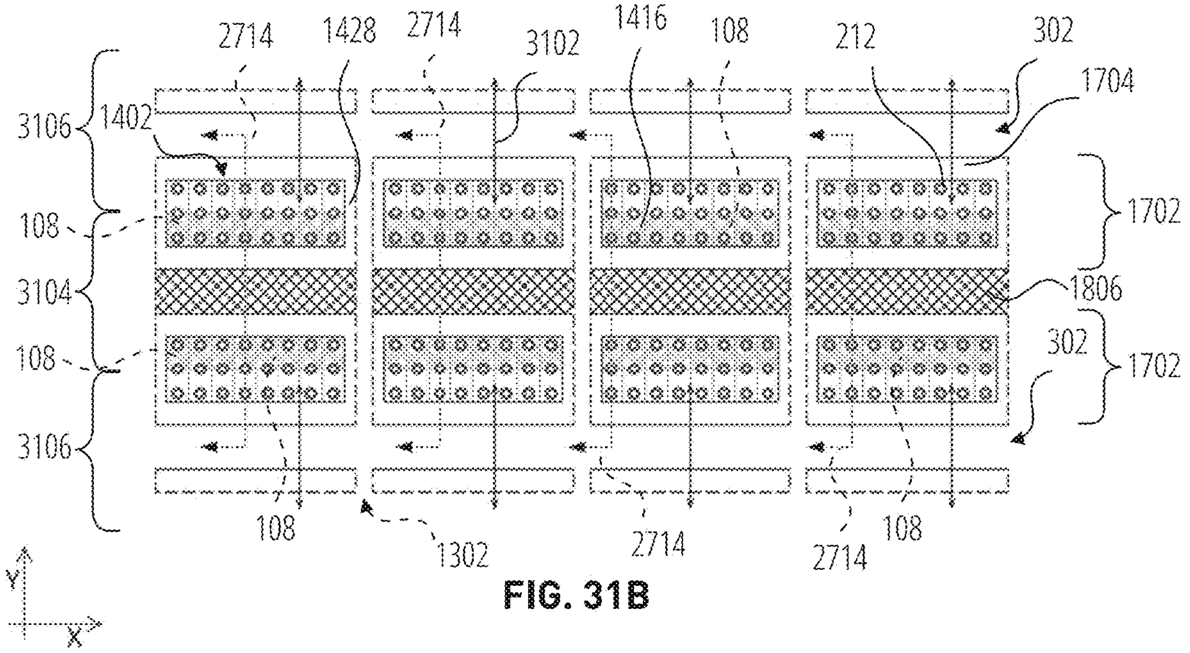

Referring to FIGS. 31A and 31B, one of the par-sac structure types (e.g., the second par-sac structures 108) are exhumed via the slit openings 302 that were left open, without exhuming the other of the par-sac structure types (e.g., the first par-sac structures 106). The timing and/or other conditions of the exhumation—which may be generally in the direction of arrows 3102 of FIG. 31B—may be controlled so that only about half of each second par-sac structure 108 is removed from each block 1702, as illustrated in FIG. 31B. Accordingly, each block 1702 may include a non-exhumed region 3104 (e.g., with the precursor stack 102) along the longitudinal side of the block 1702 adjacent the slit opening 302 with the sacrificial fill material(s) 1806, and each block 1702 may include a first exhumed region 3106 along the longitudinal side of the block 1702 that is adjacent the slit opening 302 without the sacrificial fill material(s) 1806.

In some embodiments, concurrent with performing the stage(s) illustrated in FIGS. 31A and 31B, the same par-sac structure type (e.g., the second par-sac structures 108) may be exhumed from pillar array regions 202 (FIG. 3A) of the device.

Figure 32A:
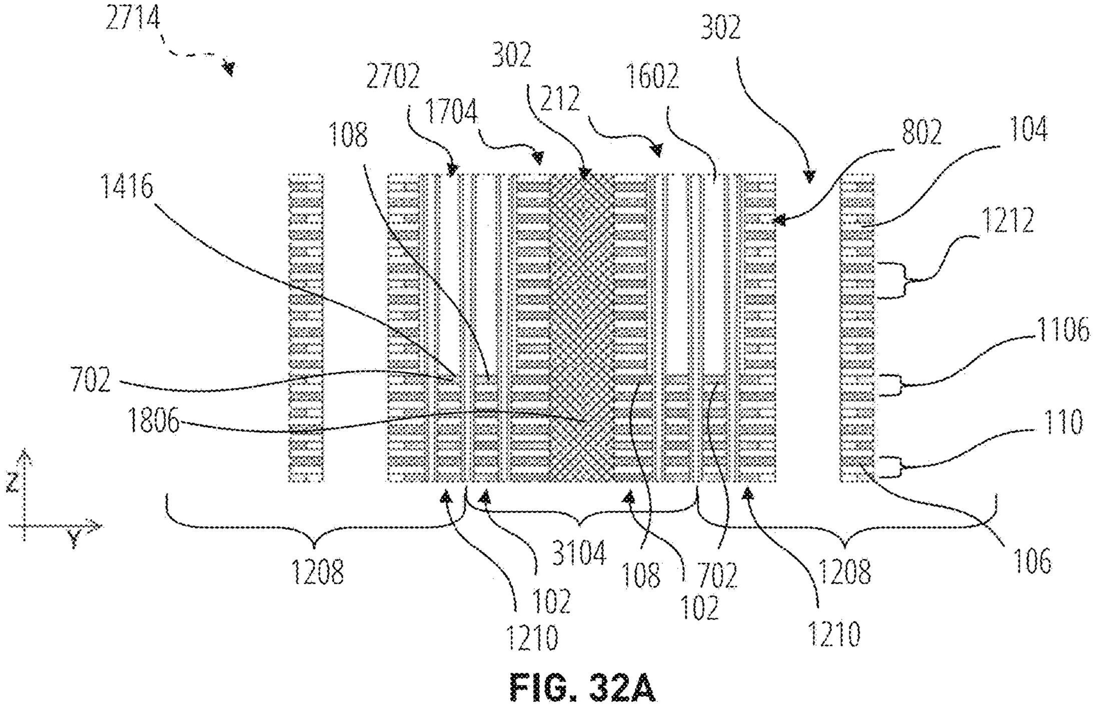
Figure 32B:
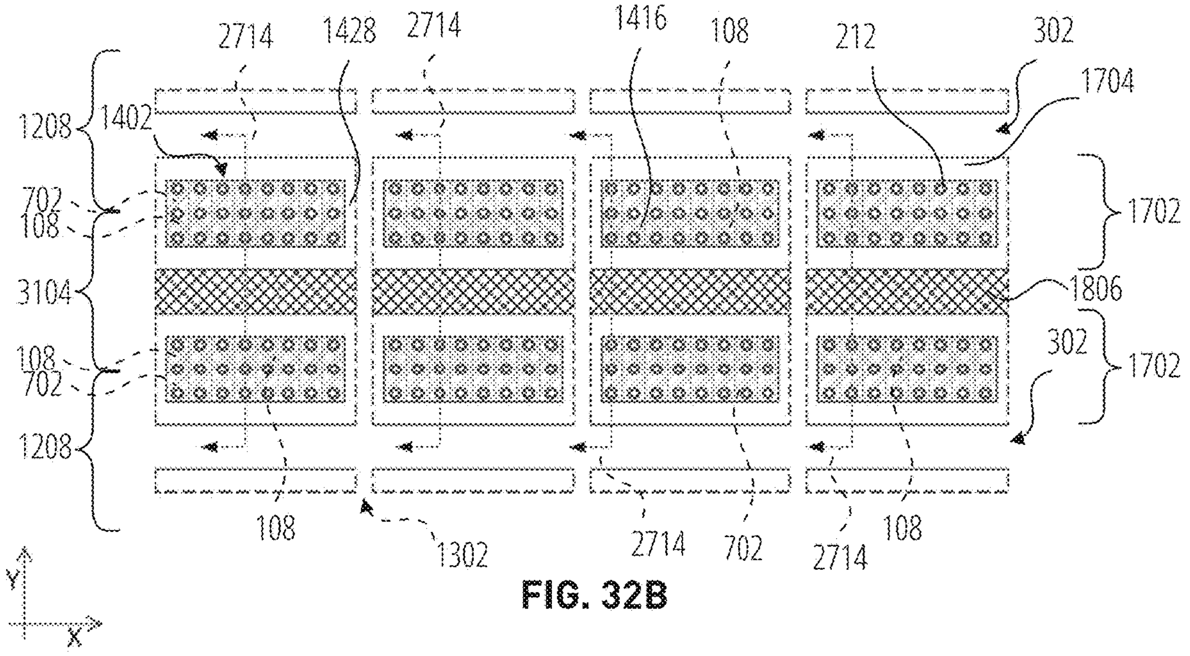

Referring to FIGS. 32A and 32B, the conductive structures 702 are formed (in substantially the same manner described above with regard to FIGS. 7A to 8B) in the elevations previously occupied by the first-exhumed structures (e.g., the second par-sac structures 108). Accordingly, the steps 1416 of the staircased stadiums at the base of the stadium openings 2702 are then provided, in a first half, by the conductive structures 702 and, in a second half, by the remaining par-sac structures of the same type that was exhumed, in the first exhumed region 3106 (FIGS. 31A and 31B) (e.g., the second par-sac structures 108). At this stage, a first longitudinal half of each block 1702 is in one of the non-exhumed regions 3104 and retains the precursor stack 102 structure, while a second longitudinal half of each block 1702 is in one of the other regions 1208 that has been converted to the first partially-conductive stack 1210 structure.

In some embodiments, concurrent with performing the stage(s) illustrated in FIGS. 32A and 32B, conductive structures 702 may also be formed in replacement of the first-exhumed par-sac structures in the pillar array regions 202 (FIG. 3A) of the device.

Figure 33A:
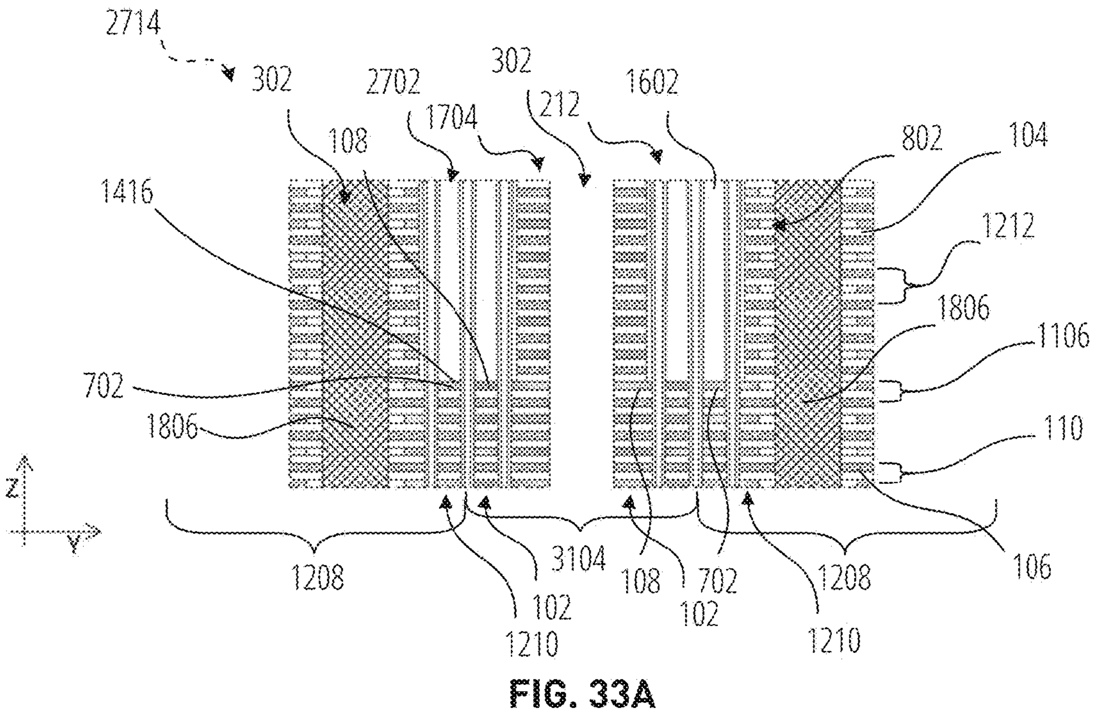
Figure 33B:
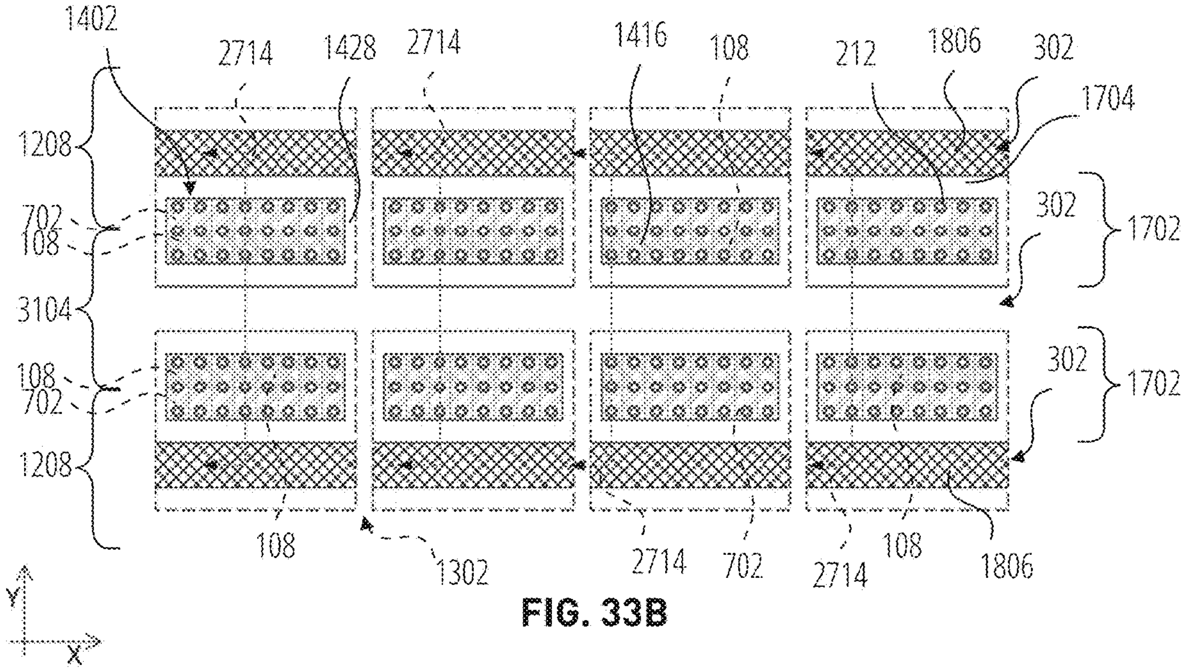

Referring to FIGS. 33A and 33B, the sacrificial fill material(s) 1806 may be removed from those slit openings 302 in which the sacrificial fill material(s) 1806 had been present during the first exhumation of par-sac material. The sacrificial fill material(s) 1806 may be formed (e.g., deposited) in the other slit openings 302 to at least cover the materials along the sidewalls of the slit openings 302 that extend by the half of the block 1702 already converted to a partially-conductive stack (e.g., the first partially-conductive stack 1210).

Figure 34A:
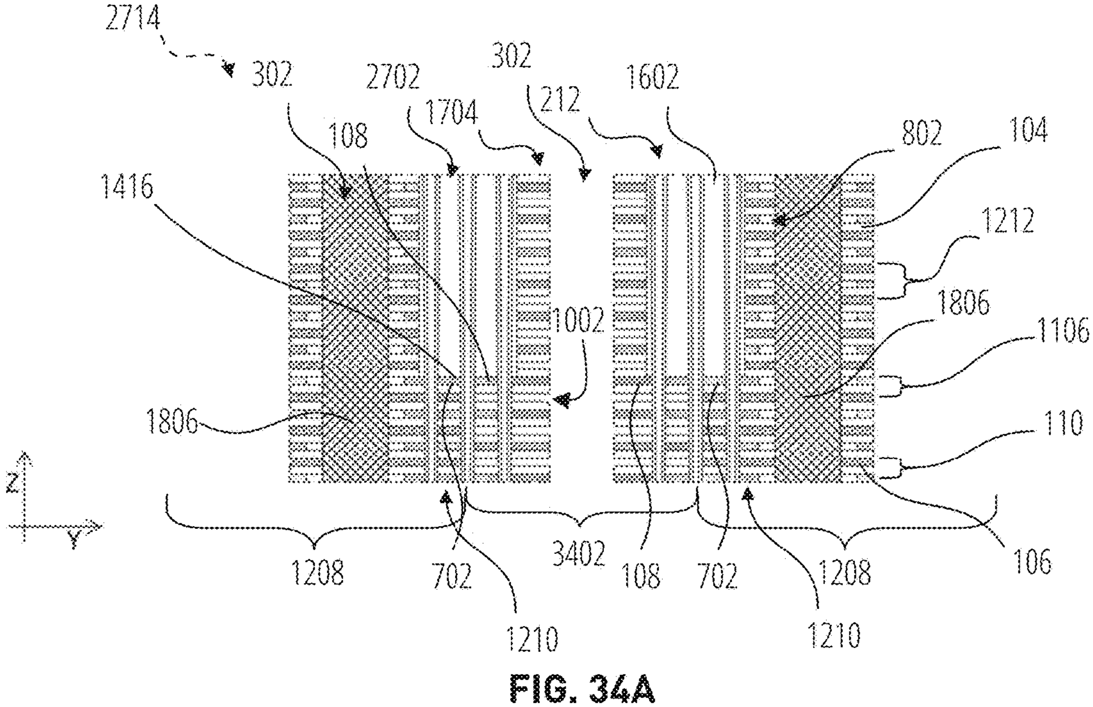
Figure 34B:
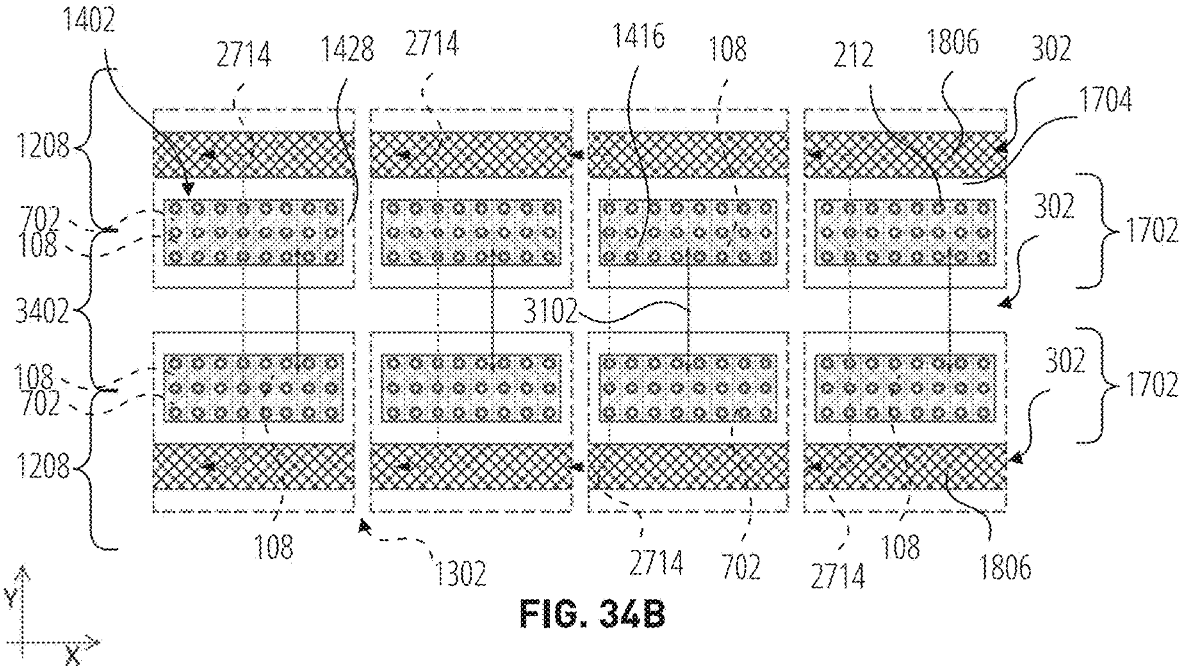

Referring to FIGS. 34A and 34B, the other par-sac structure types (e.g., the first par-sac structures 106) are exhumed via the empty slit openings 302, without exhuming the remaining par-sac structure types (e.g., the second par-sac structures 108). The timing and/or other conditions of the exhumation—which may be generally in the direction of arrows 3102—may be controlled so that only about half of each first par-sac structure 106 is removed from each block 1702, e.g., in a second exhumed region 3402. The par-sac structures (e.g., the first par-sac structures 106) exhumed in the second exhumed region 3402 may be at the same elevations as the conductive structures 702 already formed in the other half of the block 1702 (e.g., in the other region 1208). The non-exhumed par-sac structures (e.g., the second par-sac structures 108) remain in the second exhumed region 3402, including those that provide half the step 1416 treads.

In some embodiments, concurrent with performing the stage(s) illustrated in FIGS. 34A and 34B, the same par-sac structure types (e.g., the first par-sac structures 106) may be exhumed from pillar array regions 202 (FIG. 3A) of the device.

Figure 35A:
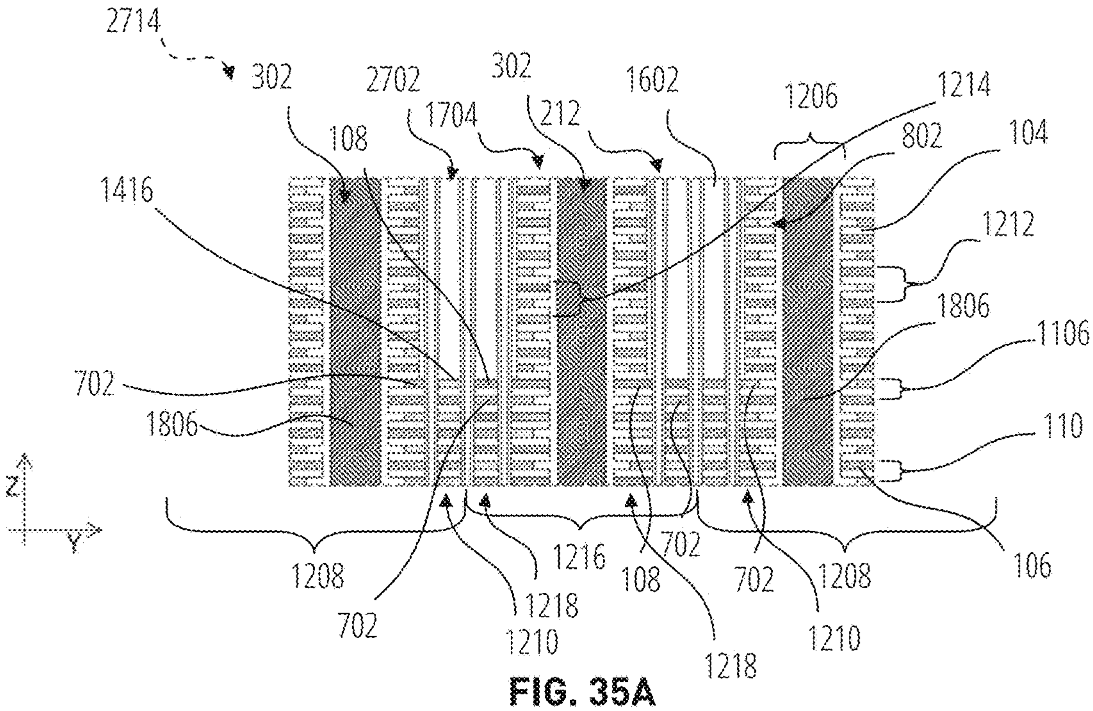
Figure 35B:
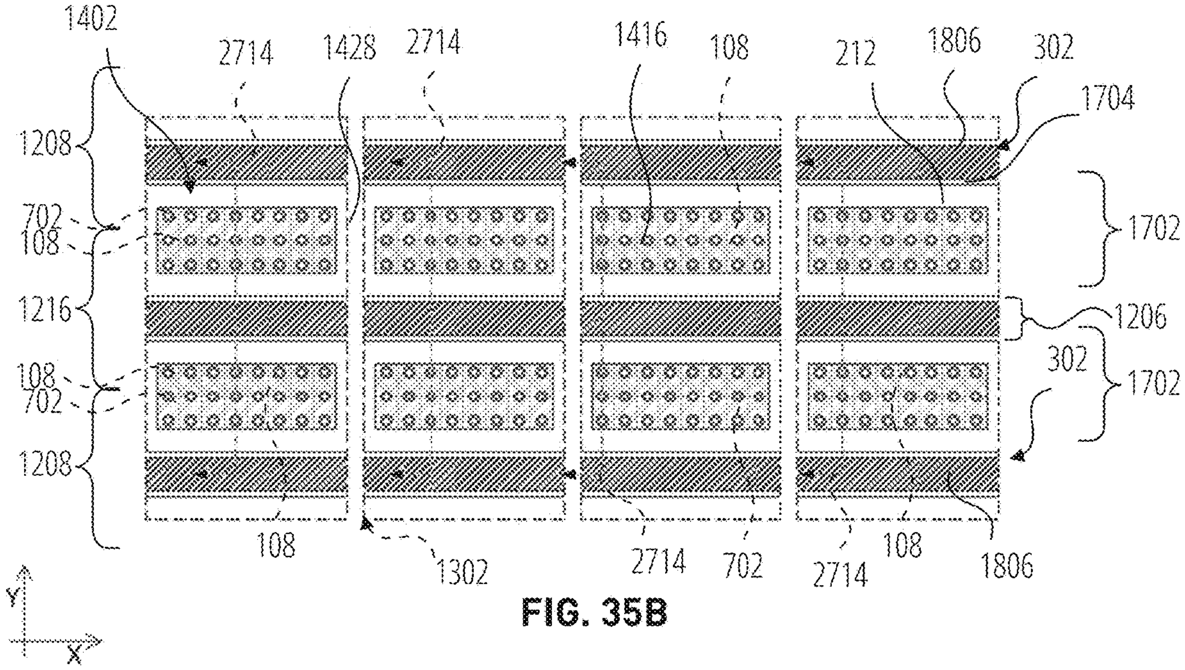

Referring to FIGS. 35A and 35B, the conductive structures 702 are formed—in substantially the same manner described above with regard to FIGS. 11A and 11B—in the second exhumed region 3402 (FIGS. 34A and 34B) at the elevations previously occupied by the first par-sac structures 106. Accordingly, though second par-sac structures 108 provide half of the tread of the steps 1416, a conductive structure 702 is two structural elevations below each step 1416 tread. At this stage, the stack structure of a first longitudinal half of each block 1702 provides the additional region 1216 with the second partially-conductive stack 1218, while the stack structure of a second longitudinal half of each block 1702 provides the other region 1208 with the first partially-conductive stack 1210 structure.

In some embodiments, concurrent with forming the conductive structures 702 in the second exhumed region 3402 (FIGS. 34A and 34B) to form the additional regions 1216 (e.g., with the second partially-conductive stacks 1218), conductive structures 702 may also be formed in replacement of the second exhumed par-sac structures in the pillar array regions 202 (FIG. 11A) of the device.

After removing the sacrificial fill material(s) 1806 from the slit openings 302 that were blocked during the second exhumation stage, the slit structures 1206 may be formed in each slit opening 302, in substantially the same manner described above with regard to FIGS. 12A and 12B. In some embodiments, concurrent with forming the slit structures 1206 between the blocks 1702, the stage(s) illustrated in FIG. 12A may be performed in the pillar array regions 202 of the device (e.g., in the pillar array region 202 of the block 1702).

Figure 36A:
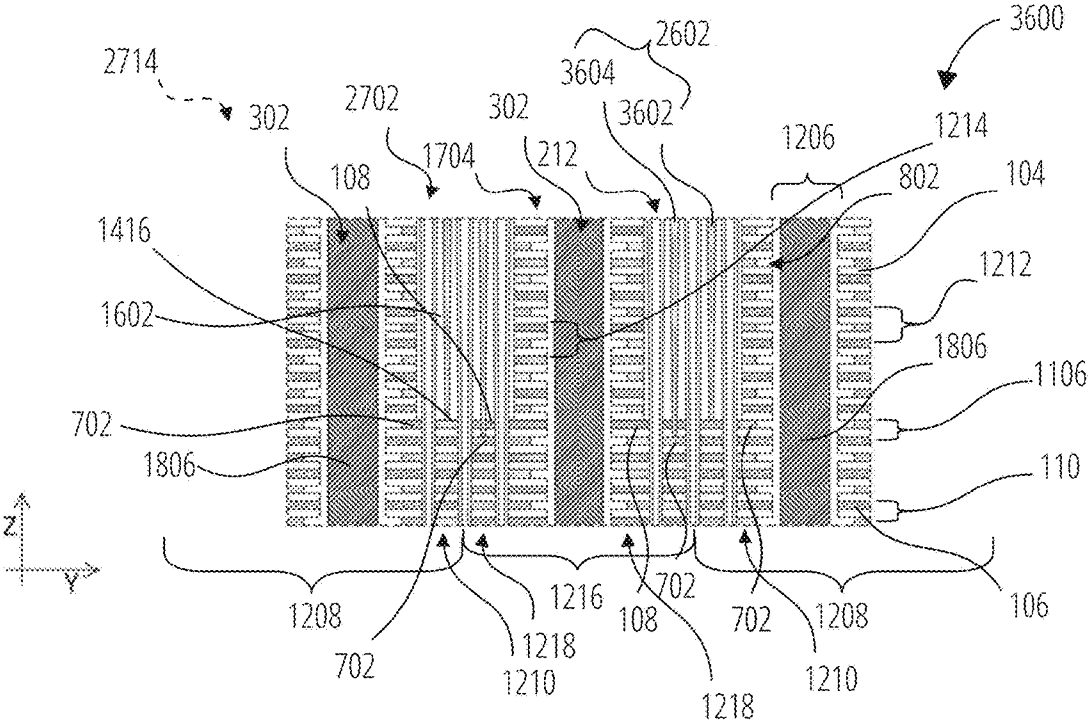
Figure 36B:
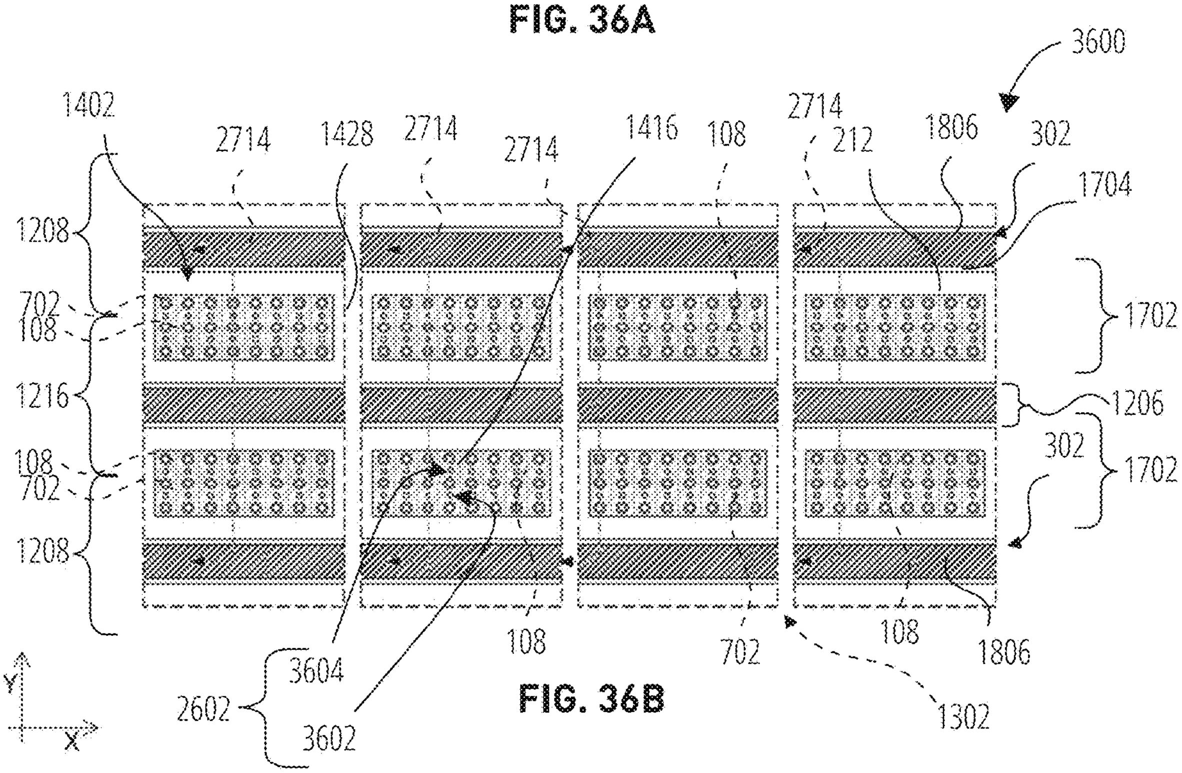

Referring to FIGS. 36A and 36B, step contacts 2602 are formed so that each step contact 2602 makes physical contact either with the conductive structure 702 providing a portion (e.g., about half) of a single step 1416 or with the conductive structure 702 that is below the remaining par-sac structure (e.g., the second par-sac structure 108) providing the other portion (e.g., about half) of the single step 1416. The step contacts 2602 that extend to, and "land on," the conductive structure 702 portion of the steps 1416 are referred to herein as "to-step contacts" (e.g., to-step contacts 3602). Accordingly, as used herein, the term "to-step contact" means and refers to a step contact that "lands on" a conductive structure providing at least a portion of a tread of a defined step of a staircased stadium.

The step contacts 2602 that extend to conductive structures 702 below the step 1416 tread are referred to herein as "through-step contacts" (e.g., through-step contacts 3604) because the through-step contacts 3604 are formed to extend through the par-sac structure that provides the other-material (e.g., non-conductive) portion of the step 1416 tread. Accordingly, as used herein, the term "through-step contact" means and refers to a step contact that extends through a portion of a tread of a defined step of a staircased stadium to "land on" a conductive structure that is elevationally below the step tread and that does not otherwise have an exposed step tread.

To form the step contacts 2602, openings may be formed (e.g., etched) through the fill material(s) 1602, to the conductive structures 702 at the steps 1416. Additional openings may be formed (e.g., etched) through the fill material(s) 1602, through the other-material (e.g., non-conductive) portions of the step 1416 treads (e.g., through the second par-sac structure 108 portions of the step 1416 treads), and through the insulative structures 104 that are below the step 1416 treads, to the conductive structures 702 that are below the step 1416 treads. The conductive material(s) (and, optionally, insulative liner(s)) may be formed in the contact openings to form the step contacts 2602 (e.g., the through-step contacts 3604 and the to-step contacts 3602).

Because, in at least some embodiments, the through-step contacts 3604 extend through non-conductive, par-sac material (e.g., the second par-sac structures 108, as illustrated in FIG. 36A, or, in other embodiments, the first par-sac structures 106), forming the contact openings for the through-step contacts 3604 need not involve a conductive-material removal process (e.g., a metal etch) in at least some embodiments. Also, because, in at least these embodiments, the through-step contacts 3604 extend through only non-conductive material (e.g., the fill material(s) 1602, the par-sac structure (e.g., the second par-sac structure 108), and the insulative structure 104) before landing on its target conductive structure 702, the concern of unwanted electrical contact (e.g., "shorting") between the through-step contact 3604 and a non-target step 1416 may be avoided. In some such embodiments, the through-step contacts 3604 may be in direct physical contact with the non-conductive material (e.g., the second par-sac structure 108) providing the step 1416 through which the through-step contact 3604 extends, without necessitating an additional insulative liner between the through-step contact 3604 and the step 1416 tread. In other embodiments, an insulative liner is included between the through-step contact 3604 and the step 1416 through which it extends.

Each step 1416 of the staircased stadiums (e.g., at the base of each stadium opening 2702) may, therefore, be associated with multiple step contacts 2602. Accordingly, multiple step contacts 2602 are formed within the area of a single step 1416. Patterning processes to form the steps 1416 may be relatively less complex and relatively more reliably executed than if each staircased stadium were patterned (e.g., etched) to define multiple rows of steps across the length (e.g., "Y"-axis dimension) of the stadium opening so as to include one step per step contact. With relatively longer steps 1416, the structure of the steps 1416 and the staircase profile defined by the stadium openings 2702 may be relatively more reliably maintained during fabrication (e.g., patterning and extension) of the stadium openings 2702 (e.g., avoiding so-called "walk-out" fabrication errors that yield steps shifting in horizontal position and/or shortening as stadium openings are extended to greater depths in the stack) than if, e.g., multiple steps of lesser step lengths were patterned and extended into the precursor stack 102 (FIG. 27).

Accordingly, disclosed is a microelectronic device structure 3600 with a series of stadium openings 2702 (and a series of staircased stadiums) within a stack that includes insulative structures 104 vertically alternating with conductive structures 702 and with other-material (e.g., non-conductive) structures. Slit structures extend through the stack to define the stack into at least one block. Along one horizontal side of the block, the other-material (e.g., non-conductive) structures of the stack are of a different composition than the other-material (e.g., non-conductive) structures of the stack along the opposite horizontal side of the block. Steps 1416—of staircases (e.g., the descending staircase 1412 (FIG. 27), the ascending staircase 1414 (FIG. 27)) defined at the base of the stadium openings 2702—have treads with one portion provided by an upper surface of a conductive structure 702 and with another portion provided by the upper surface of one of the other-material (e.g., non-conductive) structures. At least a pair of conductive step contacts 2602 extends to a single one of the steps 1416. At least one of the conductive step contacts 2602 is in physical contact with the one portion of the step tread provided by the upper surface of the conductive structure 702, and at least one other of the conductive step contacts 2602 extends through the other portion of the step tread provided by the upper surface of the one of the other-material (e.g., non-conductive) structures.

Moreover, disclosed is a microelectronic device comprising at least one region comprising a stack structure. The stack structure comprises a vertically repeating sequence of insulative structures, conductive structures, and other (e.g., non-conductive) structures. The vertically repeating sequence is defined by a repeating tier group comprising one of the insulative structures, one of the conductive structures above the one of the insulative structures, an additional one of the insulative structures above the one of the conductive structures, and one of the other (e.g., non-conductive) structures above the additional one of the insulative structures. The other (e.g., non-conductive) structures differ in composition from the insulative structures and from the conductive structures.

Figure 37:
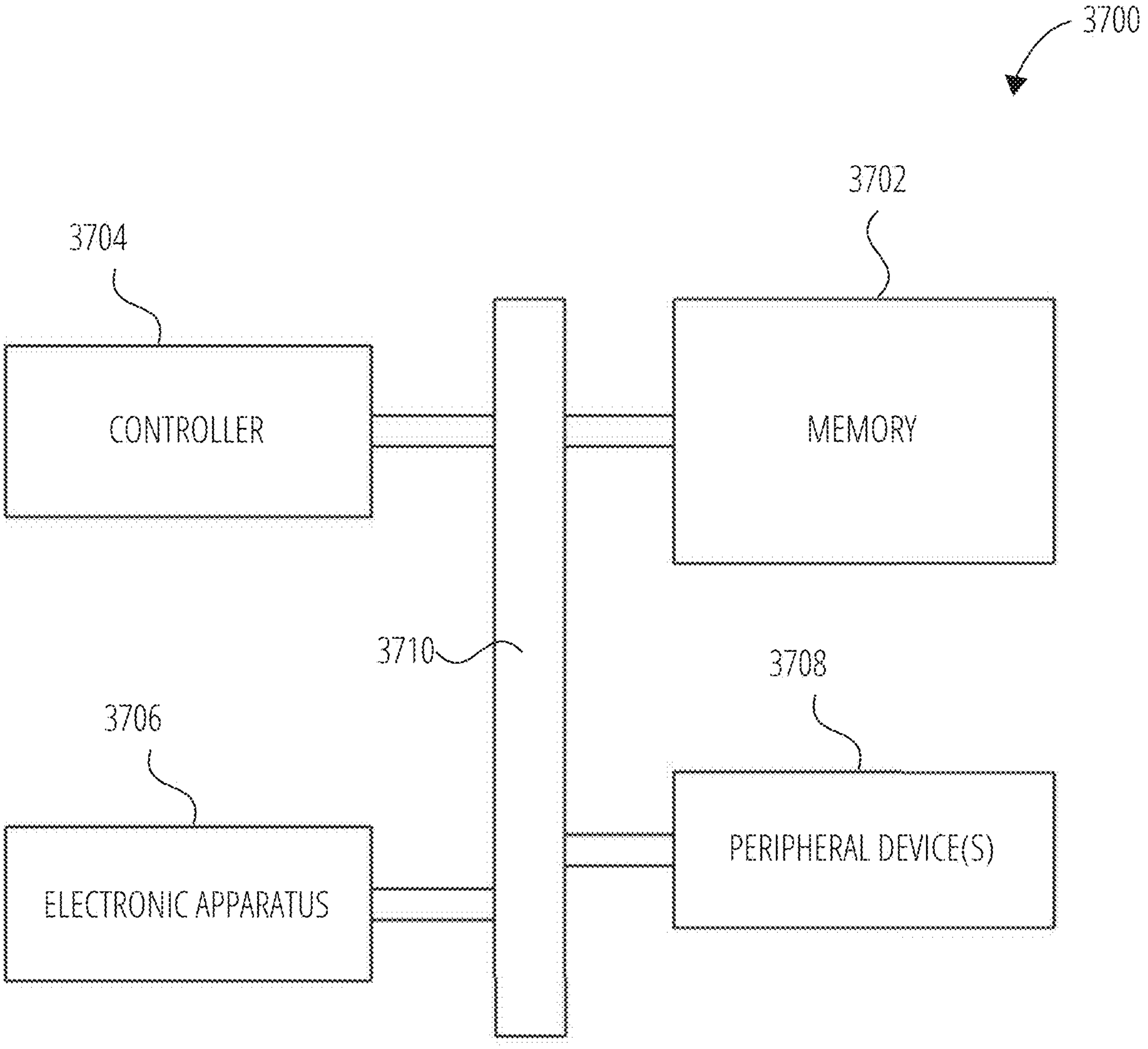
FIG. 37 is a block diagram of an electronic system including at least one microelectronic device according to embodiments of the disclosure.

FIG. 37 shows a block diagram of a system 3700, according to embodiments of the disclosure. Memory 3702 of the system 3700 may include arrays of vertical strings of memory cells (e.g., in one or more pillar array regions 202 (FIG. 12A)). The memory 3702 may also include one or more other regions, e.g., one or more staircase regions 210 (FIG. 12B), other regions 1208 (FIG. 12C), additional regions 1216 (FIG. 12D), and/or precursor stack 102 (FIG. 1) regions. The memory 3702 may be part of, e.g., the microelectronic device structure 1200 of FIGS. 12A through 12D, the microelectronic device structure 2600 of FIGS. 26A through 26C, and/or the microelectronic device structure 3600 of FIGS. 36A and 36B (any of which may or may not include a region retaining the precursor stack 102 (FIG. 1) structure). Therefore, the architecture and structure of the memory 3702 may include one or more device structures according to embodiments of the disclosure and may be fabricated according to one or more of the methods described above (e.g., with reference to FIGS. 1 through 12D, to FIGS. 13 through 26C, and/or to FIGS. 27 through 36B).

The system 3700 may include a controller 3704 operatively coupled to the memory 3702. The system 3700 may also include another electronic apparatus 3706 and one or more peripheral device(s) 3708. The other electronic apparatus 3706 may, in some embodiments, include one or more microelectronic device structures (e.g., the microelectronic device structure 1200 of FIGS. 12A through 12D, the microelectronic device structure 2600 of FIGS. 26A through 26C, and/or the microelectronic device structure 3600 of FIGS. 36A and 36B, any of which may or may not include another region retaining the precursor stack 102 (FIG. 1) structure), according to embodiments of the disclosure and fabricated according to one or more of the methods described above. One or more of the controller 3704, the memory 3702, the other electronic apparatus 3706, and the peripheral device(s) 3708 may be in the form of one or more integrated circuits (ICs).

A bus 3710 provides electrical conductivity and operable communication between and/or among various components of the system 3700. The bus 3710 may include an address bus, a data bus, and a control bus, each independently configured. Alternatively, the bus 3710 may use conductive lines for providing one or more of address, data, or control, the use of which may be regulated by the controller 3704. The controller 3704 may be in the form of one or more processors.

The other electronic apparatus 3706 may include additional memory (e.g., with one or more microelectronic device structures (e.g., the microelectronic device structure 1200 of FIGS. 12A through 12D (with or without a region that retains the precursor stack 102 (FIG. 1) structure)), the microelectronic device structure 2600 of FIGS. 26A through 26C, and/or the microelectronic device structure 3600 of FIGS. 36A and 36B), according to embodiments of the disclosure and fabricated according to one or more of the methods described above. Other memory structures of the memory 3702 and/or the other electronic apparatus 3706 may be configured in an architecture other than 3D NAND, such as dynamic random access memory (DRAM), static random access memory (SRAM), synchronous dynamic random access memory (SDRAM), synchronous graphics random access memory (SGRAM), double data rate dynamic ram (DDR), double data rate SDRAM, and/or magnetic-based memory (e.g., spin-transfer torque magnetic RAM (STT-MRAM)).

The peripheral device(s) 3708 may include displays, imaging devices, printing devices, wireless devices, additional storage memory, and/or control devices that may operate in conjunction with the controller 3704.

The system 3700 may include, e.g., fiber optics systems or devices, electro-optic systems or devices, optical systems or devices, imaging systems or devices, and information handling systems or devices (e.g., wireless systems or devices, telecommunication systems or devices, and computers).

Accordingly, disclosed is an electronic system comprising a microelectronic device, at least one processor in operable communication with the microelectronic device, and at least one peripheral device in operable communication with the at least one processor. The microelectronic device comprises a stack structure comprising conductive structures vertically interleaved with multi-structure tier groups. At least some of the multi-structure tier groups comprise a non-conductive structure vertically between a pair of insulative structures. At least one staircased stadium provides steps at different elevations in the stack structure. Conductive contact structures extend to the steps of the at least one staircased stadium.

While the disclosed structures, apparatus (e.g., devices), systems, and methods are susceptible to various modifications and alternative forms in implementation thereof, specific embodiments have been shown by way of example in the drawings and have been described in detail herein. The disclosure is not intended to be limited to the particular forms disclosed. The disclosure encompasses all modifications, combinations, equivalents, variations, and alternatives falling within the scope of the disclosure as defined by the following appended claims and their legal equivalents.

What is claimed is:

1. A microelectronic device, comprising:

a region comprising a tiered stack comprising insulative structures, conductive structures, and other structures arranged in tiers, the insulative structures vertically alternating with both the conductive structures and with the other structures, each of the conductive structures positioned vertically directly between two physically distinct insulative structures of the insulative structures of the tiered stack, each of the conductive structures being vertically spaced from another of the conductive structures by:

at least one of the other structures; and at least two of the insulative structures, a composition of the other structures differing from a composition of the insulative structures and from a composition of the conductive structures.

2. The microelectronic device of claim 1, further comprising:

an other region horizontally adjacent the region comprising the tiered stack, the other region comprising an other tiered stack comprising the insulative structures vertically alternating with both the conductive structures and with additional conductive structures, the additional conductive structures within the other tiered stack being co-elevational with the other structures within the tiered stack.

3. The microelectronic device of claim 2, further comprising:

an array of pillars providing vertical strings of memory cells, the pillars of the array extending through the other tiered stack in the other region.

4. The microelectronic device of claim 2, further comprising slit structures extending through the other tiered stack of the other region.

5. The microelectronic device of claim 1, further comprising:

an additional region horizontally adjacent the region comprising the tiered stack, the additional region comprising an additional tiered stack comprising the insulative structures, additional conductive structures, and additional other structures arranged in additional tiers, the insulative structures vertically alternating with both the additional conductive structures and the additional other structures, the additional conductive structures within the additional tiered stack being co-elevational with the other structures within the tiered stack, the additional other structures within the additional tiered stack being co-elevational with the conductive structures within the tiered stack, the composition of the other structures differing from a composition of the additional other structures.

6. The microelectronic device of claim 5, wherein none of the conductive structures of the tiered stack is co-elevational with the additional conductive structures of the additional tiered stack.

7. The microelectronic device of claim 5, wherein:

the additional region comprising the additional tiered stack is laterally adjacent the region comprising the tiered stack; and the microelectronic device further comprises:

slit structures extending laterally and vertically through the tiered stack in the region and through the additional tiered stack in the additional region to divide the tiered stack and the additional tiered stack into blocks; and a series of staircased stadiums between a pair of the slit structures, the series comprising:

a first staircased stadium in the region and comprising a staircase comprising steps provided by at least some of the conductive structures of the tiered stack; and a second staircased stadium in the additional region and comprising an additional staircase comprising additional steps provided by at least some of the additional conductive structures of the additional tiered stack.

8. The microelectronic device of claim 5, wherein:

the additional region comprising the additional tiered stack is longitudinally adjacent the region comprising the tiered stack; and the microelectronic device further comprises:

a slit structure extending laterally and vertically through the tiered stack of the region;

an additional slit structure extending laterally and vertically through the additional tiered stack of the additional region; and a series of staircased stadiums between the slit structure and the additional slit structure, each step of at least some of the staircased stadiums of the series comprising an upper surface provided in part by an upper surface of one of the conductive structures of the tiered stack and in an additional part by an upper surface of one of the additional other structures of the additional tiered stack.

9. The microelectronic device of claim 5, further comprising:

a conductive contact structure extending to one of the conductive structures of the tiered stack in the region; and an additional conductive contact structure extending to one of the additional conductive structures of the additional tiered stack in the additional region.

10. The microelectronic device of claim 9, wherein the additional conductive contact structure extends through one of the additional other structures that is elevationally above the one of the additional conductive structures.

11. A method for forming a microelectronic device, the method comprising:

forming a precursor stack comprising insulative structures vertically alternating with both first other structures and second other structures;

in at least one region of the precursor stack, substantially removing the first other structures without removing the second other structures to form voids vertically between tier groups, each of the tier groups comprising at least two of the insulative structures and at least one of the second other structures; and forming conductive structures in the voids, the method forming a microelectronic device comprising:

a first region of the at least one region of the precursor stack, the first region comprising a tiered stack comprising the insulative structures, the conductive structures, and second other structures arranged in tiers, the insulative structures vertically alternating with both the conductive structures and with the second other structures, each of the conductive structures positioned vertically directly between two physically distinct insulative structures of the insulative structures of the tiered stack, each of the conductive structures being vertically spaced from another of the conductive structures by:

at least one of the second other structures; and at least two of the insulative structures of the tiered stack, a composition of the second other structures differing from a composition of the insulative structures and from a composition of the conductive structures.

12. The method of claim 11, further comprising, in a second region of the at least one region of the precursor stack:

after forming the conductive structures in the voids, substantially removing the second other structures to form additional voids vertically between additional tier groups, each of the additional tier groups comprising at least two of the insulative structures and at least one of the conductive structures; and forming additional conductive structures in the additional voids.

13. The method of claim 11, further comprising, in at least one other region of the precursor stack:

substantially removing the second other structures without removing the first other structures to form additional voids vertically between additional tier groups, each of the additional tier groups comprising at least two of the insulative structures and at least one of the first other structures; and forming additional conductive structures in the additional voids.

14. The method of claim 11, further comprising, before substantially removing the first other structures:

forming a series of stadium openings to varying depths in the precursor stack; and forming a pair of slit openings through the precursor stack to define a block comprising the series of stadium openings.

15. The method of claim 14, wherein forming the series of stadium openings comprises:

forming some of the stadium openings of the series to define steps at surfaces of only the first other structures; and forming some others of the stadium openings of the series to define additional steps at surfaces of only the second other structures.

16. The method of claim 14, wherein forming the series of stadium openings comprises forming all the stadium openings of the series to define steps at either:

surfaces of only the first other structures, or surfaces of only the second other structures.

17. The method of claim 14, wherein substantially removing the first other structures in the at least one region of the precursor stack comprises:

substantially removing the first other structures from adjacent some of the stadium openings without substantially removing the first other structures from adjacent some others of the stadium openings.

18. The method of claim 17, further comprising, after forming the conductive structures in the voids:

substantially removing the second other structures from adjacent the some others of the stadium openings without substantially removing the second other structures from adjacent the some of the stadium openings to form additional voids adjacent the some others of the stadium openings; and forming additional conductive structures in the additional voids.

19. The method of claim 14, wherein substantially removing the first other structures in the at least one region of the precursor stack comprises substantially removing a portion of each of the first other structures adjacent one of the slit openings, of the pair of slit openings, without removing an other portion of the each of the first other structures adjacent an other of the slit openings of the pair of slit openings.

20. The method of claim 19, further comprising, after forming the conductive structures in the voids:

substantially removing a portion of each of the second other structures adjacent the other of the slit openings without removing an other portion of the each of the second other structures adjacent the one of the slit openings to form additional voids adjacent the other of the slit openings; and forming additional conductive structures in the additional voids.

21. The method of claim 11, wherein forming the precursor stack comprising the insulative structures vertically alternating with both the first other structures and the second other structures comprises forming a repeated sequence of:

silicon oxide, silicon nitride with a first nitrogen-to-silicon ratio, additional silicon oxide, and additional silicon nitride with a second nitrogen-to-silicon ratio differing from the first nitrogen-to-silicon ratio.

22. A microelectronic device, comprising:

at least one region comprising a stack structure, the stack structure comprising a vertically repeating sequence of insulative structures, conductive structures, and other structures, the vertically repeating sequence being defined by a repeating tier group comprising:

one of the insulative structures;

one of the conductive structures directly above the one of the insulative structures;

an additional one of the insulative structures directly above the one of the conductive structures, the additional one of the insulative structures being physically distinct from the one of the insulative structures; and one of the other structures directly above the additional one of the insulative structures, the other structures differing in composition from the insulative structures and from the conductive structures.

23. The microelectronic device of claim 22, wherein:

the insulative structures comprise silicon oxide;

the conductive structures comprise one or more of at least one metal, and a conductively-doped semiconductor material; and the other structures comprise one or more of a silicon nitride and a doped silicon oxide.

24. An electronic system, comprising:

a microelectronic device comprising:

a stack structure comprising conductive structures, insulative structures, and non-conductive structures arranged such that the conductive structures are vertically interleaved with multi-structure tier groups, at least some of the multi-structure tier groups comprising one of the non-conductive structures vertically between a pair of the insulative structures, the conductive structures individually disposed directly vertically between a pair of the insulative structures, the insulative structures of the stack structure being individually physically distinct from one another;

at least one staircased stadium providing steps at different elevations in the stack structure; and conductive contact structures extending to the steps of the at least one staircased stadium;

at least one processor in operable communication with the microelectronic device; and at least one peripheral device in operable communication with the at least one processor.

* * * * *